US011728333B2

(12) United States Patent
Umeki

(10) Patent No.: US 11,728,333 B2
(45) Date of Patent: Aug. 15, 2023

(54) SEMICONDUCTOR DEVICE

(71) Applicant: ROHM CO., LTD., Kyoto (JP)

(72) Inventor: Shinya Umeki, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 118 days.

(21) Appl. No.: 17/056,945

(22) PCT Filed: May 29, 2019

(86) PCT No.: PCT/JP2019/021426
§ 371 (c)(1),
(2) Date: Nov. 19, 2020

(87) PCT Pub. No.: WO2019/230851
PCT Pub. Date: Dec. 5, 2019

(65) Prior Publication Data
US 2021/0210485 A1    Jul. 8, 2021

(30) Foreign Application Priority Data
May 30, 2018 (JP) .................................. 2018-103900

(51) Int. Cl.
*H01L 27/06*   (2006.01)
*H01L 29/06*   (2006.01)
(Continued)

(52) U.S. Cl.
CPC ...... *H01L 27/0664* (2013.01); *H01L 29/0696* (2013.01); *H01L 29/1095* (2013.01); *H01L 29/7397* (2013.01); *H01L 29/8613* (2013.01)

(58) Field of Classification Search
CPC ............. H01L 27/0664; H01L 29/0696; H01L 29/1095; H01L 29/7397; H01L 29/8613;
(Continued)

(56) References Cited

U.S. PATENT DOCUMENTS 9,799,648 B2 * 10/2017 Narazaki ........... H01L 29/41741
2009/0001411 A1 * 1/2009 Tokura ................ H01L 27/0664
257/140
(Continued)

FOREIGN PATENT DOCUMENTS

JP    2010118642    5/2010
JP    2016174029    9/2016

OTHER PUBLICATIONS

International Search Report and Written Opinion issued for International Patent Application No. PCT/JP2019/021426, dated Aug. 13, 2019, 8 pages including English translation of Search Report.
(Continued)

*Primary Examiner* — Shouxiang Hu
(74) *Attorney, Agent, or Firm* — Xsensus LLP

(57) ABSTRACT

A semiconductor device includes a first-conductivity-type semiconductor layer that includes a first main surface on one side and a second main surface on the other side, an IGBT region that includes an FET structure and a second-conductivity-type collector region formed in a surface layer portion of the second main surface, the FET structure including a second-conductivity-type body region formed in a surface layer portion of the first main surface, a first-conductivity-type emitter region formed in a surface layer portion of the body region, and a gate electrode that faces both the body region and the emitter region across a gate insulating layer, a diode region that includes a second-conductivity-type first impurity region formed in the surface layer portion of the first main surface and a first-conductivity-type second impurity region formed in the surface layer portion of the second main surface, a boundary region that includes a second-conductivity-type well region formed in the surface layer portion of the first main surface in a region between the IGBT region and the diode region, and a first main surface
(Continued)

electrode that is electrically connected to the emitter region, to the first impurity region, and to the well region on the first main surface.

19 Claims, 51 Drawing Sheets

(51) Int. Cl.
*H01L 29/10* (2006.01)
*H01L 29/739* (2006.01)
*H01L 29/861* (2006.01)

(58) Field of Classification Search
CPC ... H01L 2224/0603; H01L 2224/48091; H01L 2224/48227; H01L 2924/19107; H01L 25/18; H01L 27/0727; H01L 29/0619; H01L 29/16; H01L 29/407; H01L 29/7396; H01L 29/861; H01L 29/8611
See application file for complete search history.

(56) References Cited

U.S. PATENT DOCUMENTS

| 2010/0078674 A1* | 4/2010 | Seok | H01L 29/08 257/E29.197 |
| 2010/0090248 A1* | 4/2010 | Kouno | H01L 29/7395 257/140 |
| 2017/0117396 A1* | 4/2017 | Matsuura | H01L 29/4238 |

OTHER PUBLICATIONS

International Preliminary Report on Patentability issued for International Patent Application No. PCT/JP2019/021426, dated Dec. 10, 2020, 14 pages including English translation.
Notice of Reasons for Refusal issued for Japanese Patent Application No. 2020-522570, dated Nov. 17, 2022, 6 pages including English machine translation.
First Office Action issued for Chinese Patent Application No. 201980036750.5, dated May 8, 2023, 10 pages including partial English machine translation.

* cited by examiner

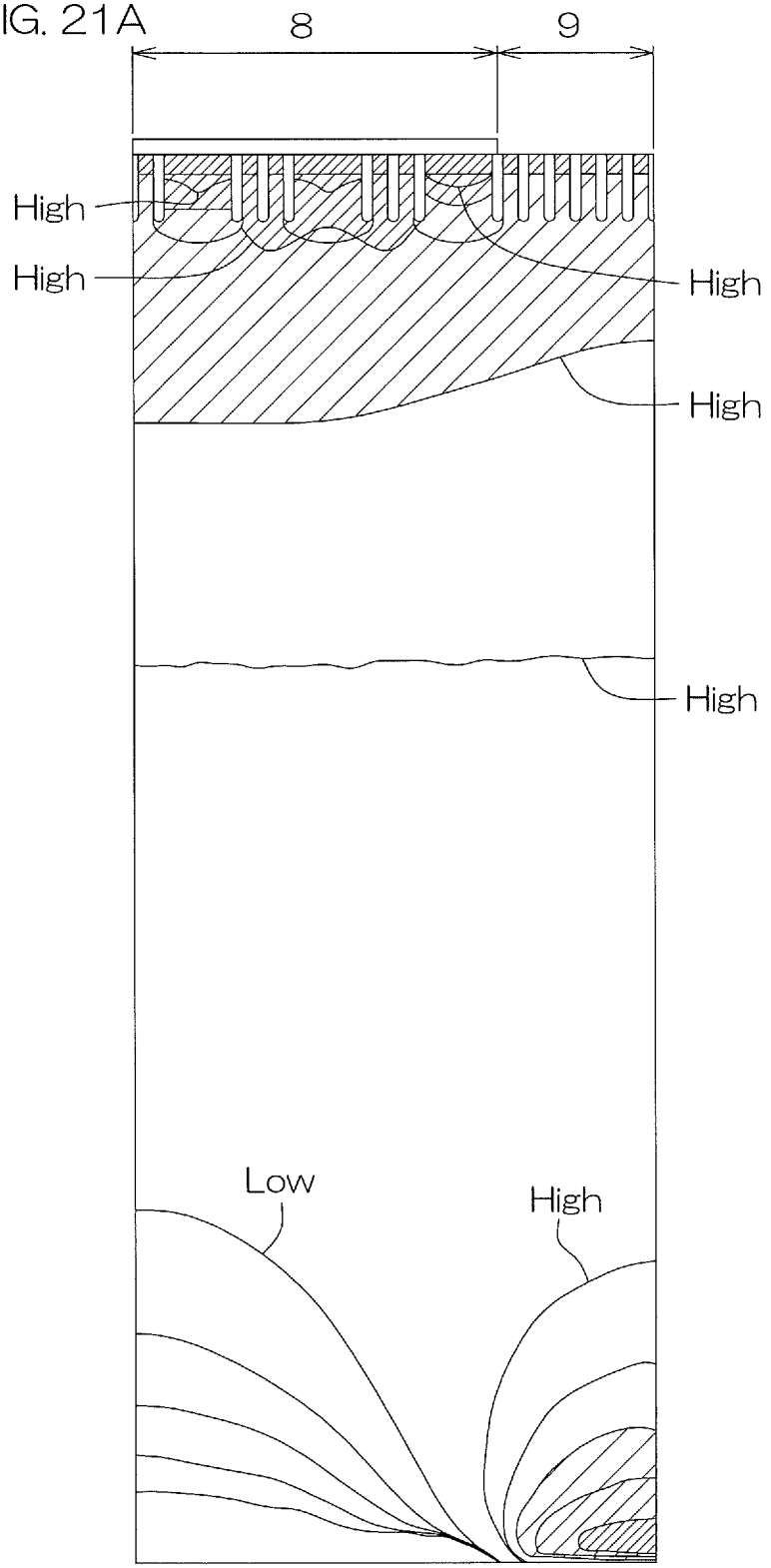

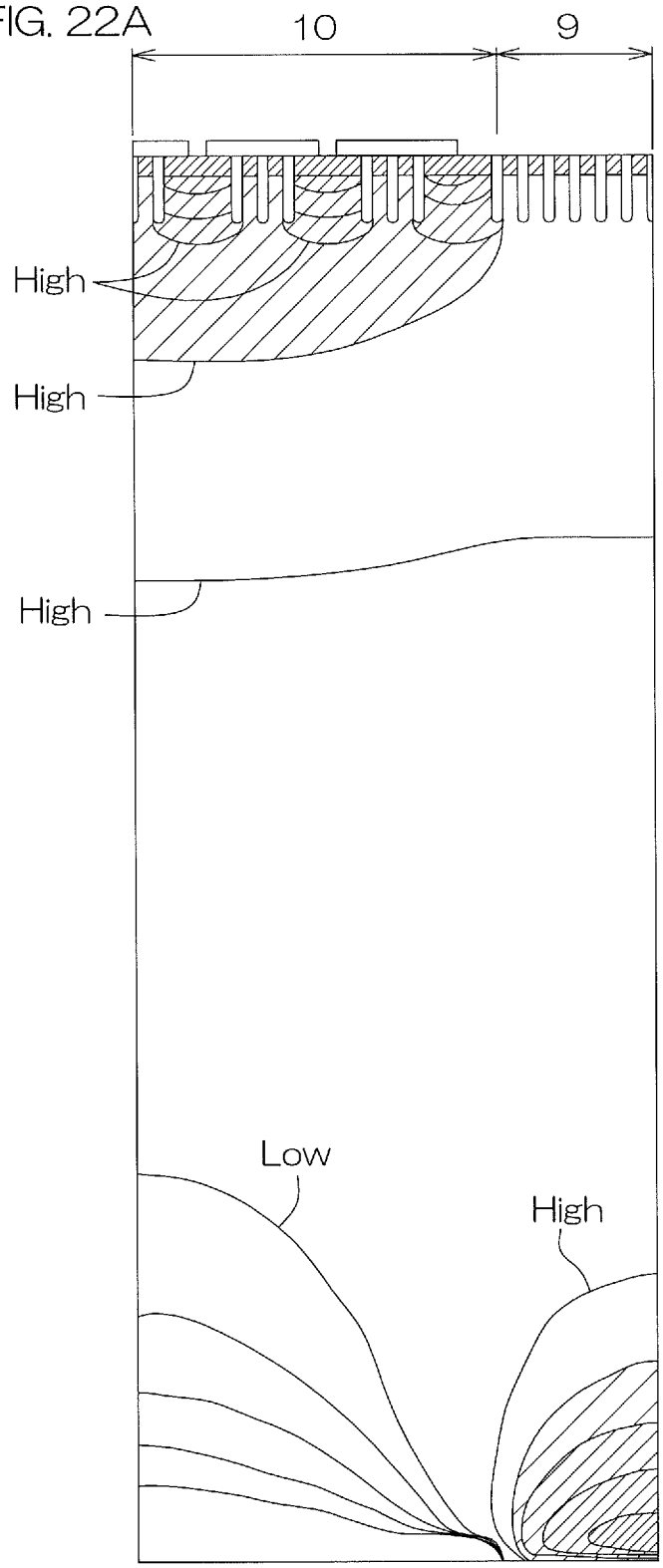

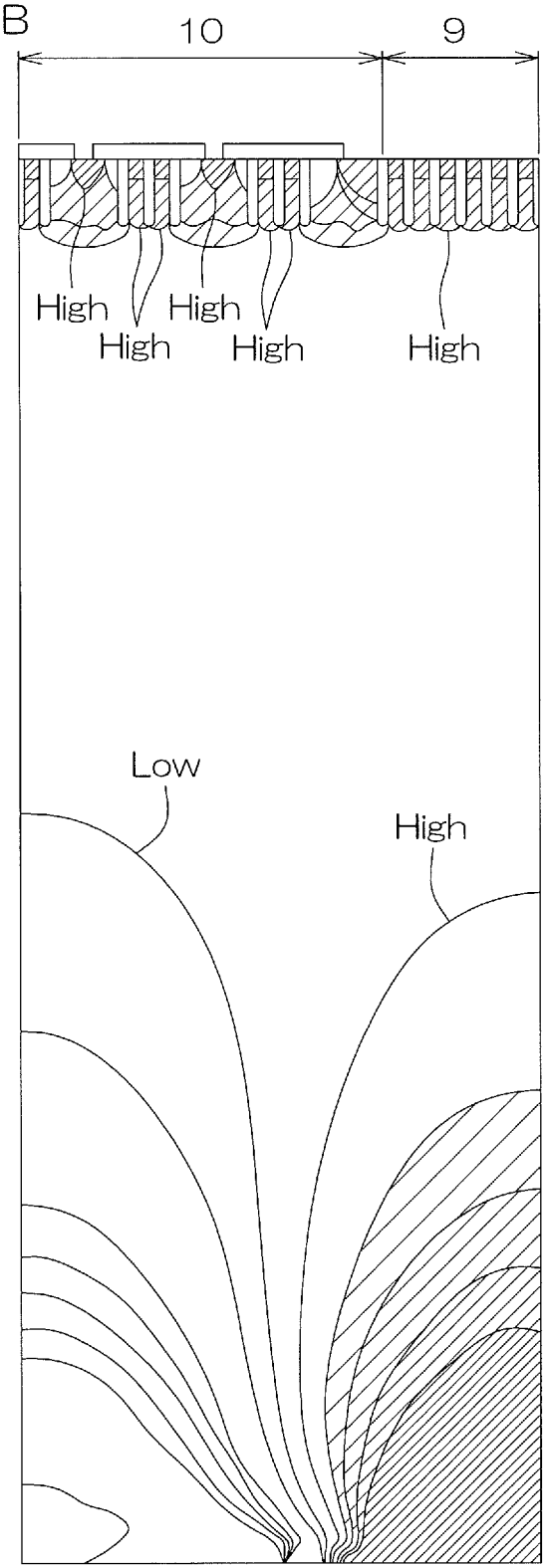

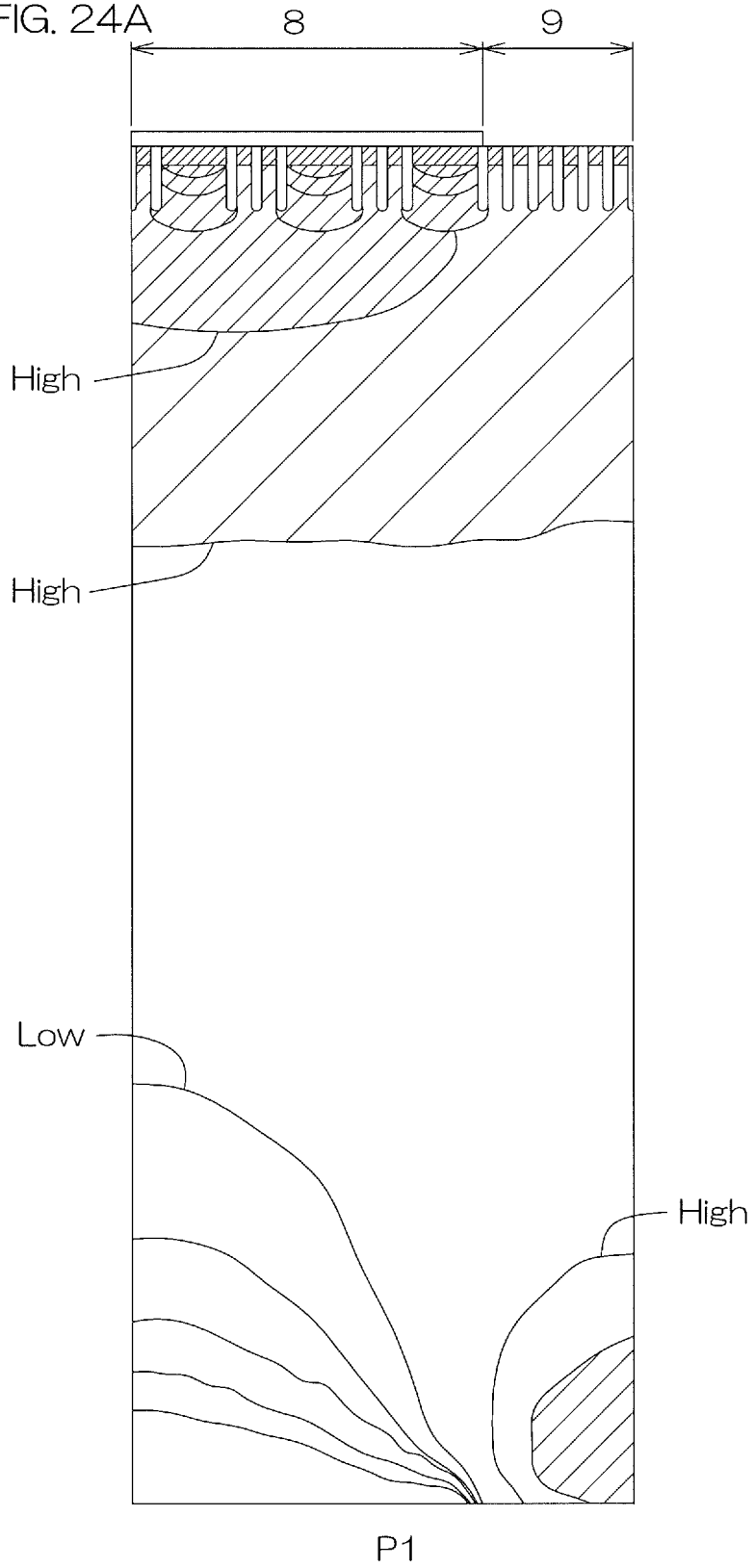

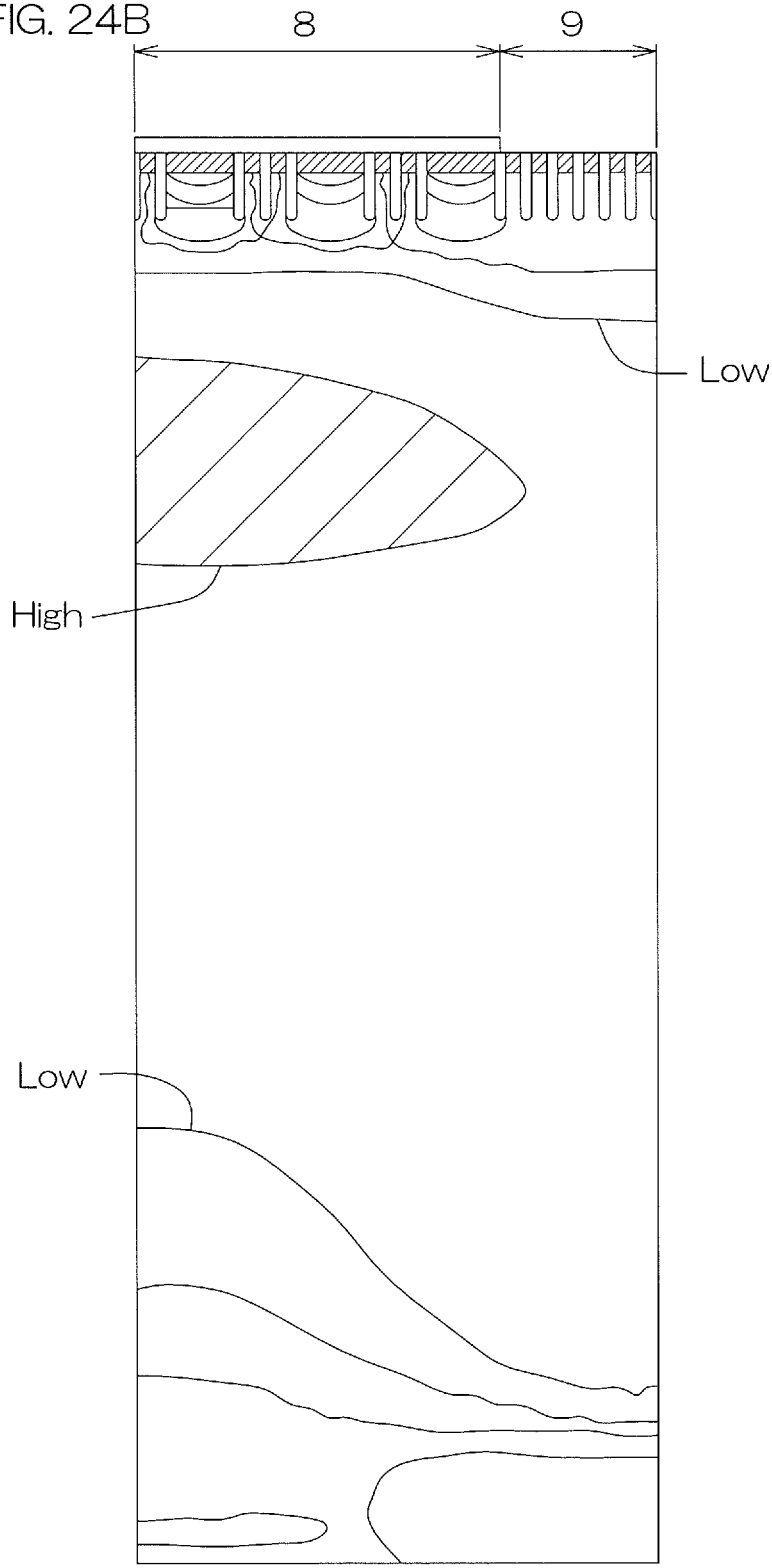

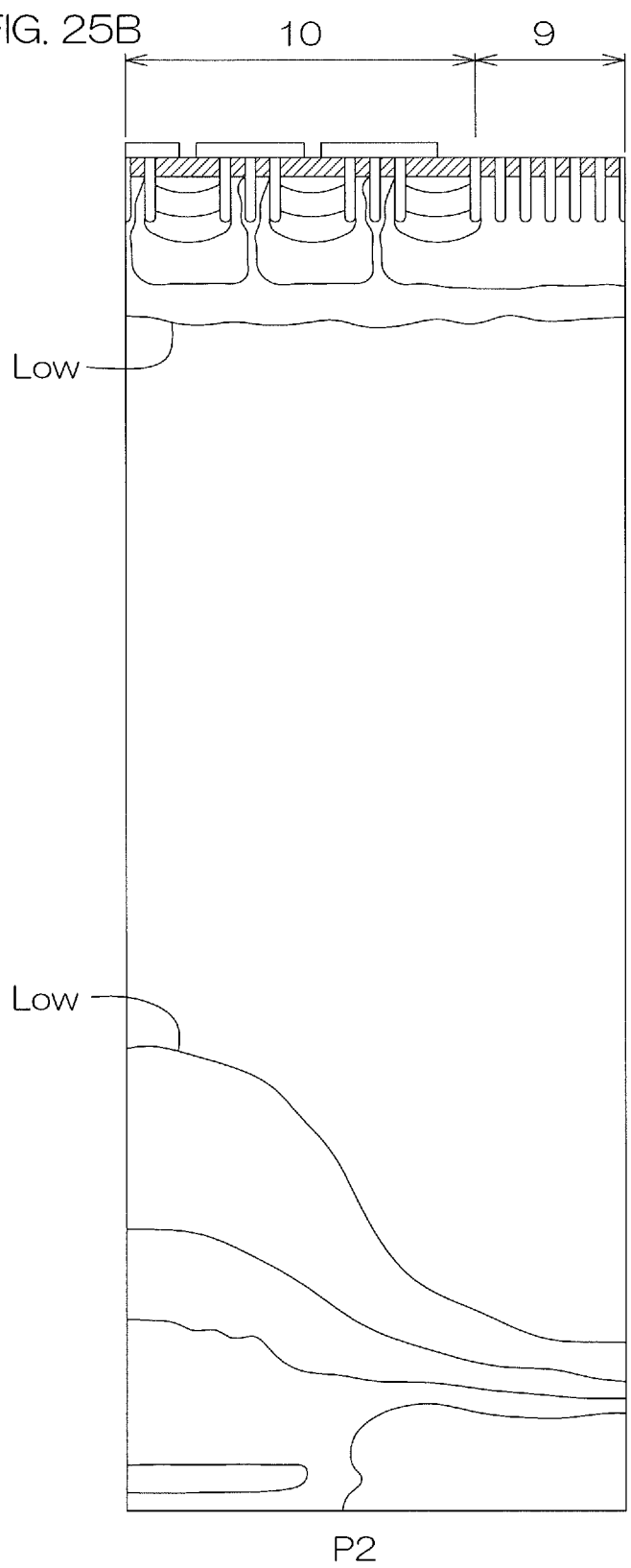

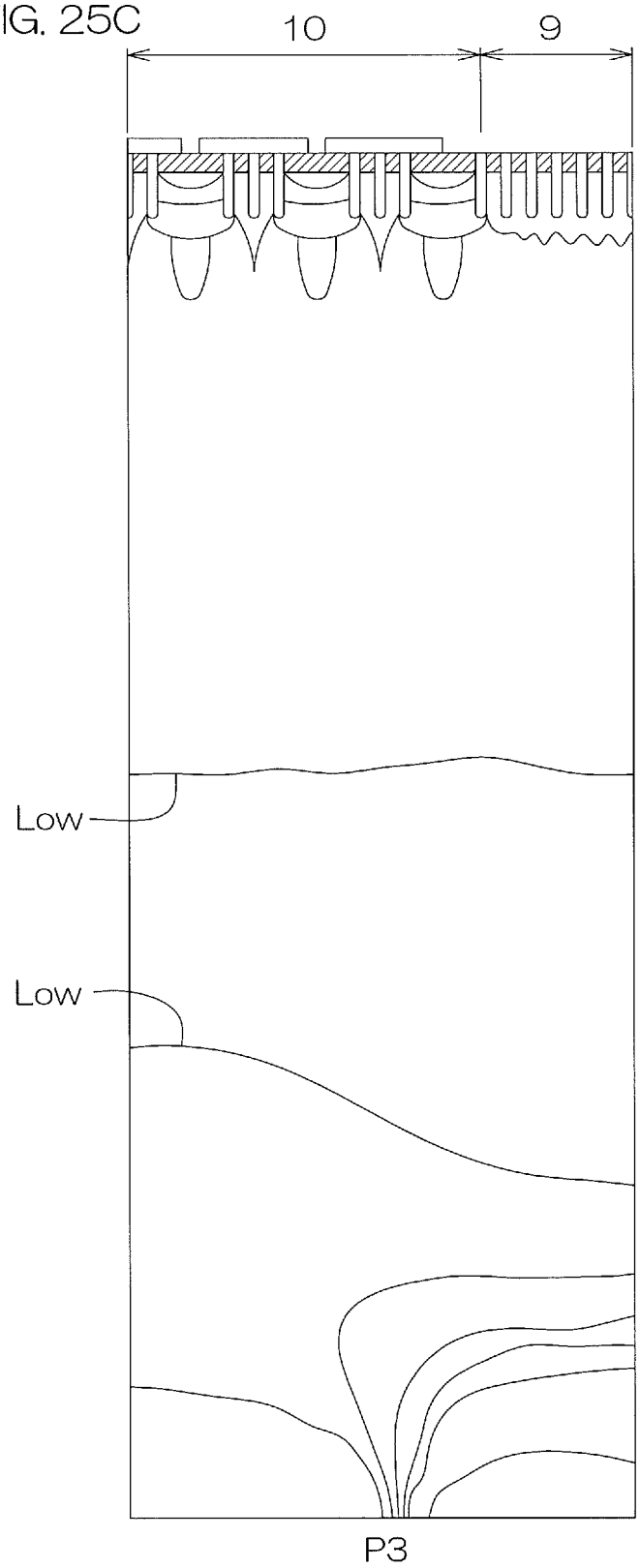

SEMICONDUCTOR DEVICE

TECHNICAL FIELD

The present invention relates to a semiconductor device.

BACKGROUND ART

Patent Literature 1 discloses an RC-IGBT (Reverse Conducting-Insulated Gate Bipolar Transistor) as an example of a semiconductor device. The RC-IGBT includes an IGBT and a diode that are formed in a shared semiconductor layer.

CITATION LIST

Patent Literature

Patent Literature 1: Japanese Patent Application Publication No. 2010-118642

SUMMARY OF INVENTION

Technical Problem

In a conventional semiconductor device, carriers stagnate in a boundary region between an IGBT region and a diode region of a semiconductor layer when a diode performs a reverse recovery operation. Therefore, a reverse recovery loss increases because of an increase in a reverse recovery current.

A preferred embodiment of the present invention provides a semiconductor device that is capable of reducing the reverse recovery loss.

Solution to Problem

One preferred embodiment of the present invention provides a semiconductor device that includes a first-conductivity-type semiconductor layer that includes a first main surface on one side and a second main surface on the other side, an IGBT region that includes an FET structure and a second-conductivity-type collector region formed in a surface layer portion of the second main surface, the FET structure including a second-conductivity-type body region formed in a surface layer portion of the first main surface, a first-conductivity-type emitter region formed in a surface layer portion of the body region, and a gate electrode that faces both the body region and the emitter region across a gate insulating layer, a diode region that includes a second-conductivity-type first impurity region formed in the surface layer portion of the first main surface and a first-conductivity-type second impurity region formed in the surface layer portion of the second main surface, a boundary region that includes a second-conductivity-type well region formed in the surface layer portion of the first main surface in a region between the IGBT region and the diode region, and a first main surface electrode that is electrically connected to the emitter region, to the first impurity region, and to the well region on the first main surface.

According to this semiconductor device, it is possible to swiftly discharge carriers existing in the boundary region when the diode performs a reverse recovery operation. This makes it possible to restrain the stagnation of carriers in the boundary region, and hence it is possible to restrain the reverse recovery current. As a result, it is possible to reduce the reverse recovery loss.

The aforementioned or still other objects, features, and effects of the present invention will be clarified by the following description of preferred embodiments given below with reference to the accompanying drawings.

BRIEF DESCRIPTION OF DRAWINGS

FIG. 21A is a view in which the hole density of a semiconductor device according to a reference example has been examined by simulation.

FIG. 22A is a view in which the hole density of the semiconductor device shown in FIG. 1 has been examined by simulation.

FIG. 22B is a view in which the hole current density of the semiconductor device shown in FIG. 1 has been examined by simulation.

FIG. 24A is a view in which the hole current density of a semiconductor device according to a reference example has been examined by simulation.

FIG. 24B is a view in which the hole current density of a semiconductor device according to a reference example has been examined by simulation.

FIG. 25B is a view in which the hole current density of the semiconductor device shown in FIG. 1 has been examined by simulation.

FIG. 25C is a view in which the hole current density of the semiconductor device shown in FIG. 1 has been examined by simulation.

DESCRIPTION OF EMBODIMENTS

Figure 1:
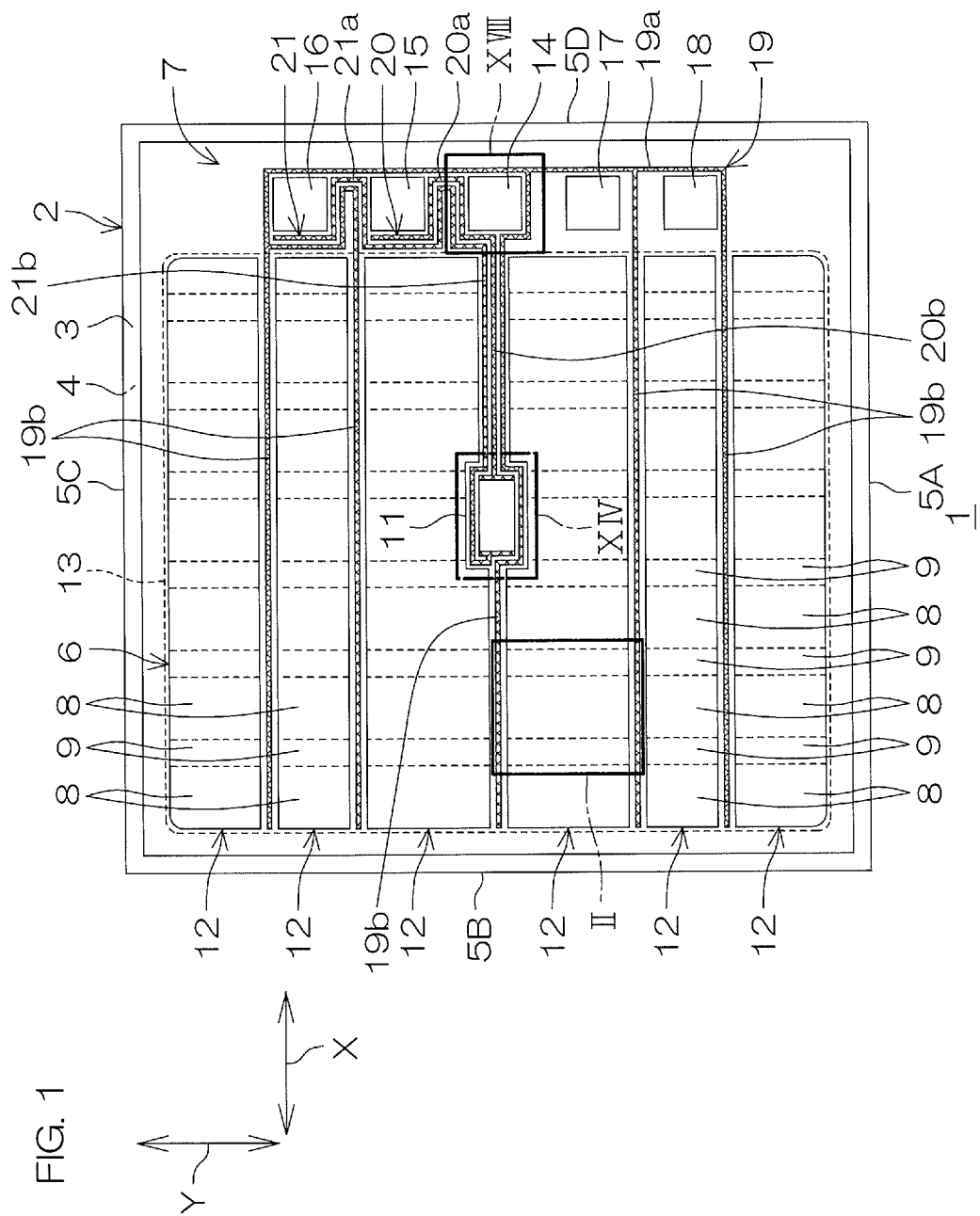
FIG. 1 is a top view showing a semiconductor device according to a first preferred embodiment of the present invention.
Figure 2:
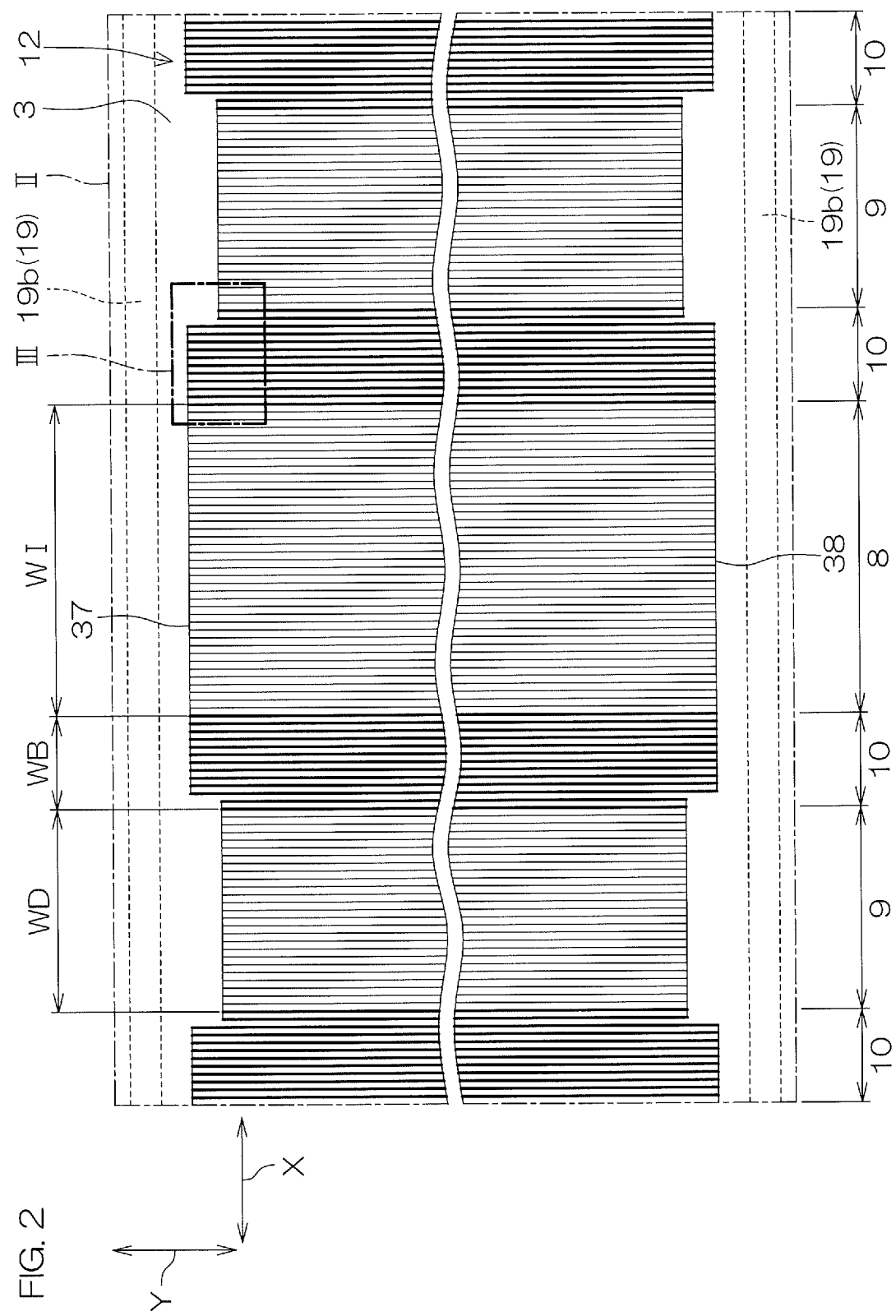
FIG. 2 is an enlarged view of region II shown in FIG. 1.
Figure 3:
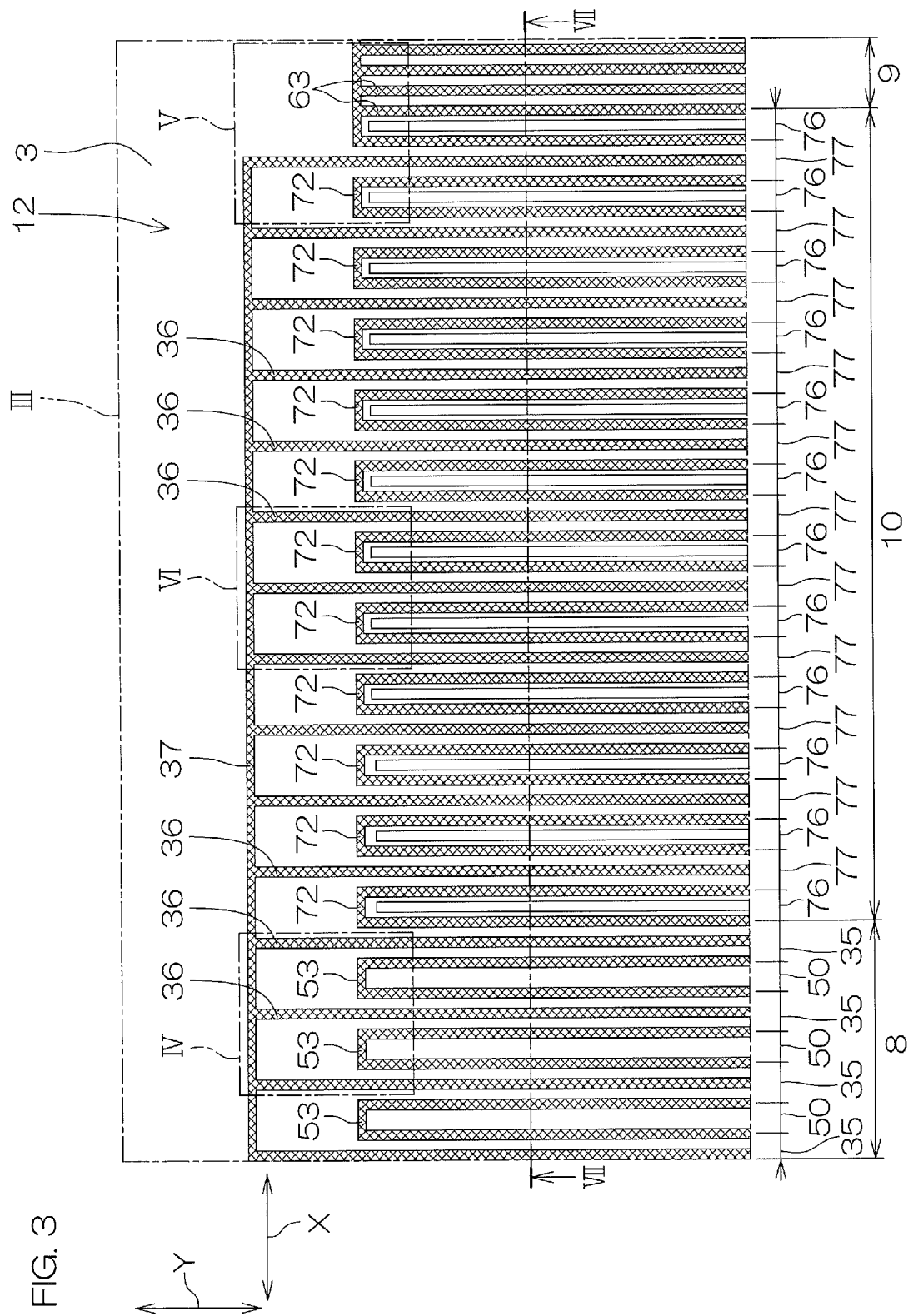
FIG. 3 is an enlarged view of region III shown in FIG. 2.
Figure 4:
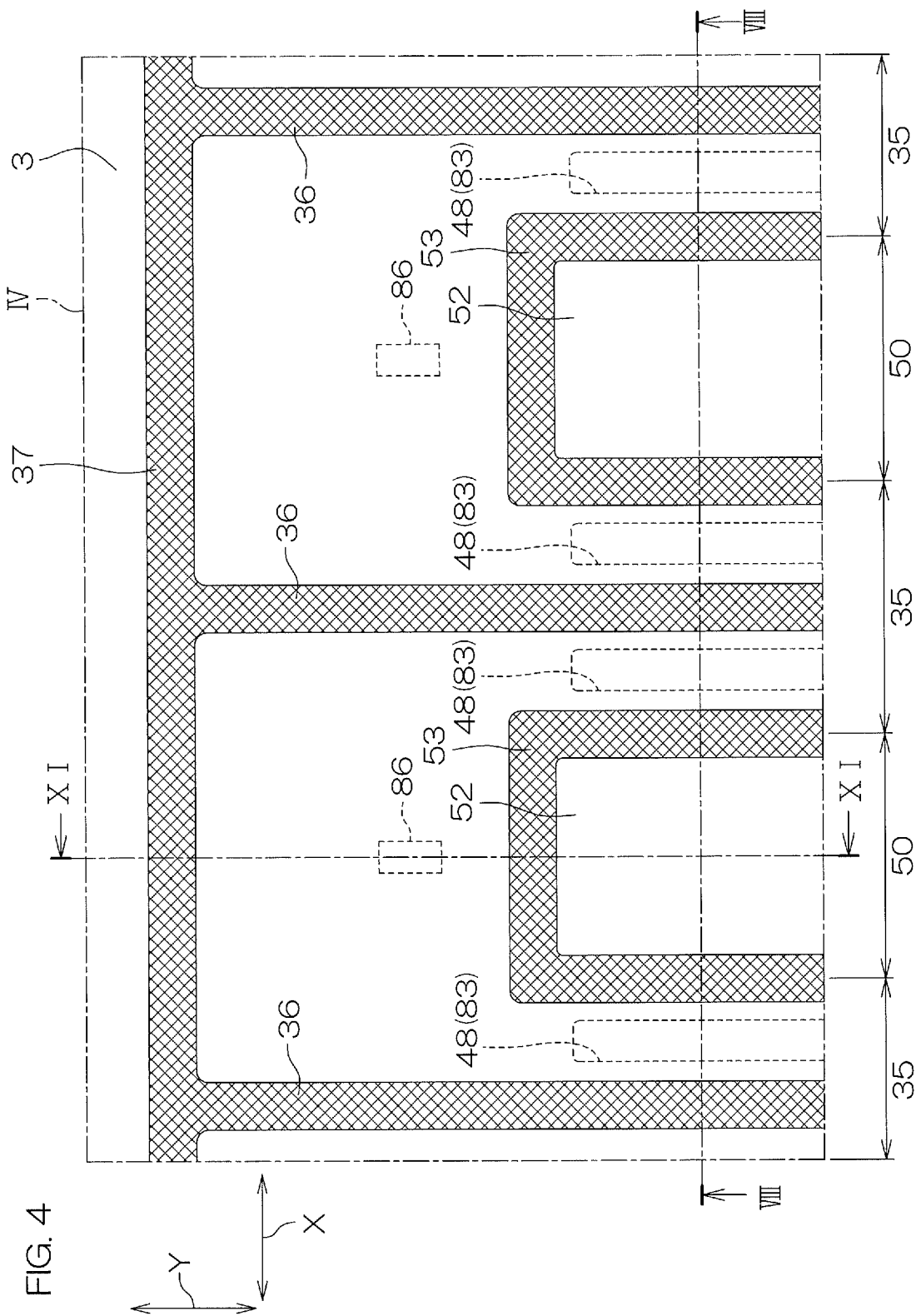
FIG. 4 is an enlarged view of region IV shown in FIG. 3.
Figure 5:
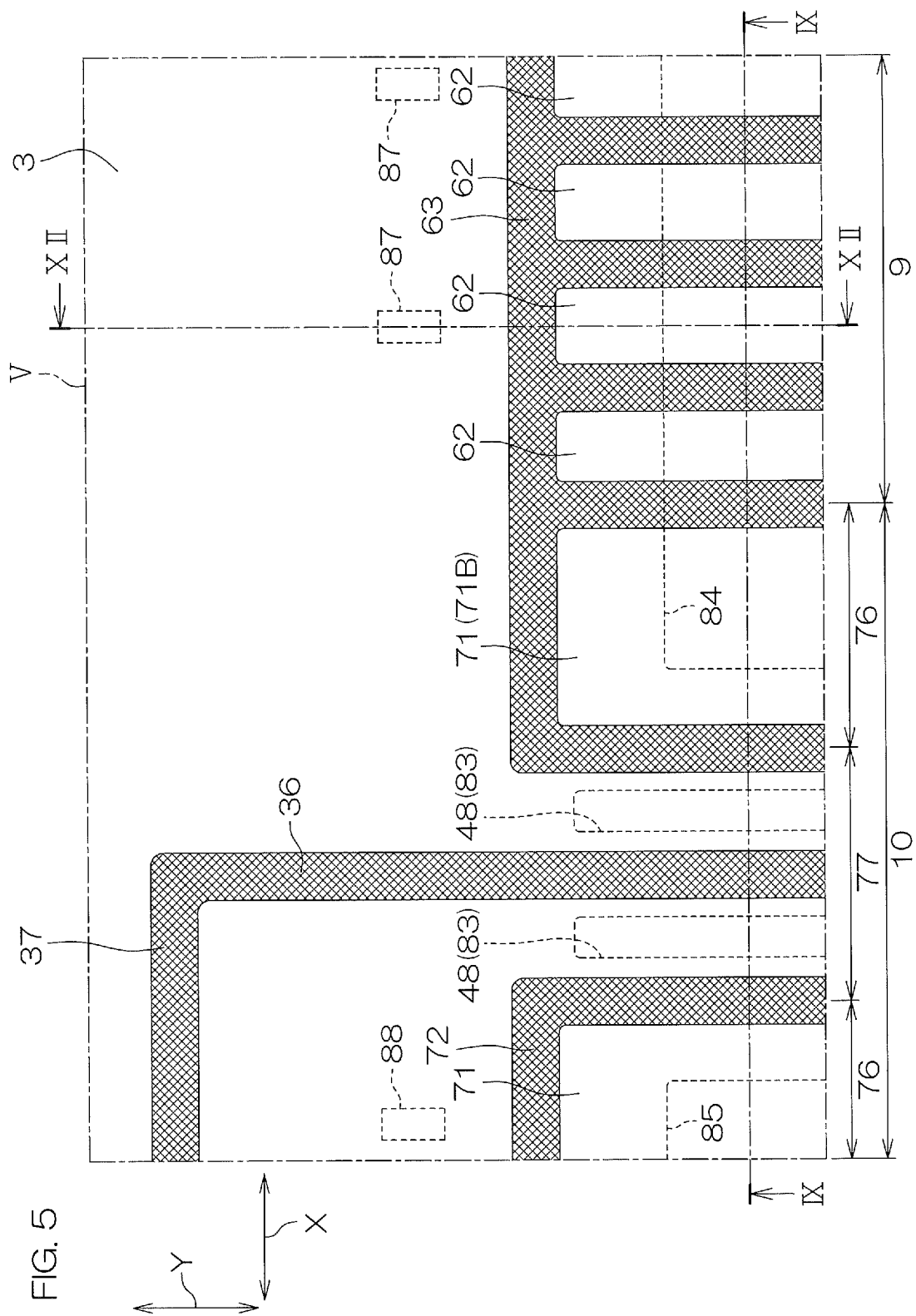
FIG. 5 is an enlarged view of region V shown in FIG. 3.
Figure 6:
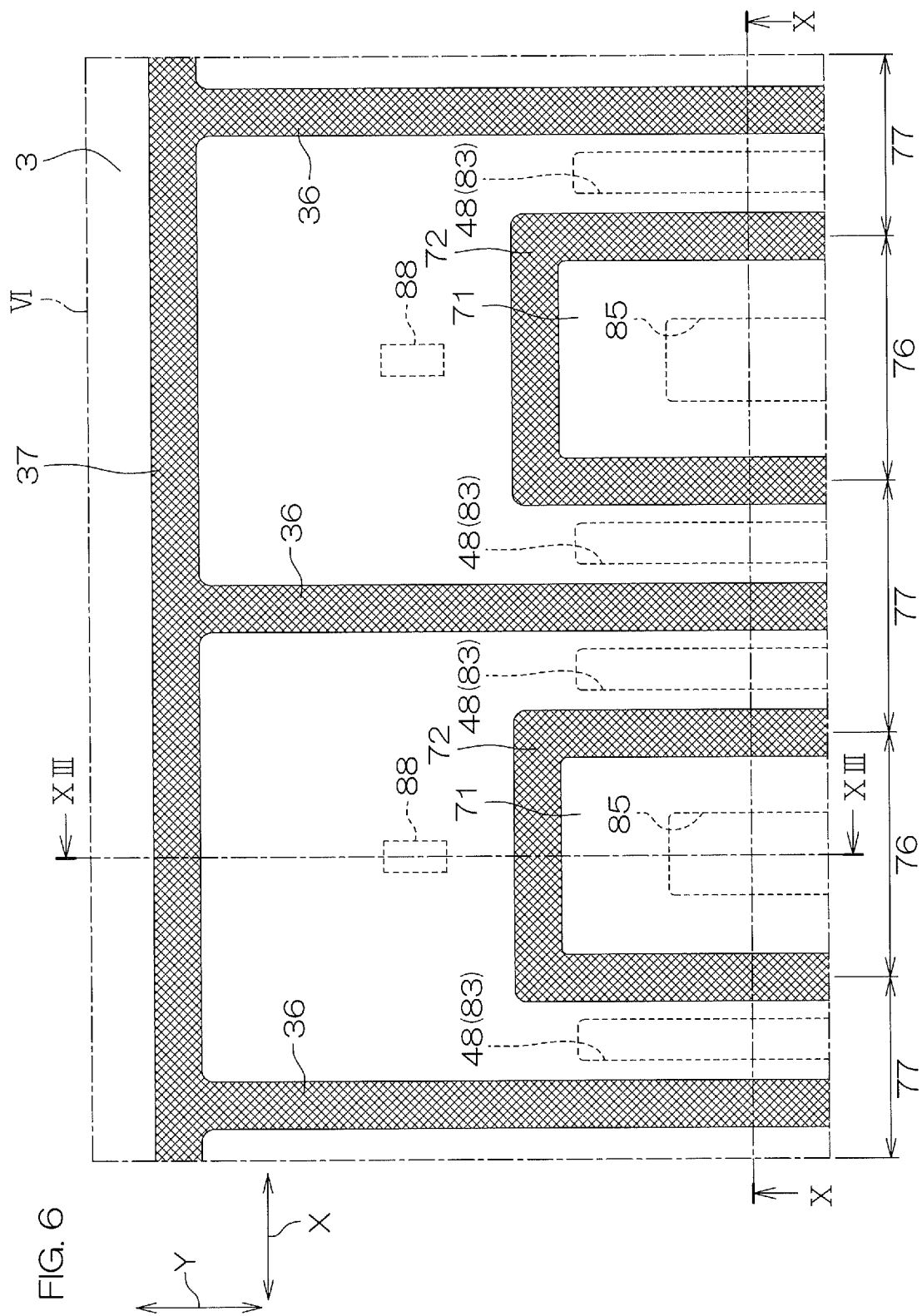
FIG. 6 is an enlarged view of region VI shown in FIG. 3.

FIG. 1 is a top view showing a semiconductor device 1 according to a first preferred embodiment of the present invention. FIG. 2 is an enlarged view of region II shown in FIG. 1. FIG. 3 is an enlarged view of region III shown in FIG. 2. FIG. 4 is an enlarged view of region IV shown in FIG. 3. FIG. 5 is an enlarged view of region V shown in FIG. 3. FIG. 6 is an enlarged view of region VI shown in FIG. 3.

The semiconductor device 1 is an electronic component that has an RC-IGBT (Reverse Conducting-Insulated Gate Bipolar Transistor) that integrally includes an IGBT and a diode.

Referring to FIG. 1 to FIG. 6, the semiconductor device 1 includes a chip-shaped semiconductor layer 2. The semiconductor layer 2 has a first main surface 3 on one side of the semiconductor layer 2, a second main surface 4 on the other side of the semiconductor layer 2, and side surfaces 5A, 5B, 5C, and 5D by each of which the first main surface 3 and the second main surface 4 are connected together.

The first main surface 3 and the second main surface 4 are each formed in a quadrangular shape in plan view seen from a normal direction Z of these main surfaces (hereinafter, referred to simply as "in plan view"). The side surface 5A and the side surface 5C extend along a first direction X, and face a second direction Y that intersects the first direction X. The side surface 5B and the side surface 5D extend along a second direction Y, and face the first direction X. More specifically, the second direction Y perpendicularly intersects the first direction X.

The semiconductor device 1 includes an active region 6 and an outer region 7 that are formed in the semiconductor layer 2. The active region 6 and the outer region 7 are formed in the first main surface 3. The active region 6 is a region including the RC-IGBT.

The active region 6 is formed in a central portion of the semiconductor layer 2 in a region inward from the side surfaces 5A to 5D of the semiconductor layer 2 with intervals between the active region 6 and each of the side surfaces 5A to 5D in plan view. The active region 6 may be formed in a quadrangular shape that has four sides parallel to the side surfaces 5A to 5D, respectively, in plan view.

The outer region 7 is a region outside the active region 6. The outer region 7 extends in a belt shape along a circumferential edge of the active region 6 in plan view. More specifically, the outer region 7 is formed in an endless shape (quadrangular ring shape) that surrounds the active region 6 in plan view.

The active region 6 includes an IGBT region 8, a diode region 9, a boundary region 10, and a sensor region 11. The IGBT region 8 is a region including the IGBT. The diode region 9 is a region including the diode. The boundary region 10 is a region between the IGBT region 8 and the diode region 9. The sensor region 11 is a region including a temperature-sensitive device.

A plurality of the IGBT regions 8 are formed with intervals between the IGBT regions 8 in the first direction X and in the second direction Y. In this embodiment, the plurality of IGBT regions 8 are arranged in a matrix manner in plan view. A plurality of the diode regions 9 are formed with intervals between the diode regions 9 in the first direction X and in the second direction Y. In this embodiment, the plurality of diode regions 9 are arranged in a matrix manner in plan view. More specifically, the plurality of diode regions 9 are formed in regions, respectively, between two IGBT regions 8 adjoining in the first direction X.

The boundary region 10 is interposed in a region between the IGBT region 8 and the diode region 9. A plurality of the boundary regions 10 are formed with intervals between the boundary regions 10 in the first direction X and in the second direction Y. In this embodiment, the plurality of boundary regions 10 are arranged in a matrix manner in plan view.

The active region 6 includes an RC-IGBT array 12 (device region). The RC-IGBT array 12 includes the IGBT region 8, the diode region 9, and the boundary region 10 arranged along the first direction X. More specifically, the RC-IGBT array 12 has a loop sequence that repeatedly includes the IGBT region 8, the boundary region 10, the diode region 9, the boundary region 10, the IGBT region 8, the boundary region 10, the diode region 9, . . . that are arranged in a line along the first direction X.

The active region 6 includes a plurality (in this embodiment, six) of the RC-IGBT arrays 12 formed with intervals between the RC-IGBT arrays 12 in the second direction Y. The RC-IGBT array 12 has a starting point positioned on the lateral surface 5B side and an ending point positioned on the lateral surface 5D side.

The starting point of the RC-IGBT array 12 is formed by the IGBT region 8 in this embodiment. The starting point of the RC-IGBT array 12 is not limited to the IGBT region 8. The starting point of the RC-IGBT array 12 may be the diode region 9 or the boundary region 10. The ending point of the RC-IGBT array 12 is formed by the IGBT region 8 in this embodiment. The ending point of the RC-IGBT array 12 is not limited to the IGBT region 8. The ending point of the RC-IGBT array 12 may be the diode region 9 or the boundary region 10.

The width WI of the IGBT region 8 may be not less than 10 μm and not more than 1000 μm. The width WI is the width in the first direction X of the IGBT region 8. The width WI may be not less than 10 μm and not more than 100 μm, not less than 100 μm and not more than 200 μm, not less than 200 μm and not more than 300 μm, not less than 300 μm and not more than 400 μm, not less than 400 μm and not more than 500 μm, not less than 500 μm and not more than 600 μm, not less than 600 μm and not more than 700 μm, not less than 700 μm and not more than 800 μm, not less than 800 μm and not more than 900 μm, or not less than 900 μm and not more than 1000 μm.

The width WD of the diode region 9 may be not less than 10 μm and not more than 1000 μm. The width WD is the width in the first direction X of the diode region 9. The width WD may be not less than 10 μm and not more than 100 μm, not less than 100 μm and not more than 200 μm, not less than 200 μm and not more than 300 μm, not less than 300 μm and not more than 400 μm, not less than 400 μm and not more than 500 μm, not less than 500 μm and not more than 600 μm, not less than 600 μm and not more than 700 μm, not less than 700 μm and not more than 800 μm, not less than 800 μm and not more than 900 μm, or not less than 900 μm and not more than 1000 μm. Preferably, the width WD is 100 μm or more. More preferably, the width WD is 200 μm or more.

The width WB of the boundary region 10 may be not less than 1 μm and not more than 100 μm. The width WB is the width in the first direction X of the boundary region 10. The width WB may be not less than 1 μm and not more than 10 μm, not less than 10 μm and not more than 20 μm, not less than 20 μm and not more than 30 μm, not less than 30 μm and not more than 40 μm, not less than 40 μm and not more than 50 μm, not less than 50 μm and not more than 60 μm, not less than 60 μm and not more than 70 μm, not less than 70 μm and not more than 80 μm, not less than 80 μm and not more than 90 μm, or not less than 90 μm and not more than 100 μm.

The sensor region 11 is formed in a region between two RC-IGBT arrays 12 adjoining in the second direction Y. The sensor region 11 is formed in a central portion of the active region 6 in this embodiment. In other words, the temperature-sensitive device is formed in a region between two RC-IGBT arrays 12 adjoining in the central portion of the active region 6. The central portion of the active region 6 is liable to cause a rise in temperature. It is possible to appropriately detect the temperature of the active region 6 by placing the temperature-sensitive device at the central portion of the active region 6.

The semiconductor device 1 includes an emitter terminal electrode 13 (see a broken-line portion of FIG. 1) formed on the first main surface 3 in the active region 6. The emitter terminal electrode 13 transmits an emitter signal to the active region 6 (IGBT region 8). The emitter signal may be a reference voltage (for example, ground voltage).

A plurality (in this embodiment, five) of terminal electrodes 14, 15, 16, 17, and 18 are formed on the first main surface 3 in the outer region 7. The plurality of terminal electrodes 14 to 18 are disposed in regions, respectively, on the lateral surface 5D side in plan view. The plurality of terminal electrodes 14 to 18 are disposed with intervals between the terminal electrodes 14 to 18 along the side surface 5D. The plurality of terminal electrodes 14 to 18 are each formed in a quadrangular shape in plan view.

The plurality of terminal electrodes 14 to 18 include a gate terminal electrode 14, a first sense terminal electrode 15, a second sense terminal electrode 16, a current detection terminal electrode 17, and an open terminal electrode 18. The gate terminal electrode 14 transmits a gate signal to the active region 6 (IGBT region 8). The first sense terminal electrode 15 and the second sense terminal electrode 16 each transmit an electric signal to the sensor region 11 (temperature-sensitive device). The current detection terminal electrode 17 is an electrode that detects and takes out an electric current of the active region 6. The open terminal electrode 18 is formed in an electrically floating state.

The gate terminal electrode 14, the first sense terminal electrode 15, the second sense terminal electrode 16, the current detection terminal electrode 17, and the open terminal electrode 18 are arbitrarily arranged. In this embodiment, the open terminal electrode 18, the current detection terminal electrode 17, the gate terminal electrode 14, the first sense terminal electrode 15, and the second sense terminal electrode 16 are arranged in this order from the lateral surface 5A side toward the lateral surface 5C side.

A gate wiring 19 is electrically connected to the gate terminal electrode 14. The gate wiring 19 is also called a gate finger. The gate wiring 19 extends from the outer region 7 toward the active region 6. The gate wiring 19 transmits a gate signal applied to the gate terminal electrode 14 to the active region 6 (IGBT region 8).

More specifically, the gate wiring 19 includes a first region 19a positioned in the outer region 7 and a second region 19b positioned in the active region 6. The first region 19a is electrically connected to the gate terminal electrode 14. In this embodiment, the first region 19a is selectively drawn around to a region located on the lateral surface 5D side of the outer region 7.

A plurality (in this embodiment, five) of the second regions 19b are formed in the active region 6. The plurality of second regions 19b extend in a belt shape along the first direction X, and are formed with intervals between the second regions 19b in the second direction Y. The plurality of second regions 19b are formed in regions, respectively, between two mutually adjoining RC-IGBT arrays 12.

The plurality of second regions 19b extend from a region located on the lateral surface 5D side of the outer region 7 toward a region located on the lateral surface 5B side. The plurality of second regions 19b may cross a boundary between the active region 6 and the outer region 7. The plurality of second regions 19b are continuous with the first region 19a in the outer region 7.

A gate signal applied to the gate terminal electrode 14 is transmitted to the second region 19b through the first region 19a. Hence, the gate signal is transmitted to the active region 6 (IGBT region 8) through the second region 19b.

A first sense wiring 20 is electrically connected to the first sense terminal electrode 15. The first sense wiring 20 extends from the outer region 7 toward the sensor region 11. The first sense wiring 20 transmits an electric signal applied to the first sense terminal electrode 15 to the sensor region 11.

More specifically, the first sense wiring 20 includes a first region 20a positioned in the outer region 7 and a second region 20b positioned in the active region 6. The first region 20a is electrically connected to the first sense terminal electrode 15. In this embodiment, the first region 20a is selectively drawn around to a region located on the lateral surface 5D side of the outer region 7.

The second region 20b is formed in a region between two adjoining RC-IGBT arrays 12 in which the sensor region 11 is formed. The second region 20b extends in a belt shape from the outer region 7 toward the sensor region 11 along the first direction X. The second region 20b is electrically connected to the temperature-sensitive device in the sensor region 11. The second region 20b is continuous with the first region 20a in the outer region 7.

An electric signal applied to the first sense terminal electrode 15 is transmitted to the second region 21b through the first region 20a. Hence, the electric signal is transmitted to the sensor region 11 through the second region 21b.

A second sense wiring 21 is electrically connected to the second sense terminal electrode 16. The second sense wiring 21 extends from the outer region 7 toward the sensor region 11. The second sense wiring 21 transmits an electric signal applied to the second sense terminal electrode 16 to the sensor region 11.

More specifically, the second sense wiring 21 includes a first region 21a positioned in the outer region 7 and a second region 21b positioned in the active region 6. The first region 21a is electrically connected to the second sense terminal electrode 16. In this embodiment, the first region 21a is selectively drawn around to a region located on the lateral surface 5D side of the outer region 7.

The second region 21b is formed in a region between two adjoining RC-IGBT arrays 12 in which the sensor region 11 is formed. The second region 21b extends in a belt shape from the outer region 7 toward the sensor region 11 along the first direction X. The second region 21b is electrically connected to the temperature-sensitive device in the sensor region 11. The second region 21b is continuous with the first region 21a in the outer region 7.

An electric signal applied to the second sense terminal electrode 16 is transmitted to the second region 21b through the first region 21a. Hence, the electric signal is transmitted to the sensor region 11 through the second region 21b.

The gate wiring 19, the first sense wiring 20, and the second sense wiring 21 are formed in a region between two adjoining RC-IGBT arrays 12 in which the sensor region 11 is arranged. The gate wiring 19, the first sense wiring 20, and the second sense wiring 21 extend in parallel with each other in the region between the two adjoining RC-IGBT arrays 12.

The thus-formed structure makes it possible to reduce a wiring-forming area in the active region 6 including the sensor region 11. In other words, it is possible to expand the active region 6 by reducing the wiring-forming area.

Figure 7:
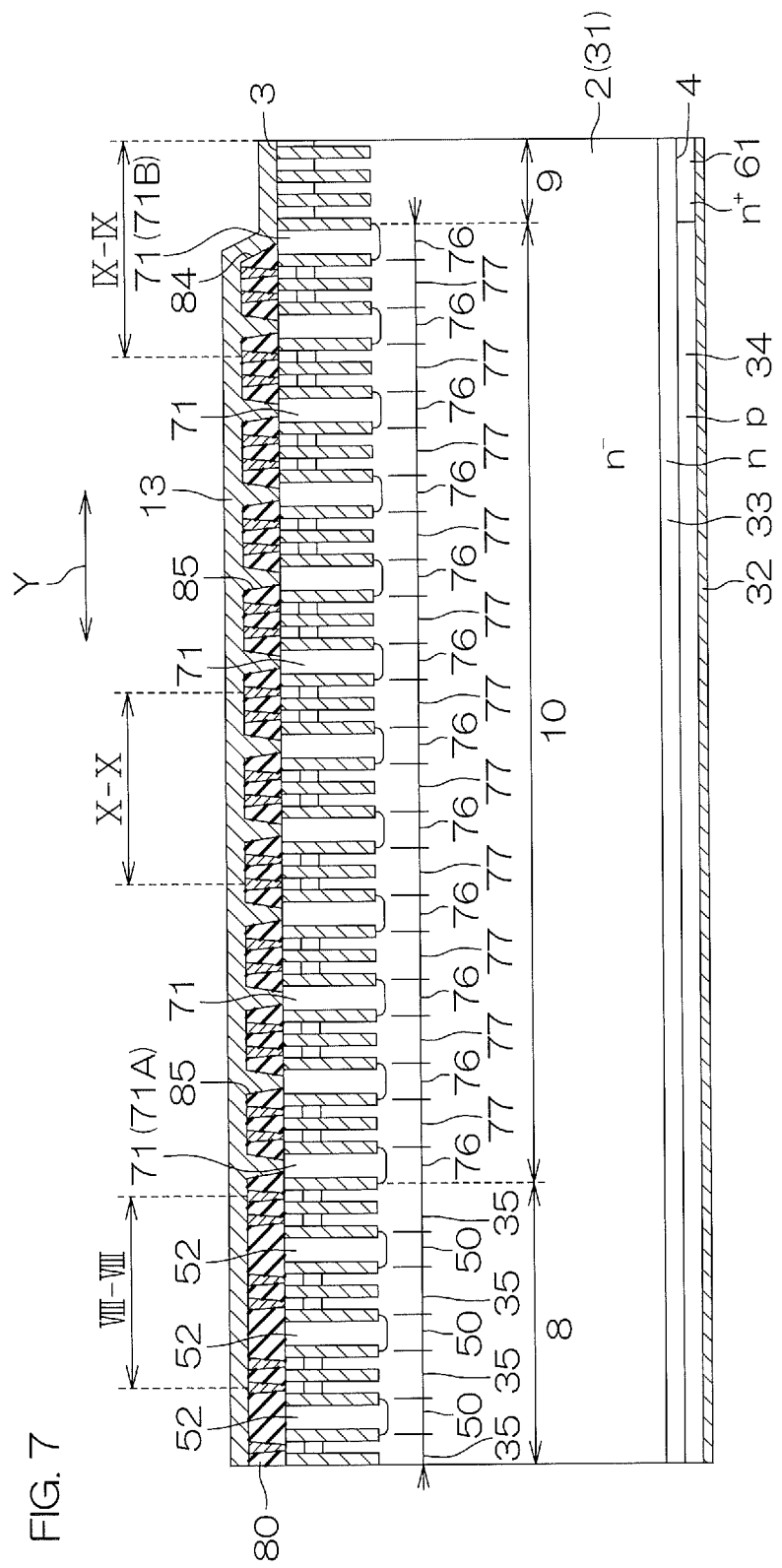
FIG. 7 is a cross-sectional view along line VII-VII shown in FIG. 3.
Figure 8:
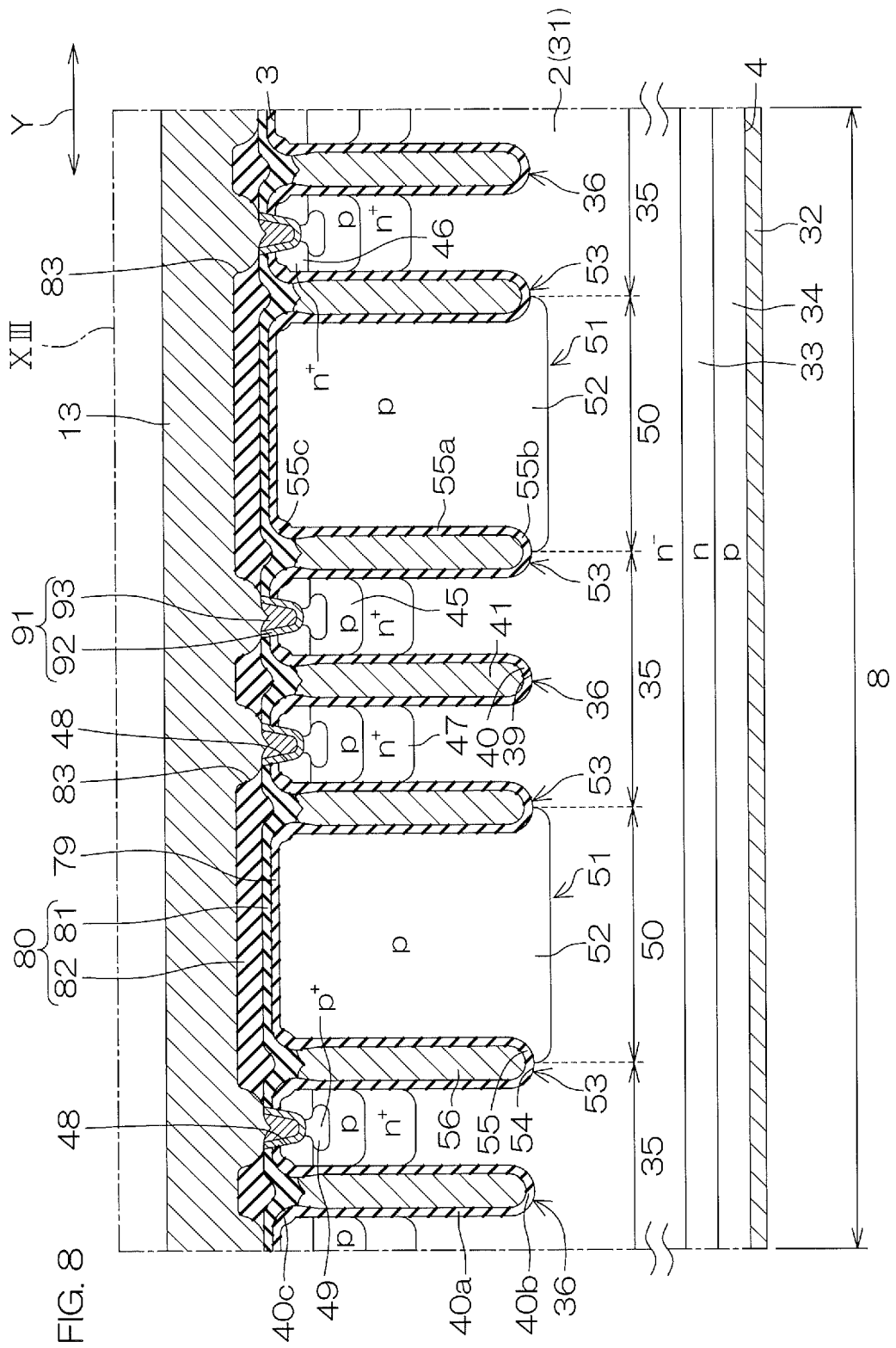
FIG. 8 is a cross-sectional view along line VIII-VIII shown in FIG. 4.
Figure 9:
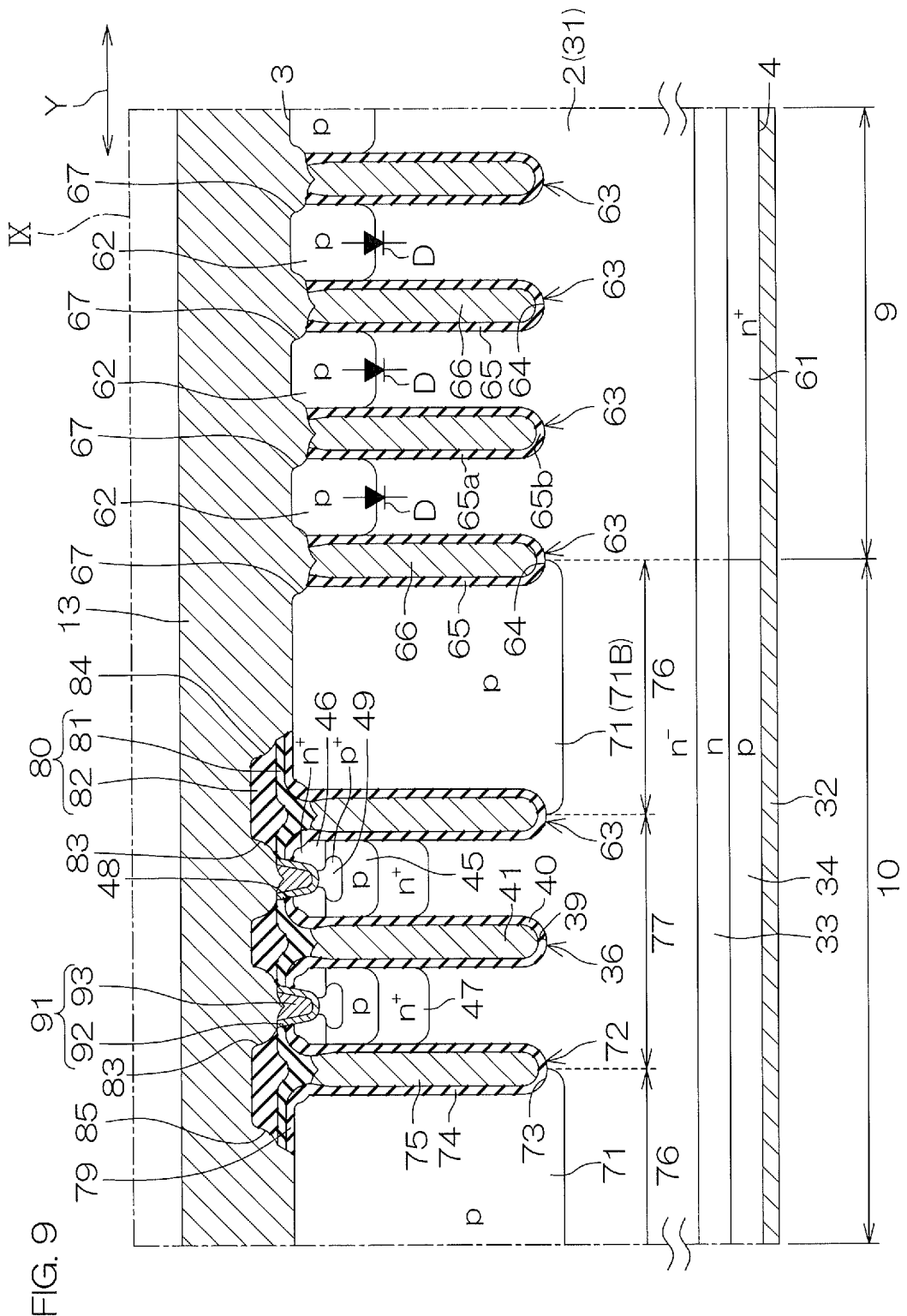
FIG. 9 is a cross-sectional view along line IX-IX shown in FIG. 5.
Figure 10:
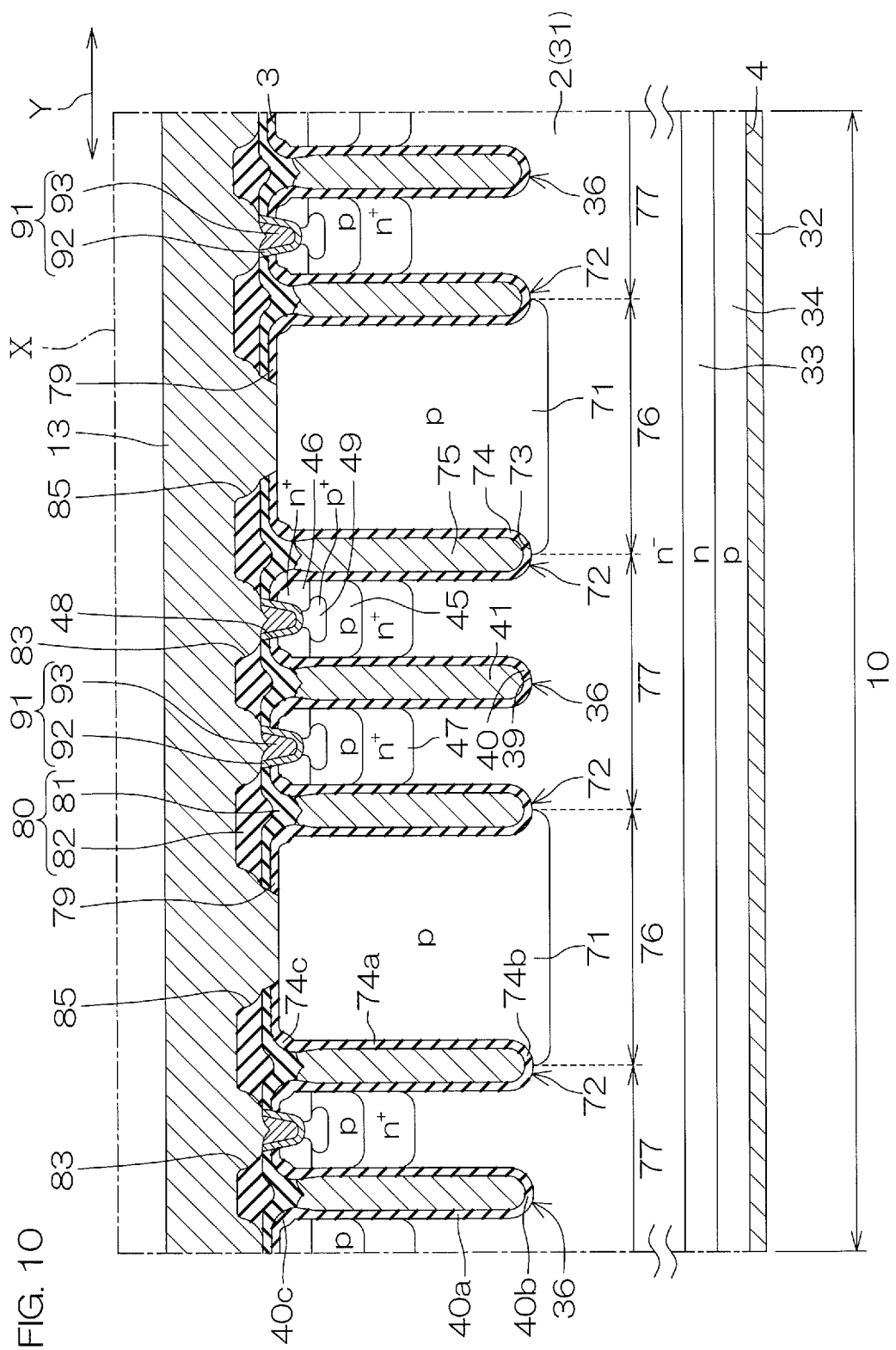
FIG. 10 is a cross-sectional view along line X-X shown in FIG. 6.

FIG. 7 is a cross-sectional view along line VII-VII shown in FIG. 3. FIG. 8 is a cross-sectional view along line VIII-VIII shown in FIG. 4. FIG. 9 is a cross-sectional view along line IX-IX shown in FIG. 5. FIG. 10 is a cross-sectional view along line X-X shown in FIG. 6.

Figure 11:
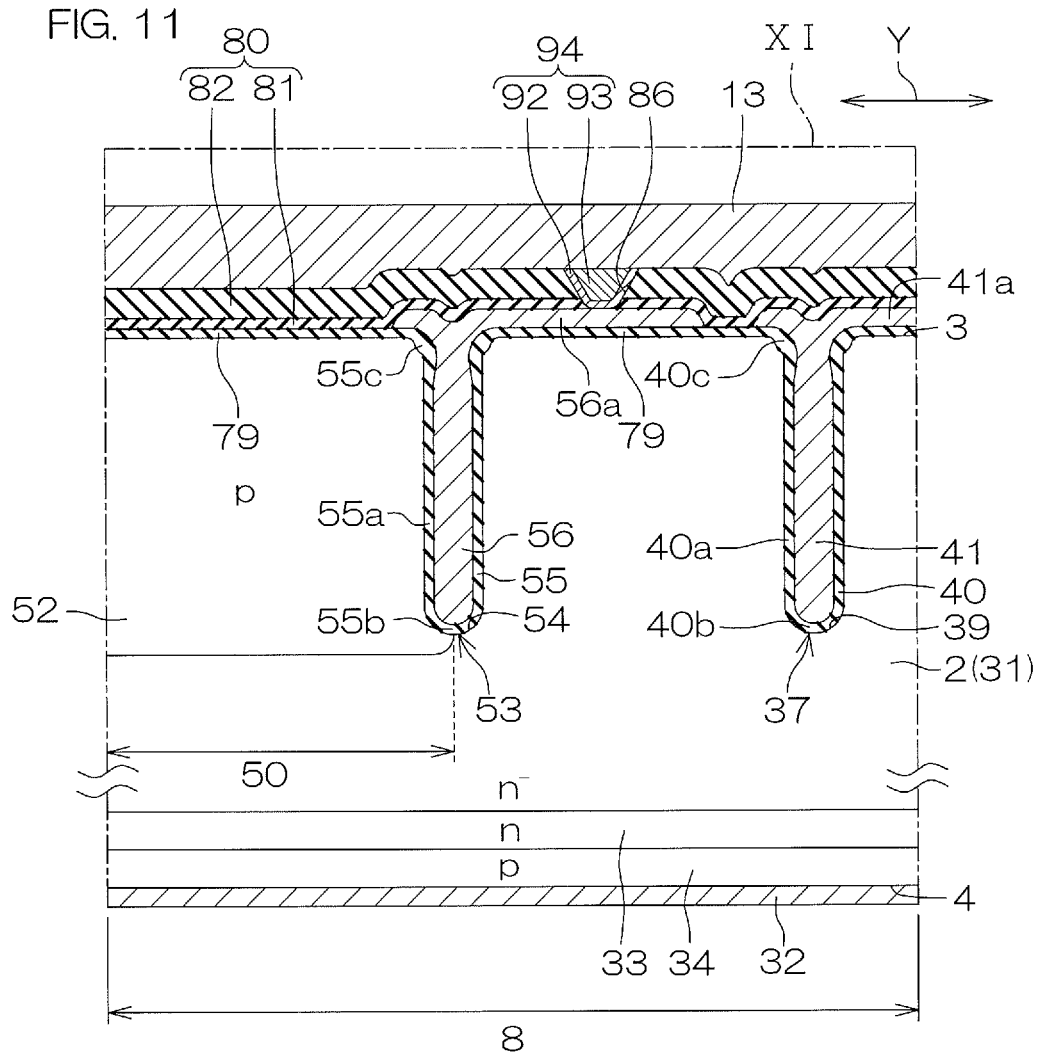
FIG. 11 is a cross-sectional view along line XI-XI shown in FIG. 4.
Figure 12:
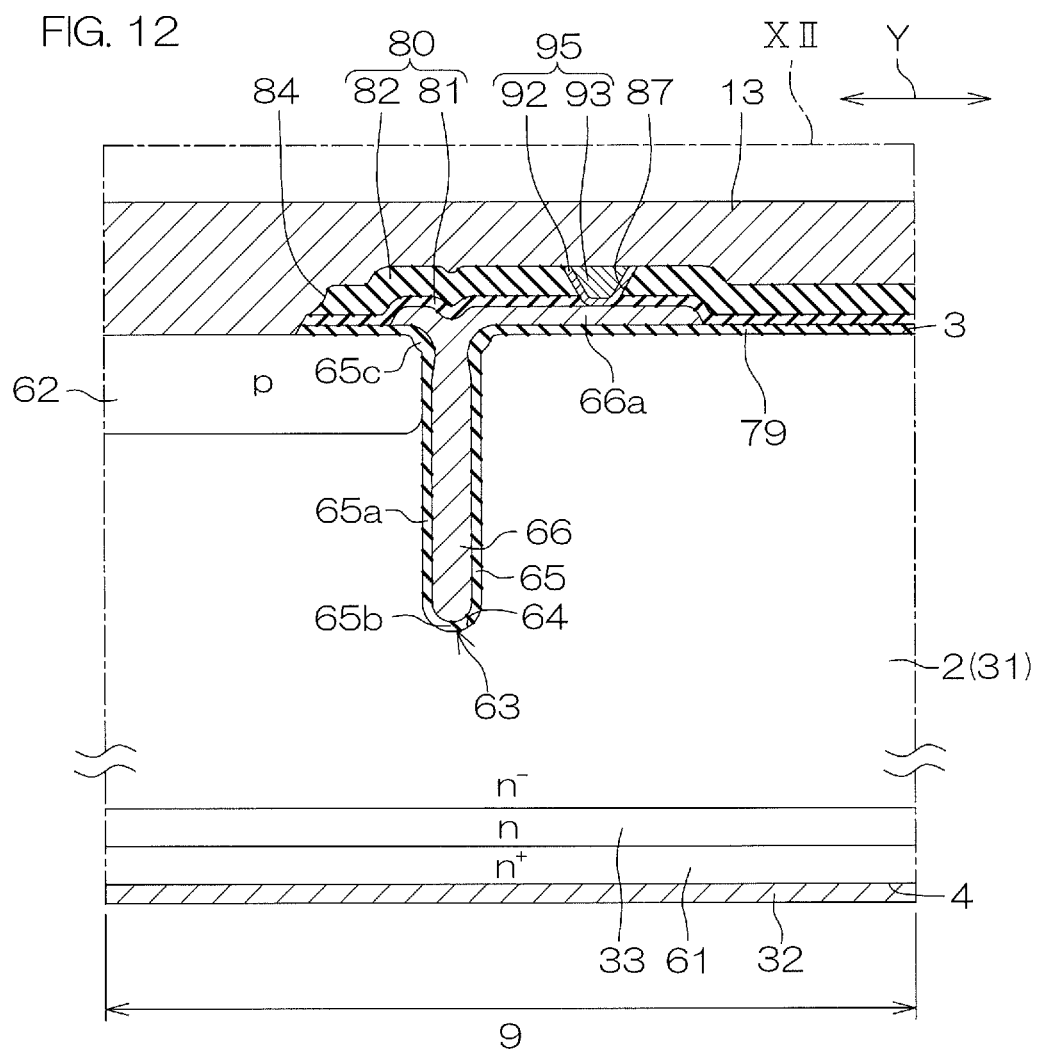
FIG. 12 is a cross-sectional view along line XII-XII shown in FIG. 5.
Figure 13:
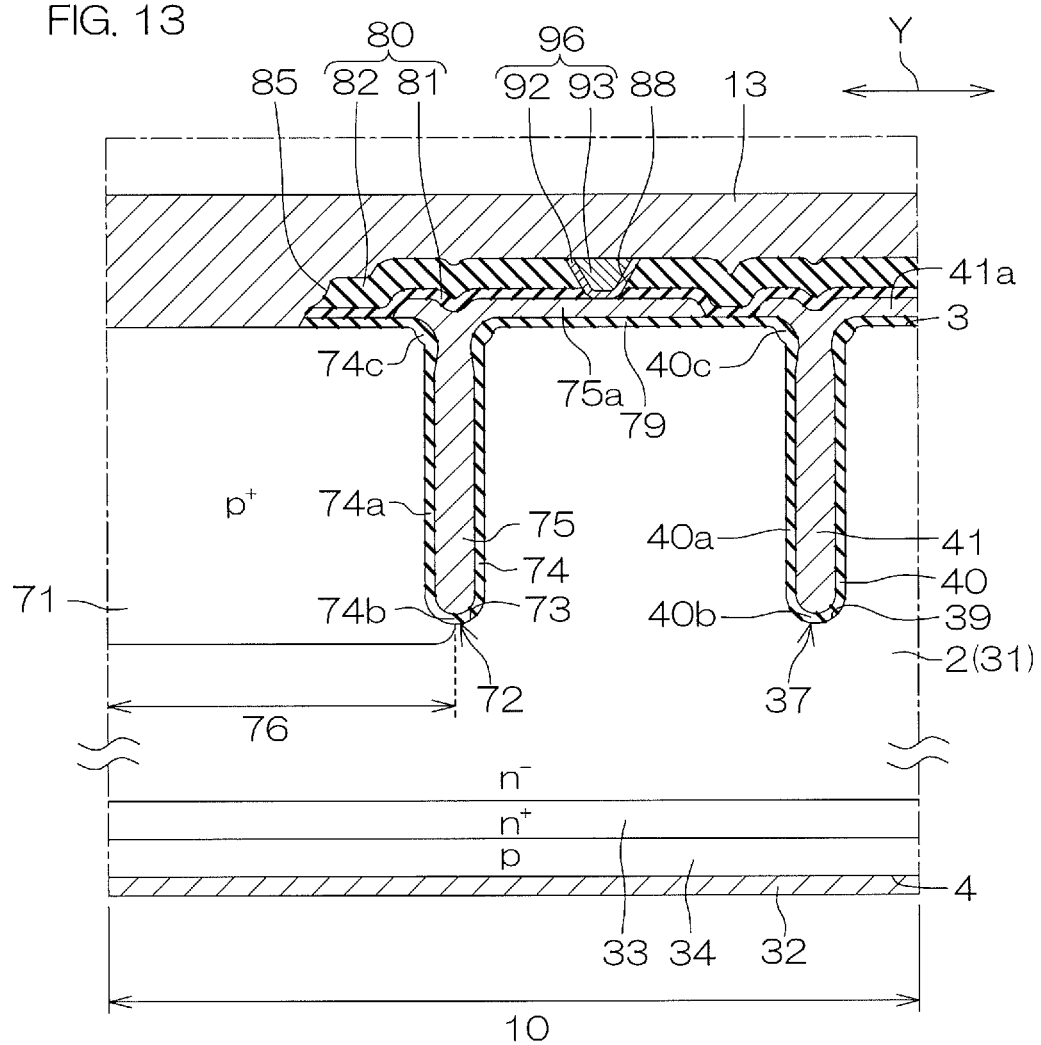
FIG. 13 is a cross-sectional view along line XIII-XIII shown in FIG. 6.

FIG. 11 is a cross-sectional view along line XI-XI shown in FIG. 4. FIG. 12 is a cross-sectional view along line XII-XII shown in FIG. 5. FIG. 13 is a cross-sectional view along line XIII-XIII shown in FIG. 6. Hereinafter, reference is also made to FIG. 1 to FIG. 6 if necessary.

Referring to FIG. 7 to FIG. 13, the semiconductor layer 2 has a single layer structure including an n$^-$-type semiconductor substrate 31. The semiconductor substrate 31 may be a silicon-made FZ substrate formed through an FZ (Floating Zone) method. The semiconductor substrate 31 is formed as a drift layer.

The n-type impurity concentration of the semiconductor substrate 31 may be not less than $4\times10^{13}$ cm$^{-3}$ and not more than $2\times10^{14}$ cm$^{-3}$. The thickness of the semiconductor substrate 31 may be not less than 50 μm and not more than 200 μm. The thickness of the semiconductor substrate 31 may be not less than 50 μm and not more than 100 μm, not less than 100 μm and not more than 150 μm, or not less than 150 μm and not more than 200 μm.

The semiconductor device 1 includes a collector terminal electrode 32 formed on the second main surface 4. The collector terminal electrode 32 is electrically connected to the second main surface 4. The collector terminal electrode 32 forms an ohmic contact with the second main surface 4. The collector terminal electrode 32 transmits a collector signal to the active region 6.

The semiconductor device 1 includes an n-type buffer layer 33 formed in a surface layer portion of the second main surface 4. The buffer layer 33 may be formed in a whole region of the surface layer portion of the second main surface 4. The n-type impurity concentration of the buffer layer 33 exceeds the n-type impurity concentration of the semiconductor substrate 31. The n-type impurity concentration of the buffer layer 33 may be not less than $1\times10^{15}$ cm$^{-3}$ and not more than $1\times10^{17}$ cm$^{-3}$.

The thickness of the buffer layer 33 may be not less than 0.5 μm and not more than 30 μm. The thickness of the buffer layer 33 may be not less than 0.5 μm and not more than 5 μm, not less than 5 μm and not more than 10 μm, not less than 10 μm and not more than 15 μm, not less than 15 μm and not more than 20 μm, not less than 20 μm and not more than 25 μm, or not less than 25 μm and not more than 30 μm.

Referring to FIG. 3, FIG. 4, FIG. 7, and FIG. 8, each of the IGBT regions 8 includes a p-type collector region 34 formed in the surface layer portion of the second main surface 4. More specifically, the collector region 34 is formed in a surface layer portion on the second main surface 4 side in the buffer layer 33. The collector region 34 is exposed from the second main surface 4. The collector region 34 forms an ohmic contact with the collector terminal electrode 32. The p-type impurity concentration of the collector region 34 may be not less than $1\times10^{15}$ cm$^{-3}$ and not more than $1\times10^{18}$ cm$^{-3}$.

Each of the IGBT regions 8 includes an FET structure 35 formed in the first main surface 3. In this embodiment, each of the IGBT regions 8 includes a trench-gate type FET structure 35. The FET structure 35 includes a trench gate structure 36 formed in the first main surface 3. In FIG. 3 and FIG. 4, the trench gate structure 36 is shown by hatching.

In this embodiment, a plurality of the trench gate structures 36 are formed with intervals between the trench gate structures 36 in the first direction X in the IGBT region 8. The plurality of trench gate structures 36 are each formed in a belt shape extending along the second direction Y in plan view. The plurality of trench gate structures 36 are formed in a stripe shape as a whole. Each of the trench gate structures 36 has one end portion located on one side and the other end portion located on the other side with respect to the second direction Y.

The distance between two trench gate structures 36 adjoining in the first direction X may be not less than 1 μm and not more than 8 μm. The distance between the trench gate structures 36 may be not less than 1 μm and not more than 2 μm, not less than 2 μm and not more than 3 μm, not less than 3 μm and not more than 4 μm, not less than 4 μm and not more than 5 μm, not less than 5 μm and not more than 6 μm, not less than 6 μm and not more than 7 μm, or not less than 7 μm and not more than 8 μm.

The FET structure 35 includes a first outer trench gate structure 37 and a second outer trench gate structure 38 formed in the first main surface 3. The first outer trench gate structure 37 extends along the first direction X. The first outer trench gate structure 37 is connected to one end portion of each of the trench gate structures 36. The second outer trench gate structure 38 extends along the first direction X. The second outer trench gate structure 38 is connected to the other end portion of each of the trench gate structures 36.

The first outer trench gate structure 37 and the second outer trench gate structure 38 form one trench gate structure with the plurality of trench gate structures 36. The first and second outer trench gate structures 37 and 38 have the same structure as the trench gate structure 36 with the exception of the fact that they differ from each other in the extending direction. A description of the trench gate structure 36 is hereinafter given, and a description of the first and second outer trench gate structures 37 and 38 is omitted.

Referring to FIG. 8, each of the trench gate structures 36 includes a gate trench 39, a gate insulating layer 40, and a gate electrode 41. The gate trench 39 is formed in the first main surface 3. The gate trench 39 includes a side wall and a bottom wall. The side wall of the gate trench 39 may be formed perpendicularly to the first main surface 3.

The side wall of the gate trench 39 may be inclined such as to descend from the first main surface 3 toward the bottom wall. In other words, the gate trench 39 may be formed in a tapered shape whose opening area is larger than its base area. The bottom wall of the gate trench 39 may be formed in parallel with the first main surface 3. The bottom wall of the gate trench 39 may be formed in a curved shape toward the second main surface 4.

The gate trench 39 includes an opening edge portion and a bottom wall edge portion. The opening edge portion of the gate trench 39 connects the side wall of the gate trench 39 and the first main surface 3 together. The bottom wall edge portion of the gate trench 39 connects the side wall and the bottom wall of the gate trench 39 together.

The opening edge portion of the gate trench 39 has an inclined portion that is inclined such as to descend from the first main surface 3 toward the side wall of the gate trench 39. The opening edge portion of the gate trench 39 is formed in a curved shape hollowed toward the second main surface 4. Hence, a wide portion that has an opening width greater than an opening width on the bottom wall side is formed on the opening side of the gate trench 39.

The opening edge portion of the gate trench 39 may be formed in a curved shape toward the inward side of the gate trench 39. The bottom wall edge portion of the gate trench 39 may be formed in a curved shape toward the second main surface 4.

The depth of the gate trench 39 may be not less than 3 μm and not more than 7 μm. The depth of the gate trench 39 may be not less than 3 μm and not more than 4 μm, not less than 4 μm and not more than 5 μm, not less than 5 μm and not more than 6 μm, or not less than 6 μm and not more than 7 μm.

The width of the gate trench 39 may be not less than 0.5 μm and not more than 3 μm. The width of the gate trench 39 is the width in the first direction X of the gate trench 39. The width of the gate trench 39 may be not less than 0.5 μm and not more than 1 μm, not less than 1 μm and not more than 1.5 μm, not less than 1.5 μm and not more than 2 μm, not less than 2 μm and not more than 2.5 μm, or not less than 2.5 μm and not more than 3 μm.

The gate insulating layer 40 is formed in a film shape along an inner wall of the gate trench 39. The gate insulating layer 40 defines a recessed space in the gate trench 39. The gate insulating layer 40 includes a silicon oxide layer. The gate insulating layer 40 may include a nitride silicon layer instead of the silicon oxide layer or in addition to this silicon oxide layer.

The gate insulating layer 40 includes a first region 40a, a second region 40b, and a third region 40c. The first region 40a covers the side wall of the gate trench 39. The second region 40b covers the bottom wall of the gate trench 39. The third region 40c covers the opening edge portion of the gate trench 39.

The thickness of the second region 20b may be equal to or more than the thickness of the first region 40a. The thickness of the second region 40b may exceed the thickness of the first region 40a. The thickness of the third region 40c may be equal to or more than the thickness of the first region 40a. The thickness of the third region 40c may exceed the thickness of the first region 40a.

The third region 40c includes a bulge portion that bulges toward the inward side of the gate trench 39 in the opening edge portion of the gate trench 39. The third region 40c projects in a curved shape toward the inward side of the gate trench 39. The third region 40c narrows an opening of the gate trench 39 in the opening edge portion of the gate trench 39. Of course, the gate insulating layer 40 having a uniform thickness may be formed on the inner wall of the gate trench 39.

The gate electrode 41 is embedded in the gate trench 39 with the gate insulating layer 40 between the gate electrode 41 and the gate trench 39. More specifically, the gate electrode 41 is embedded in the recessed space defined by the gate insulating layer 40 in the gate trench 39. The gate electrode 41 is controlled by a gate signal.

The gate electrode 41 is formed in a wall shape that extends along the normal direction Z in a cross-sectional view. The gate electrode 41 has an upper end portion positioned on the opening side of the gate trench 39. The upper end portion of the gate electrode 41 is positioned on the bottom wall side of the gate trench 39 with respect to the first main surface 3.

The upper end portion of the gate electrode 41 has a constricted portion that is constricted along the third region 40c of the gate insulating layer 40. A cavity toward the bottom wall of the gate trench 39 is formed in the upper end portion of the gate electrode 41. The cavity of the upper end portion of the gate electrode 41 is formed in a tapered shape toward the bottom wall of the gate trench 39.

The FET structure 35 includes a p-type body region 45 formed in a surface layer portion of the first main surface 3. The p-type impurity concentration of the body region 45 may be not less than $1\times10^{17}$ cm$^{-3}$ and not more than $1\times10^{18}$ cm$^{-3}$. In this embodiment, a plurality of the body regions 45 are formed in both sides of the trench gate structure 36, respectively.

The body region 45 is formed in a belt shape extending along the trench gate structure 36 in plan view. The body region 45 is exposed from the side wall of the gate trench 39. A bottom portion of the body region 45 is formed in a depth position between the first main surface 3 and the bottom wall of the gate trench 39 with respect to the normal direction Z.

The FET structure 35 includes an n$^+$-type emitter region 46 formed in a surface layer portion of the body region 45. The n-type impurity concentration of the emitter region 46 exceeds the n-type impurity concentration of the semiconductor layer 2. The n-type impurity concentration of the emitter region 46 may be not less than $1\times10^{19}$ cm$^{-3}$ and not more than $1\times10^{20}$ cm$^{-3}$.

In this embodiment, a plurality of the emitter regions 46 are formed in both sides of the trench gate structure 36, respectively. The emitter region 46 is formed in a belt shape extending along the trench gate structure 36 in plan view. The emitter region 46 is exposed from the first main surface 3. The emitter region 46 is exposed from the side wall of the gate trench 39. A bottom portion of the emitter region 46 is formed in a depth position between the upper end portion of the gate electrode 41 and the bottom portion of the body region 45 with respect to the normal direction Z.

In this embodiment, the FET structure 35 includes an n$^+$-type carrier storage region 47 formed in a region located on the second main surface 4 side with respect to the body region 45 in the semiconductor layer 2. The n-type impurity concentration of the carrier storage region 47 exceeds the n-type impurity concentration of the semiconductor layer 2. The n-type impurity concentration of the carrier storage region 47 is less than the n-type impurity concentration of the emitter region 46. The n-type impurity concentration of the carrier storage region 47 may be not less than $1\times10^{15}$ cm$^{-3}$ and not more than $1\times10^{17}$ cm$^{-3}$.

In this embodiment, a plurality of the carrier storage regions 47 are formed in both sides of the trench gate structure 36, respectively. The carrier storage region 47 is formed in a belt shape extending along the trench gate structure 36 in plan view. The carrier storage region 47 is exposed from the side wall of the gate trench 39. A bottom portion of the carrier storage region 47 is formed in a depth position between the bottom portion of the body region 45 and the bottom wall of the gate trench 39 with respect to the normal direction Z.

The carrier storage region 47 prevents holes (carriers) supplied to the semiconductor layer 2 from being drawn back (being discharged) to the body region 45. Hence, holes are stored in a region directly under the FET structure 35 in the semiconductor layer 2, and on-resistance is reduced, and on-voltage is reduced.

In this embodiment, the FET structure 35 includes an emitter trench 48 formed in the first main surface 3. In this embodiment, a plurality of the emitter trenches 48 are formed in both sides of the trench gate structure 36, respectively. The emitter trench 48 is formed away from the trench gate structure 36 in the first direction X. The emitter trench 48 extends in a belt shape along the trench gate structure 36 in plan view.

The emitter trench 48 exposes the emitter region 46. The emitter trench 48 may pass through the emitter region 46. The length of the emitter trench 48 is equal to or less than the length of the trench gate structure 36 with respect to the second direction Y. Preferably, the length of the emitter trench 48 is less than the length of the trench gate structure 36.

The FET structure 35 includes a p$^+$-type contact region 49 formed in a region along a bottom wall of the emitter trench 48 in the body region 45. The p-type impurity concentration of the contact region 49 exceeds the p-type impurity concentration of the body region 45. The p-type impurity concentration of the contact region 49 may be not less than $1\times10^{19}$ cm$^{-3}$ and not more than $1\times10^{20}$ cm$^{-3}$.

The contact region 49 is exposed from the bottom wall of the emitter trench 48. The contact region 49 extends in a belt shape along the emitter trench 48 in plan view. A bottom portion of the contact region 49 is formed in a depth position between the bottom wall of the emitter trench 48 and the bottom portion of the body region 45 with respect to the normal direction Z.

In the FET structure 35, the gate electrode 41 faces the body region 45 and the emitter region 46 with the gate insulating layer 40 between the gate electrode 41 and the body region 45 and between the gate electrode 41 and the emitter region 46. In this embodiment, the gate electrode 41 also faces the carrier storage region 47 with the gate insulating layer 40 between the gate electrode 41 and the carrier storage region 47. A channel of the IGBT is formed in a region between the emitter region 46 and the carrier storage region 47 in the body region 45. On/Off of the channel is controlled by a gate signal.

Referring to FIG. 4 and FIG. 8, the semiconductor device 1 includes a region separation structure 50 formed in the first main surface 3 in the IGBT region 8. The region separation structure 50 divides the FET structure 35 from other regions. The region separation structure 50 is formed in a region adjoining the FET structure 35 in the first main surface 3.

In this embodiment, a plurality of the region separation structures 50 are formed in both sides of the FET structure 35, respectively. More specifically, the region separation structures 50 are formed in regions between mutually adjoining ones of the plurality of FET structures 35, respectively. Hence, the plurality of FET structures 35 are separated from each other by the region separation structure 50.

In this embodiment, the region separation structure 50 forms an IE (Injection Enhanced: carrier injection facilitation) structure 51 with the FET structure 35. In the IE structure 51, the plurality of FET structures 35 are disposed in such a manner as to be separated from each other by the region separation structure 50. The region separation structure 50 is formed such that holes injected into the semiconductor layer 2 flow into the FET structure 35 while detouring around the region separation structure 50. In other words, the region separation structure 50 restricts the movement of holes. Hence, holes are stored in a region directly under the FET structure 35 in the semiconductor layer 2, and the density of holes is raised. As a result, on-resistance is reduced, and on-voltage is reduced.

More specifically, each of the region separation structures 50 includes a p$^+$-type floating region 52 formed in a region adjoining the FET structure 35 in the surface layer portion of the first main surface 3. The floating region 52 is formed in an electrically floating state.

The p-type impurity concentration of the floating region 52 may be equal to or more than the p-type impurity concentration of the body region 45. The p-type impurity concentration of the floating region 52 may exceed the p-type impurity concentration of the body region 45. The p-type impurity concentration of the floating region 52 may be not less than $1\times10^{16}$ cm$^{-3}$ and not more than $1\times10^{20}$ cm$^{-3}$. Preferably, the p-type impurity concentration of the floating region 52 is not less than $1\times10^{18}$ cm$^{-3}$ and not more than $1\times10^{20}$ cm$^{-3}$.

The floating region 52 is formed in a belt shape extending along the FET structure 35 in plan view. Preferably, the length of the floating region 52 is less than the length of the gate trench 39 with respect to the second direction Y.

A bottom portion of the floating region 52 is formed in a depth position between the bottom portion of the body region 45 and the second main surface 4 with respect to the normal direction Z. More specifically, the bottom portion of the floating region 52 is formed in a depth position between the bottom portion of the carrier storage region 47 and the second main surface 4. In this embodiment, the bottom portion of the floating region 52 is formed in a depth position between the bottom wall of the gate trench 39 and the second main surface 4.

Each of the region separation structures 50 includes a region separation trench structure 53 that divides the floating region 52 from the FET structure 35. The region separating trench structure 53 is formed in an annular shape (in this embodiment, a quadrangular ring shape) that surrounds the floating region 52 in plan view.

The region separation trench structure 53 includes a region separation trench 54, a region separation insulating layer 55, and a region separation electrode layer 56. The region separation trench 54 is formed in the first main surface 3. The region separation trench 54 includes a side wall and a bottom wall. The side wall of the region separation trench 54 may be formed perpendicularly to the first main surface 3. The side wall of the region separation trench 54 may be inclined such as to descend from the first main surface 3 toward the bottom wall. In other words, the region separation trench 54 may be formed in a tapered shape whose opening area is larger than its base area.

The side wall of the region separation trench 54 includes an outer wall that faces the FET structure 35 and an inner wall that faces the floating region 52. The outer wall of the region separation trench 54 exposes the emitter region 46, the body region 45, and the carrier storage region 47. The inner wall of the region separation trench 54 exposes the floating region 52.

The bottom wall of the region separation trench 54 may be formed in parallel with the first main surface 3. The bottom wall of the region separation trench 54 may be formed in a curved shape toward the second main surface 4. The bottom wall of the region separation trench 54 is covered with the bottom portion of the floating region 52. In other words, the floating region 52 has a covering portion with which the bottom wall of the region separation trench 54 is covered.

The region separation trench 54 includes an opening edge portion and a bottom wall edge portion. The opening edge portion of the region separation trench 54 connects the side wall of the region separation trench 54 and the first main surface 3 together. The bottom wall edge portion of the region separation trench 54 connects the side wall and the bottom wall of the region separation trench 54 together.

The opening edge portion of the region separation trench 54 has an inclined portion that is inclined such as to descend from the first main surface 3 toward the side wall of the region separation trench 54. The opening edge portion of the region separation trench 54 is formed in a curved shape that is hollowed toward the second main surface 4. Hence, a wide portion that has an opening width greater than an opening width on the bottom wall side is formed on the opening side of the region separation trench 54.

The opening edge portion of the region separation trench 54 may be formed in a curved shape toward the inward side of the region separation trench 54. The bottom wall edge portion of the region separation trench 54 may be formed in a curved shape toward the second main surface 4.

The depth of the region separation trench 54 may be not less than 3 μm and not more than 7 μm. The depth of the region separation trench 54 may be not less than 3 μm and not more than 4 μm, not less than 4 μm and not more than 5 μm, not less than 5 μm and not more than 6 μm, or not less than 6 μm and not more than 7 μm. The depth of the region separation trench 54 may be equal to the depth of the gate trench 39.

The width of the region separation trench 54 may be not less than 0.5 μm and not more than 3 μm. The width of the region separation trench 54 is the width in the first direction X of the region separation trench 54. The width of the region separation trench 54 may be not less than 0.5 μm and not more than 1 μm, not less than 1 μm and not more than 1.5 μm, not less than 1.5 μm and not more than 2 μm, not less than 2 μm and not more than 2.5 μm, or not less than 2.5 μm and not more than 3 μm. The width of the region separation trench 54 may be equal to the width of the gate trench 39.

The region separation insulating layer 55 is formed in a film shape along the inner wall of the region separation trench 54. The region separation insulating layer 55 defines a recessed space in the region separation trench 54. In this embodiment, the region separation insulating layer 55 includes a silicon oxide layer. The region separation insulating layer 55 may include a nitride silicon layer instead of the silicon oxide layer or in addition to this silicon oxide layer.

The region separation insulating layer 55 includes a first region 55a, a second region 55b, and a third region 55c. The first region 55a covers the side wall of the region separation trench 54. The second region 55b covers the bottom wall of the region separation trench 54. The third region 55c covers the opening edge portion of the region separation trench 54.

The thickness of the second region 20b may be equal to or more than the thickness of the first region 55a. The thickness of the second region 55b may exceed the thickness of the first region 55a. The thickness of the third region 55c may be equal to or more than the thickness of the first region 55a. The thickness of the third region 55c may exceed the thickness of the first region 55a.

The third region 55c includes a bulge portion that bulges toward the inward side of the region separation trench 54 in the opening edge portion of the region separation trench 54. The third region 55c projects in a curved shape toward the inward side of the region separation trench 54. The third region 55c narrows an opening of the region separation trench 54 in the opening edge portion of the region separation trench 54. Of course, the region separation insulating layer 55 having a uniform thickness may be formed on the inner wall of the region separation trench 54.

The region separation electrode layer 56 is embedded in the region separation trench 54 with the region separation insulating layer 55 between the region separation electrode layer 56 and the region separation trench 54. More specifically, the region separation electrode layer 56 is embedded in a recessed space defined by the region separation insulating layer 55 in the region separation trench 54. The region separation electrode layer 56 is controlled by an emitter signal.

The region separation electrode layer 56 is formed in a wall shape that extends along the normal direction Z in a cross-sectional view. The region separation electrode layer 56 has an upper end portion positioned on the opening side of the region separation trench 54. The upper end portion of the region separation electrode layer 56 is positioned on the bottom wall side of the region separation trench 54 with respect to the first main surface 3.

The upper end portion of the region separation electrode layer 56 has a constricted portion that is constricted along the third region 55c of the region separation insulating layer 55. A cavity toward the bottom wall of the region separation trench 54 is formed in the upper end portion of the region separation electrode layer 56. The cavity of the upper end portion of the region separation electrode layer 56 is formed in a tapered shape toward the bottom wall of the region separation trench 54.

Referring to FIG. 3, FIG. 5, FIG. 7, and FIG. 9, each of the diode regions 9 includes an n$^+$-type cathode region 61 formed in the surface layer portion of the second main surface 4. More specifically, the cathode region 61 is formed in the surface layer portion on the second main surface 4 side in the buffer layer 33. The cathode region 61 is exposed from the second main surface 4. The cathode region 61 forms an ohmic contact with the collector terminal electrode 32.

The n-type impurity concentration of the cathode region 61 exceeds the n-type impurity concentration of the semiconductor layer 2. The n-type impurity concentration of the cathode region 61 also exceeds the n-type impurity concentration of the buffer layer 33. The n-type impurity concentration of the cathode region 61 may be not less than $1\times10^{19}$ cm$^{-3}$ and not more than $1\times10^{20}$ cm$^{-3}$.

The cathode region 61 is electrically connected to the collector region 34 in a side along the second direction Y. In this embodiment, the cathode region 61 is surrounded by the collector region 34. In other words, the cathode region 61 is electrically connected to the collector region 34 in a side along the first direction X and in a side along the second direction Y. The collector region 34 may be formed in a whole region of regions other than the cathode region 61 in the surface layer portion of the second main surface 4.

Each of the diode regions 9 includes a p-type anode region 62 formed in the surface layer portion of the first main surface 3. The anode region 62 is controlled by an emitter signal. The p-type impurity concentration of the anode region 62 may be not less than $1\times10^{16}$ cm$^{-3}$ and not more than $1\times10^{18}$ cm$^{-3}$. The p-type impurity concentration of the anode region 62 may be equal to the p-type impurity concentration of the body region 45. The p-type impurity concentration of the anode region 62 may be less than the p-type impurity concentration of the body region 45.

In this embodiment, a plurality of the anode regions 62 are formed with intervals between the anode regions 62 along the first direction X in plan view. The plurality of anode regions 62 are each formed in a belt shape extending along the second direction Y in plan view. The plurality of anode regions 62 are formed in a stripe shape as a whole. The anode region 62 is formed in a region that overlaps the cathode region 61 in the normal direction Z. In this embodiment, all of the anode regions 62 overlap the cathode region 61 in the normal direction Z.

The anode region 62 forms a pn junction with the semiconductor layer 2. Hence, a pn junction diode D is formed in which the anode region 62 serves as an anode and in which the semiconductor layer 2 (cathode region 61) serves as a cathode.

With respect to the second direction Y, the length of the anode region 62 may be equal to or less than the length of the trench gate structure 36. Preferably, the length of the anode region 62 is less than the length of the trench gate structure 36.

The distance between two anode regions 62 adjoining in the first direction X may be not less than 0.5 μm and not more than 3 μm. The distance between the anode regions 62 may be not less than 0.5 μm and not more than 1 μm, not less than 1 μm and not more than 1.5 μm, not less than 1.5 μm and not more than 2 μm, not less than 2 μm and not more than 2.5 μm, or not less than 2.5 μm and not more than 3 μm.

Each of the diode regions 9 includes an anode separation structure 63 that divides the anode region 62 from other regions. More specifically, each of the diode regions 9 includes a plurality of the anode separation structures 63 that define a plurality of the anode regions 62, respectively. The anode separation structure 63 is shown by hatching in FIG. 3 and FIG. 5.

The plurality of anode separation structures 63 are formed in regions between mutually adjoining ones of the plurality of anode regions 62, respectively. More specifically, the plurality of anode separation structures 63 are each formed annularly (in this embodiment, in a quadrangular ring shape) such as to surround the anode region 62 in plan view.

The anode separation structure 63 that defines one anode region 62 and the anode separation structure 63 that defines the other anode region 62 are integrally formed in regions between mutually adjoining ones of the plurality of anode regions 62.

Each of the anode separation structures 63 includes an anode separation trench 64, an anode separation insulating layer 65, and an anode separation electrode layer 66. The anode separation trench 64 is formed in the first main surface 3. The anode separation trench 64 includes a side wall and a bottom wall. The side wall of the anode separation trench 64 may be formed perpendicularly to the first main surface 3. The side wall of the anode separation trench 64 may be inclined such as to descend from the first main surface 3 toward the bottom wall. The anode separation trench 64 may be formed in a tapered shape whose opening area is larger than its base area.

The bottom wall of the anode separation trench 64 may be formed in parallel with the first main surface 3. The bottom wall of the anode separation trench 64 may be formed in a curved shape toward the second main surface 4.

The anode separation trench 64 includes an opening edge portion and a bottom wall edge portion. The opening edge portion of the anode separation trench 64 connects the side wall of the anode separation trench 64 and the first main surface 3 together. The bottom wall edge portion of the anode separation trench 64 connects the side wall and the bottom wall of the anode separation trench 64 together.

The opening edge portion of the anode separation trench 64 has an inclined portion that is inclined such as to descend from the first main surface 3 toward the side wall of the anode separation trench 64. The opening edge portion of the anode separation trench 64 is formed in a curved shape hollowed toward the second main surface 4. Hence, a wide portion that has an opening width greater than an opening width on the bottom wall side is formed on the opening side of the anode separation trench 64.

The opening edge portion of the anode separation trench 64 may be formed in a curved shape toward the inward side of the anode separation trench 64. The bottom wall edge portion of the anode separation trench 64 may be formed in a curved shape toward the second main surface 4.

The depth of the anode separation trench 64 may be not less than 3 μm and not more than 7 μm. The depth of the anode separation trench 64 may be not less than 3 μm and not more than 4 μm, not less than 4 μm and not more than 5 μm, not less than 5 μm and not more than 6 μm, or not less than 6 μm and not more than 7 μm. The depth of the anode separation trench 64 may be equal to the depth of the gate trench 39. The depth of the anode separation trench 64 may be equal to the depth of the region separation trench 54.

The width of the anode separation trench 64 may be not less than 0.5 μm and not more than 3 μm. The width of the anode separation trench 64 is the width in the first direction X of the anode separation trench 64. The width of the anode separation trench 64 may be not less than 0.5 μm and not more than 1 μm, not less than 1 μm and not more than 1.5 μm, not less than 1.5 μm and not more than 2 μm, not less than 2 μm and not more than 2.5 μm, or not less than 2.5 μm and not more than 3 μm. The width of the anode separation trench 64 may be equal to the width of the gate trench 39. The width of the anode separation trench 64 may be equal to the width of the region separation trench 54.

The anode separation insulating layer 65 is formed in a film shape along an inner wall of the anode separation trench 64. The anode separation insulating layer 65 defines a recessed space in the anode separation trench 64. In this embodiment, the anode separation insulating layer 65 includes a silicon oxide layer. The anode separation insulating layer 65 may include a nitride silicon layer instead of the silicon oxide layer or in addition to this silicon oxide layer.

In the anode separation insulating layer 65, apart with which the side wall of the anode separation trench 64 is covered includes an upper end portion positioned on the opening side of the anode separation trench 64. The upper end portion of the anode separation insulating layer 65 is positioned on the bottom wall side of the anode separation trench 64 with respect to the first main surface 3.

The anode separation insulating layer 65 includes a first region 65a, a second region 65b, and a third region 65c. The first region 65a covers the side wall of the anode separation trench 64. The second region 65b covers the bottom wall of the anode separation trench 64. The second region 65b forms the upper end portion of the anode separation insulating layer 65. In this embodiment, the third region 65c covers the opening edge portion of the anode separation trench 64 in both end portions in the second direction Y in the anode separation trench 64 (also see FIG. 12).

The thickness of the second region 65b may be equal to or more than the thickness of the first region 65a. The thickness of the second region 65b may exceed the thickness of the first region 65a. The thickness of the third region 65c may exceed the thickness of the first region 65a. In the first region 65a, a part positioned on the opening side of the anode separation trench 64 may bulge toward the inward side of the anode separation trench 64.

The third region 65c includes a bulge portion that bulges toward the inward side of the anode separation trench 64 in the opening edge portion of the anode separation trench 64. The third region 65c projects in a curved shape toward the inward side of the anode separation trench 64. The third region 65c narrows an opening of the anode separation trench 64 in the opening edge portion of the gate trench 39.

Of course, the anode separation insulating layer 65 having a uniform thickness may be formed on the inner wall of the anode separation trench 64.

The anode separation electrode layer 66 is embedded in the anode separation trench 64 with the anode separation insulating layer 65 between the anode separation electrode layer 66 and the anode separation trench 64. More specifically, the anode separation electrode layer 66 is embedded in a recessed space defined by the anode separation insulating layer 65 in the anode separation trench 64. The anode separation electrode layer 66 is controlled by an emitter signal.

The anode separation electrode layer 66 is formed in a wall shape extending along the normal direction Z in a cross-sectional view. The anode separation electrode layer 66 has an upper end portion positioned on the opening side of the anode separation trench 64. The upper end portion of the anode separation electrode layer 66 is positioned on the bottom wall side of the anode separation trench 64 with respect to the first main surface 3.

The upper end portion of the anode separation electrode layer 66 is formed in a tapered shape toward the first main surface 3 side. A cavity toward the bottom wall of the anode separation trench 64 is formed in the upper end portion of the anode separation electrode layer 66. The cavity of the anode separation electrode layer 66 is formed in a tapered shape toward the bottom wall of the anode separation trench 64.

A recess 67 is defined by the anode separation trench 64, by the anode separation electrode layer 66, and by the anode separation insulating layer 65 on the opening side of the anode separation trench 64. More specifically, the recess 67 is defined by the side wall of the anode separation trench 64, by the upper end portion of the anode separation electrode layer 66, and by the upper end portion of the anode separation insulating layer 65 in the anode separation trench 64. A wide portion of the anode separation trench 64 is defined by the recess 67. The side wall of the anode separation trench 64 (i.e., side wall of the recess 67) exposes the anode region 62.

A bottom portion of the anode region 62 is formed in a depth position between the first main surface 3 and the bottom wall of the anode separation trench 64 with respect to the normal direction Z. In other words, the bottom portion of the anode region 62 is formed in a depth position between the first main surface 3 and the bottom wall of the gate trench 39 with respect to the normal direction Z. Also, the bottom portion of the anode region 62 is formed in a region on the first main surface 3 side with respect to the bottom portion of the carrier storage region 47 with respect to the normal direction Z.

Referring to FIG. 3, FIG. 6, FIG. 7, FIG. 9, and FIG. 10, each of the boundary regions 10 includes the collector region 34 formed in the surface layer portion of the second main surface 4. In other words, the collector region 34 is led out from the IGBT region 8 to the boundary region 10 in the surface layer portion of the second main surface 4, and is connected to the cathode region 61.

Each of the boundary regions 10 includes a $p^+$-type well region 71 formed in the surface layer portion of the first main surface 3. The well region 71 is controlled by an emitter signal. The p-type impurity concentration of the well region 71 may be not less than $1 \times 10^{16}$ cm$^{-3}$ and not more than $1 \times 10^{20}$ cm$^{-3}$. Preferably, the p-type impurity concentration of the well region 71 is not less than $1 \times 10^{18}$ cm$^{-3}$ and not more than $1 \times 10^{20}$ cm$^{-3}$.

The p-type impurity concentration of the well region 71 may be equal to or more than the p-type impurity concentration of the body region 45. The p-type impurity concentration of the well region 71 may exceed the p-type impurity concentration of the body region 45. The p-type impurity concentration of the well region 71 may be equal to the p-type impurity concentration of the floating region 52.

In this embodiment, a plurality of the well regions 71 are formed with intervals between the well regions 71 along the first direction X in plan view. The plurality of well regions 71 are each formed in a belt shape extending along the second direction Y in plan view. The plurality of well regions 71 are formed in a stripe shape as a whole. The plurality of well regions 71 are formed in a region that overlaps the collector region 34 with respect to the normal direction Z. In this embodiment, all of the well regions 71 overlap the collector region 34 in the normal direction Z.

A bottom portion of the well region 71 is formed in a depth position between the bottom portion of the carrier storage region 47 and the second main surface 4 with respect to the normal direction Z. In this embodiment, the bottom portion of the well region 71 is formed in a depth position between the bottom wall of the gate trench 39 and the second main surface 4 with respect to the normal direction Z.

Each of the well regions 71 has one end portion located on one side and the other end portion located on the other side with respect to the second direction Y. With respect to the second direction Y, the length of the well region 71 is equal to or less than the length of the trench gate structure 36. Preferably, the length of the well region 71 is less than the length of the trench gate structure 36.

The distance between two well regions 71 adjoining in the first direction X may be not less than 1 μm and not more than 10 μm. The distance between the well regions 71 may be not less than 1 μm and not more than 2 μm, not less than 2 μm and not more than 3 μm, not less than 3 μm and not more than 4 μm, not less than 4 μm and not more than 5 μm, not less than 5 μm and not more than 6 μm, not less than 6 μm and not more than 7 μm, not less than 7 μm and not more than 8 μm, not less than 8 μm and not more than 9 μm, or not less than 9 μm and not more than 10 μm.

Each of the boundary regions 10 includes a well separation structure 72 that defines the well region 71. The well separation structure 72 is shown by hatching in FIG. 3, FIG. 5, and FIG. 6. In this embodiment, a plurality of the well separation structures 72 that define the plurality of well regions 71, respectively, are formed. The plurality of well separation structures 72 are each formed annularly (in this embodiment, in a quadrangular ring shape) such as to surround the well region 71 in plan view.

The well separation structure 72 includes a well separation trench 73, a well separation insulating layer 74, and a well separation electrode layer 75. The well separation trench 73 is formed in the first main surface 3. The well separation trench 73 includes a side wall and a bottom wall.

The side wall of the well separation trench 73 may be formed perpendicularly to the first main surface 3. The side wall of the well separation trench 73 may be inclined such as to descend from the first main surface 3 toward the bottom wall. The well separation trench 73 may be formed in a tapered shape whose opening area is larger than its base area.

The bottom wall of the well separation trench 73 may be formed in parallel with the first main surface 3. The bottom wall of the well separation trench 73 may be formed in a curved shape toward the second main surface 4. The bottom wall of the well separation trench 73 is covered with the bottom portion of the well region 71. In other words, the well region 71 has a covering portion that covers the bottom wall of the well separation trench 73.

The well separation trench 73 includes an opening edge portion and a bottom wall edge portion. The opening edge portion of the well separation trench 73 connects the side wall of the well separation trench 73 and the first main surface 3 together. The bottom wall edge portion of the well separation trench 73 connects the side wall and the bottom wall of the well separation trench 73 together.

The opening edge portion of the well separation trench 73 has an inclined portion that is inclined such as to descend from the first main surface 3 toward the side wall of the well separation trench 73. The opening edge portion of the well separation trench 73 is formed in a curved shape hollowed toward the second main surface 4. Hence, a wide portion that has an opening width greater than an opening width on the bottom wall side is formed on the opening side of the well separation trench 73.

The opening edge portion of the well separation trench 73 may be formed in a curved shape toward the inward side of the well separation trench 73. The bottom wall edge portion of the well separation trench 73 may be formed in a curved shape toward the second main surface 4.

The depth of the well separation trench 73 may be not less than 3 μm and not more than 7 μm. The depth of the well separation trench 73 may be not less than 3 μm and not more than 4 μm, not less than 4 μm and not more than 5 μm, not less than 5 μm and not more than 6 μm, or not less than 6 μm and not more than 7 μm. The depth of the well separation trench 73 may be equal to the depth of the gate trench 39. The depth of the well separation trench 73 may be equal to the depth of the region separation trench 54. The depth of the well separation trench 73 may be equal to the depth of the anode separation trench 64.

The width of the well separation trench 73 may be not less than 0.5 μm and not more than 3 μm. The width of the well separation trench 73 is the width in the first direction X of the well separation trench 73. The width of the well separation trench 73 may be not less than 0.5 μm and not more than 1 μm, not less than 1 μm and not more than 1.5 μm, not less than 1.5 μm and not more than 2 μm, not less than 2 μm and not more than 2.5 μm, or not less than 2.5 μm and not more than 3 μm. The width of the well separation trench 73 may be equal to the width of the gate trench 39. The width of the well separation trench 73 may be equal to the width of the region separation trench 54. The width of the well separation trench 73 may be equal to the width of the anode separation trench 64.

The well separation insulating layer 74 is formed in a film shape along an inner wall of the well separation trench 73. The well separation insulating layer 74 defines a recessed space in the well separation trench 73. In this embodiment, the well separation insulating layer 74 includes a silicon oxide layer. The well separation insulating layer 74 may include a nitride silicon layer instead of the silicon oxide layer or in addition to this silicon oxide layer.

The well separation insulating layer 74 includes a first region 74a, a second region 74b, and a third region 74c. The first region 74a covers the side wall of the well separation trench 73. The second region 74b covers the bottom wall of the well separation trench 73. The third region 74c covers the opening edge portion of the well separation trench 73.

The thickness of the second region 74b may be equal to or more than the thickness of the first region 74a. The thickness of the second region 74b may exceed the thickness of the first region 74a. The thickness of the third region 74c may be equal to or more than the thickness of the first region 74a. The thickness of the third region 74c may exceed the thickness of the first region 74a.

The third region 74c includes a bulge portion that bulges toward the inward side of the well separation trench 73 in the opening edge portion of the well separation trench 73. The third region 74c projects in a curved shape toward the inward side of the well separation trench 73. The third region 74c narrows an opening of the well separation trench 73 in the opening edge portion of the well separation trench 73. Of course, the well separation insulating layer 74 having a uniform thickness may be formed on the inner wall of the well separation trench 73.

The well separation electrode layer 75 is embedded in the well separation trench 73 with the well separation insulating layer 74 between the well separation electrode layer 75 and the well separation trench 73. More specifically, the well separation electrode layer 75 is embedded in a recessed space defined by the well separation insulating layer 74 in the well separation trench 73. The well separation electrode layer 75 is controlled by an emitter signal.

The well separation electrode layer 75 is formed in a wall shape that extends along the normal direction Z in a cross-sectional view. The well separation electrode layer 75 has an upper end portion positioned on the opening side of the well separation trench 73. The upper end portion of the well separation electrode layer 75 is positioned on the bottom wall side of the well separation trench 73 with respect to the first main surface 3.

The upper end portion of the well separation electrode layer 75 has a constricted portion that is constricted along the third region 74c of the well separation insulating layer 74. A cavity toward the bottom wall of the well separation trench 73 is formed in the upper end portion of the well separation electrode layer 75. The cavity of the well separation electrode layer 75 is formed in a tapered shape toward the bottom wall of the well separation trench 73.

Referring to FIG. 7, in each of the boundary regions 10, the plurality of well regions 71 include a first proximal well region 71A and a second proximal well region 71B. The first proximal well region 71A is a well region 71 that is brought closest to the IGBT region 8. The second proximal well region 71B is a well region 71 that is brought closest to the diode region 9. The second proximal well region 71B defines the boundary region 10 between the first proximal well region 71A and the second proximal well region 71B.

In this embodiment, the second proximal well region 71B is divided from the anode region 62 by using the anode separation structure 63. In other words, in this embodiment, a boundary region separation structure 76 formed in a region closest to the diode region 9 includes the second proximal well region 71B and the anode separation structure 63. The whole region of the second proximal well region 71B overlaps the collector region 34 in the normal direction Z. Of course, the second proximal well region 71B may be divided from other regions by the well separation structure 72.

As thus described, each of the boundary regions 10 includes the boundary region separation structure 76 including the well region 71 and the well separation structure 72. The boundary region separation structure 76 has a structure corresponding to the region separation structure 50 with the exception of the fact that the well region 71 is included instead of the floating region 52.

Each of the boundary regions 10 includes a boundary FET structure 77 formed in a region adjoining the boundary region separation structure 76. In this embodiment, a plurality of boundary FET structures 77 are formed in both sides of the boundary region separation structure 76, respectively. The plurality of boundary FET structures 77 are formed in regions between the plurality of boundary region separation structures 76, respectively. Hence, the plurality of boundary FET structures 77 are separated by the boundary region separation structure 76.

The boundary FET structure 77 has a structure corresponding to the FET structure 35. In other words, the boundary FET structure 77 includes the trench gate structure 36, the body region 45, the emitter region 46, the carrier storage region 47, the emitter trench 48, and the contact region 49 in the same way as the FET structure 35. A description of the FET structure 35 is applied correspondingly to a detailed description of the boundary FET structure 77. In the boundary FET structure 77, the same reference sign is given to a structural component corresponding to that of the FET structure 35, and a description of this structural component is omitted.

The well separation trench 73 includes an outer wall that faces the boundary FET structure 77 and an inner wall that faces the well region 71. The outer wall of the well separation trench 73 exposes the emitter region 46, the body region 45, and the carrier storage region 47. The inner wall of the well separation trench 73 exposes the well region 71.

Referring to FIG. 7 to FIG. 10, the semiconductor device 1 includes a main surface insulating layer 79 formed on the first main surface 3. The main surface insulating layer 79 is formed in a film shape along the first main surface 3. The main surface insulating layer 79 selectively covers the first main surface 3. More specifically, the main surface insulating layer 79 selectively covers the IGBT region 8, the diode region 9, and the boundary region 10.

In this embodiment, the main surface insulating layer 79 includes a silicon oxide layer. The main surface insulating layer 79 may include a silicon nitride layer instead of the silicon oxide layer or in addition to this silicon oxide layer. The main surface insulating layer 79 is continuous with the gate insulating layer 40, the region separation insulating layer 55, the anode separation insulating layer 65, and the well separation insulating layer 74.

Referring to FIG. 11, the gate electrode 41 of the IGBT region 8 has a gate lead-out portion 41a led out onto the first main surface 3 from the gate trench 39. More specifically, the gate lead-out portion 41a is led out onto the main surface insulating layer 79 from the gate trench 39 of the first outer trench gate structure 37 (second outer trench gate structure 38). The gate lead-out portion 41a is led out along the second direction Y.

The gate lead-out portion 41a is electrically connected to the gate wiring 19. A gate signal applied to the gate terminal electrode 14 is transmitted to the gate electrode 41 through the gate wiring 19 and the gate lead-out portion 41a.

Referring to FIG. 11, the region separation electrode layer 56 of the region separation structure 50 has an separation lead-out portion 56a led out from the region separation trench 54 onto the first main surface 3. More specifically, the separation lead-out portion 56a is led out from the region separation trench 54 onto the main surface insulating layer 79. The separation lead-out portion 56a is led out along the second direction Y.

The separation lead-out portion 56a is electrically connected to the emitter terminal electrode 13. An emitter signal applied to the separation lead-out portion 56a is transmitted to the region separation electrode layer 56 through the separation lead-out portion 56a.

Referring to FIG. 12, the anode separation electrode layer 66 of the anode separation structure 63 has an anode lead-out portion 66a led out from the anode separation trench 64 onto the first main surface 3. More specifically, the anode lead-out portion 66a is led out from the anode separation trench 64 onto the main surface insulating layer 79. The anode lead-out portion 66a is led out along the second direction Y.

The anode lead-out portion 66a is electrically connected to the emitter terminal electrode 13. An emitter signal applied to the anode lead-out portion 66a is transmitted to the anode separation electrode layer 66 through the anode lead-out portion 66a.

Referring to FIG. 13, the well separation electrode layer 75 of the well separation structure 72 has a well lead-out portion 75a led out from the well separation trench 73 onto the first main surface 3. More specifically, the well lead-out portion 75a is led out from the well separation trench 73 onto the main surface insulating layer 79. The well lead-out portion 75a is led out along the second direction Y.

The well lead-out portion 75a is electrically connected to the emitter terminal electrode 13. An emitter signal applied to the well lead-out portion 75a is transmitted to the well separation electrode layer 75 through the well lead-out portion 75a.

Referring to FIG. 7 to FIG. 10, the semiconductor device 1 includes an interlayer insulating layer 80 formed on the first main surface 3. More specifically, the interlayer insulating layer 80 is formed on the main surface insulating layer 79. The interlayer insulating layer 80 is formed in a film shape along the first main surface 3. The interlayer insulating layer 80 selectively covers the first main surface 3. More specifically, the interlayer insulating layer 80 selectively covers the IGBT region 8, the diode region 9, and the boundary region 10.

The interlayer insulating layer 80 may include silicon oxide or silicon nitride. The interlayer insulating layer 80 may include PSG (Phosphor Silicate Glass) and/or BPSG (Boron Phosphor Silicate Glass) that are/is an example of silicon oxide.

In this embodiment, the interlayer insulating layer 80 has a laminated structure including a first interlayer insulating layer 81 and a second interlayer insulating layer 82 that are laminated together in this order from the first main surface 3 side. The first interlayer insulating layer 81 may include PSG or BPSG. The second interlayer insulating layer 82 includes an insulating material differing from that of the first interlayer insulating layer 81. The second interlayer insulating layer 82 may include PSG or BPSG.

Referring to FIG. 8 to FIG. 10, the interlayer insulating layer 80 includes an emitter opening 83, an anode opening 84, and a well opening 85. Also, referring to FIG. 11 to FIG. 13, the interlayer insulating layer 80 includes a first opening 86, a second opening 87, and a third opening 88.

Referring to FIG. 8, the emitter opening 83 exposes the emitter trench 48. In this embodiment, the emitter trench 48 passes through the first interlayer insulating layer 81 and the main surface insulating layer 79, and is formed in the first main surface 3. The emitter opening 83 passes through the second interlayer insulating layer 82, and leads to the emitter trench 48. The emitter opening 83 has an opening width that exceeds the opening width of the emitter trench 48. The opening edge portion of the emitter opening 83 is formed in a curved shape toward the inward side of the interlayer insulating layer 80.

Referring to FIG. 9, the anode opening 84 exposes the diode region 9. More specifically, the anode opening 84 passes through the interlayer insulating layer 80 and the main surface insulating layer 79, and exposes the anode separation structure 63 and the anode region 62.

The anode opening 84 also exposes the second proximal well region 71B. In this embodiment, the anode opening 84 exposes a part of the second proximal well region 71B. A part of an inner wall of the anode opening 84 is positioned directly on the second proximal well region 71B.

The anode opening 84 is formed such that its opening width narrows from its opening side toward its bottom wall side. More specifically, the anode opening 84 has a wide portion and a narrow portion. The wide portion of the anode opening 84 is formed in the second interlayer insulating layer 82. The narrow portion of the anode opening 84 has an opening width smaller than the wide portion. The narrow portion of the anode opening 84 is formed in the first interlayer insulating layer 81.

Referring to FIG. 10, the well opening 85 exposes the well region 71. In this embodiment, a plurality of the well openings 85 are formed in the interlayer insulating layer 80. The plurality of well openings 85 expose the plurality of well regions 71 in a one-on-one relationship.

More specifically, each of the well openings 85 passes through the interlayer insulating layer 80 and the main surface insulating layer 79, and exposes the well region 71. Each of the well openings 85 is formed such that its opening width narrows from its opening side toward its bottom wall side. More specifically, each of the well openings 85 has a wide portion and a narrow portion. The wide portion of each of the well openings 85 is formed in the second interlayer insulating layer 82. The narrow portion of each of the well openings 85 has an opening width smaller than the wide portion. The narrow portion of each of the well openings 85 is formed in the first interlayer insulating layer 81.

Referring to FIG. 11 to FIG. 13, the first opening 86 exposes the separation lead-out portion 56a of the IGBT region 8. The first opening 86 is formed such that its opening width narrows from its opening side toward its bottom wall side. The second opening 87 exposes the anode lead-out portion 66a of the diode region 9. The second opening 87 is formed such that its opening width narrows from its opening side toward its bottom wall side. The third opening 88 exposes the well lead-out portion 75a of the boundary region 10. The third opening 88 is formed such that its opening width narrows from its opening side toward its bottom wall side.

Referring to FIG. 8 to FIG. 10, the semiconductor device 1 includes an emitter plug electrode 91 buried in the emitter trench 48. The emitter plug electrode 91 is electrically connected to the emitter region 46 and to the contact region 49 in the emitter trench 48.

In this embodiment, the emitter plug electrode 91 has a laminated structure including a barrier electrode layer 92 and a main electrode layer 93. The barrier electrode layer 92 is formed in a film shape along an inner wall of the emitter trench 48. The barrier electrode layer 92 defines a recessed space in the emitter trench 48.

The barrier electrode layer 92 may have a single layer structure including a titanium layer or a titanium nitride layer. The barrier electrode layer 92 may have a laminated structure including a titanium layer and a titanium nitride layer. In this case, the titanium nitride layer may be laminated on the titanium layer.

The main electrode layer 93 is embedded in the emitter trench 48 with the barrier electrode layer 92 between the main electrode layer 93 and the emitter trench 48. More specifically, the main electrode layer 93 is embedded in a recessed space defined by the barrier electrode layer 92 in the emitter trench 48. The main electrode layer 93 may include tungsten.

Referring to FIG. 11, the semiconductor device 1 includes a first plug electrode 94 buried in the first opening 86. The first plug electrode 94 is electrically connected to the separation lead-out portion 56a of the IGBT region 8 in the first opening 86.

The first plug electrode 94 has a structure corresponding to that of the emitter plug electrode 91. A description of the emitter plug electrode 91 is applied correspondingly to a description of the first plug electrode 94. In the first plug electrode 94, the same reference sign is given to a structural component corresponding to that of the emitter plug electrode 91, and a description of this structural component is omitted.

Referring to FIG. 12, the semiconductor device 1 includes a second plug electrode 95 buried in the second opening 87. The second plug electrode 95 is electrically connected to the anode lead-out portion 66a of the diode region 9 in the second opening 87.

The second plug electrode 95 has a structure corresponding to that of the emitter plug electrode 91. A description of the emitter plug electrode 91 is applied correspondingly to a description of the second plug electrode 95. In the second plug electrode 95, the same reference sign is given to a structural component corresponding to that of the emitter plug electrode 91, and a description of this structural component is omitted.

Referring to FIG. 13, the semiconductor device 1 includes a third plug electrode 96 buried in the third opening 88. The third plug electrode 96 is electrically connected to the well lead-out portion 75a of the boundary region 10 in the third opening 88.

The third plug electrode 96 has a structure corresponding to that of the emitter plug electrode 91. A description of the emitter plug electrode 91 is applied correspondingly to a description of the third plug electrode 96. In the third plug electrode 96, the same reference sign is given to a structural component corresponding to that of the emitter plug electrode 91, and a description of this structural component is omitted.

Referring to FIG. 7 to FIG. 13, the emitter terminal electrode 13 mentioned above is formed on the interlayer insulating layer 80. The emitter terminal electrode 13 may include at least one of aluminum, copper, an AlSiCu (aluminum silicon copper) alloy, an AlSi (aluminum silicon) alloy, and an AlCu (aluminum copper) alloy.

The emitter terminal electrode 13 may have a single layer structure made of any one of these conductive materials. The emitter terminal electrode 13 may have a laminated structure in which at least two of these conductive materials are laminated together in an arbitrary order. The emitter terminal electrode 13 enters the emitter opening 83, the anode opening 84, and the well opening 85 from above the interlayer insulating layer 80.

Referring to FIG. 8, the emitter terminal electrode 13 is electrically connected to the emitter region 46 and to the contact region 49 in the emitter opening 83. More specifically, the emitter terminal electrode 13 is electrically connected to the emitter plug electrode 91 in the emitter opening 83. The emitter terminal electrode 13 is electrically connected to the emitter region 46 and to the contact region 49 through the emitter plug electrode 91.

Referring to FIG. 9, the emitter terminal electrode 13 is electrically connected to the anode region 62 and to the anode separation electrode layer 66 in the anode opening 84. More specifically, the emitter terminal electrode 13 enters the recess 67 from above the first main surface 3 in the anode opening 84.

The emitter terminal electrode 13 is electrically connected to the anode separation electrode layer 66 in the recess 67. Also, the emitter terminal electrode 13 is electrically connected to the anode region 62 in the first main surface 3 and in the side wall of the recess 67. The emitter terminal electrode 13 forms an ohmic contact with the anode region 62.

Also, the emitter terminal electrode 13 is electrically connected to the second proximal well region 71B in the anode opening 84. The emitter terminal electrode 13 forms an ohmic contact with the second proximal well region 71B. In other words, the anode region 62, the anode separation electrode layer 66, and the second proximal well region 71B are each emitter-grounded. The emitter terminal electrode 13 functions as an anode terminal electrode in the diode region 9.

Referring to FIG. 8 and FIG. 10, the emitter terminal electrode 13 is electrically connected to the plurality of well regions 71 in the plurality of well openings 85. In other words, the plurality of well regions 71 are emitter-grounded.

On the other hand, the emitter terminal electrode 13 faces the floating region 52 across the interlayer insulating layer 80 in the IGBT region 8. The floating region 52 is insulated from the emitter terminal electrode 13. In other words, the floating region 52 differs from the well region 71 in the fact that the floating region 52 is formed in an electrically floating state. A region including a single or a plurality of the floating regions 52, which is/are brought closer to the diode region 9 in the IGBT region 8 and which is/are electrically connected to the emitter terminal electrode 13, can also be regarded as the boundary region 10.

Referring to FIG. 11 to FIG. 13, the emitter terminal electrode 13 is electrically connected to the first plug electrode 94, to the second plug electrode 95, and to the third plug electrode 96, respectively. Hence, the separation lead-out portion 56a, the well separation electrode layer 75, and the anode separation electrode layer 66 are each emitter-grounded. In other words, the region separation structure 50, the well separation structure 72, and the anode separation structure 63 are each emitter-grounded.

Preferably, a pad electrode including either one of or both of a nickel layer and a gold layer is formed on the emitter terminal electrode 13 if the emitter terminal electrode 13 is connected to a lead wire (for example, bonding wire). Preferably, a gold layer is formed on a nickel layer if a pad electrode includes the nickel layer and the gold layer.

The gate terminal electrode 14, the first sense terminal electrode 15, the second sense terminal electrode 16, the current detection terminal electrode 17, and the open terminal electrode 18 are also formed on the interlayer insulating layer 80 in the same way as the emitter terminal electrode 13, not shown in detail.

Each of the plurality of terminal electrodes 14 to 18 may include at least one of aluminum, copper, an AlSiCu (aluminum silicon copper) alloy, an AlSi (aluminum silicon) alloy, and an AlCu (aluminum copper) alloy.

Each of the plurality of terminal electrodes 14 to 18 may have a single layer structure made of any one of these conductive materials. Each of the plurality of terminal electrodes 14 to 18 may have a laminated structure in which at least two of these conductive materials are laminated together in an arbitrary order.

Preferably, a pad electrode including either one of or both of a nickel layer and a gold layer is formed on the plurality of terminal electrodes 14 to 18 if the plurality of terminal electrodes 14 to 18 are connected by a lead wire (for example, bonding wire). Preferably, a gold layer is formed on a nickel layer if a pad electrode includes the nickel layer and the gold layer.

Figure 14:
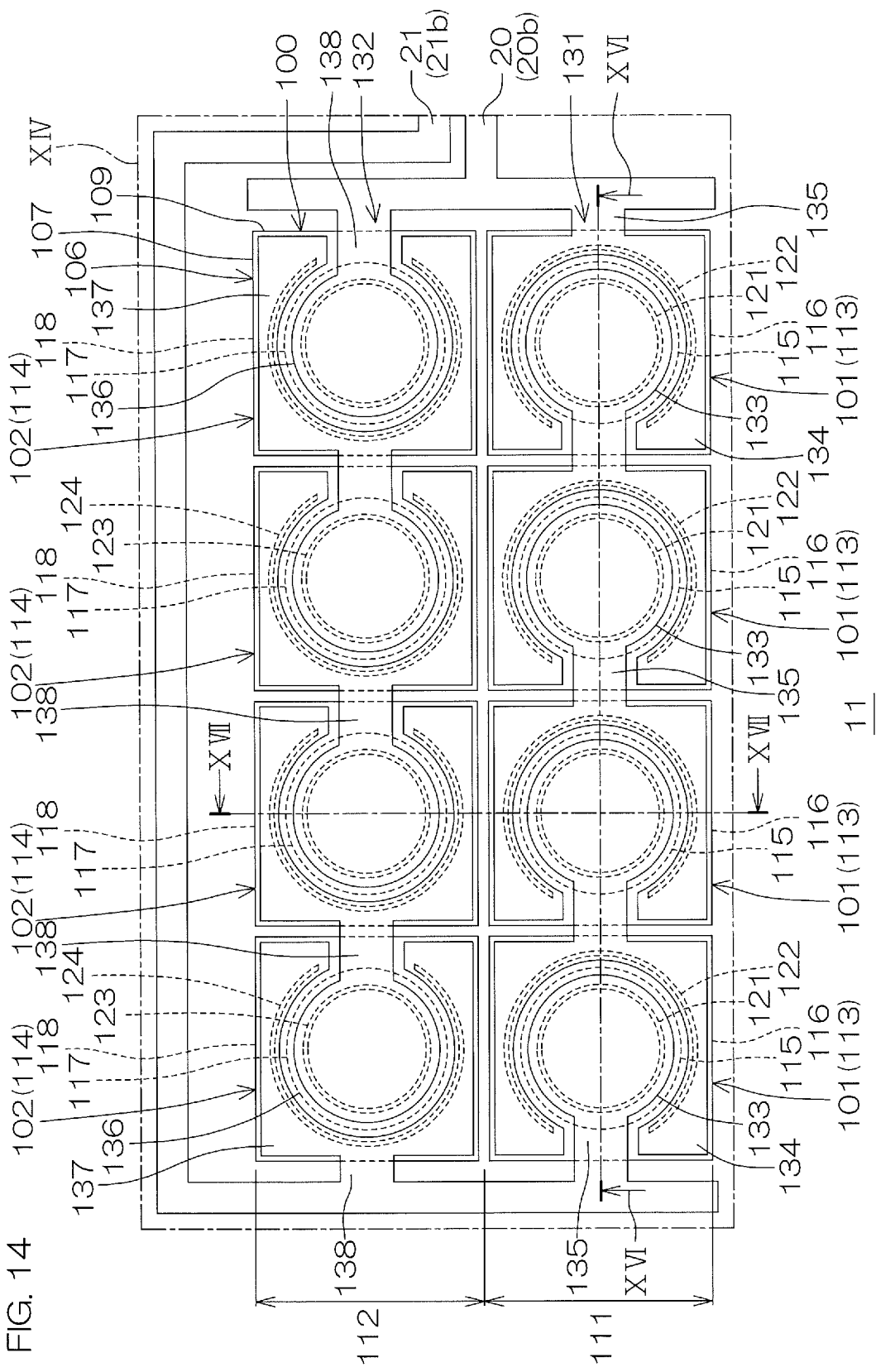
FIG. 14 is an enlarged view of region XIV shown in FIG. 1.
Figure 15:
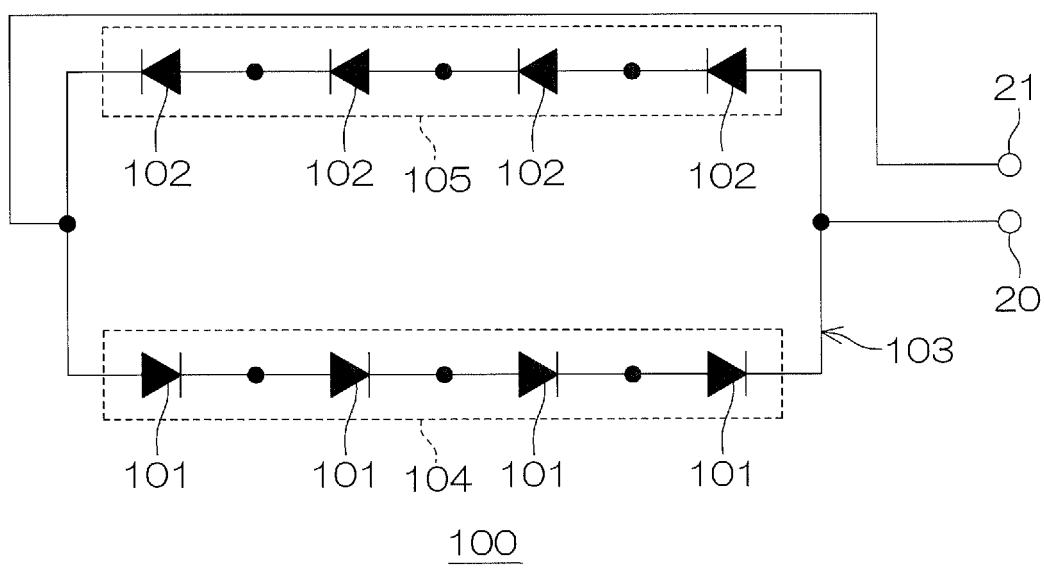
FIG. 15 is a circuit diagram showing an electrical configuration of a region shown in FIG. 14.
Figure 16:
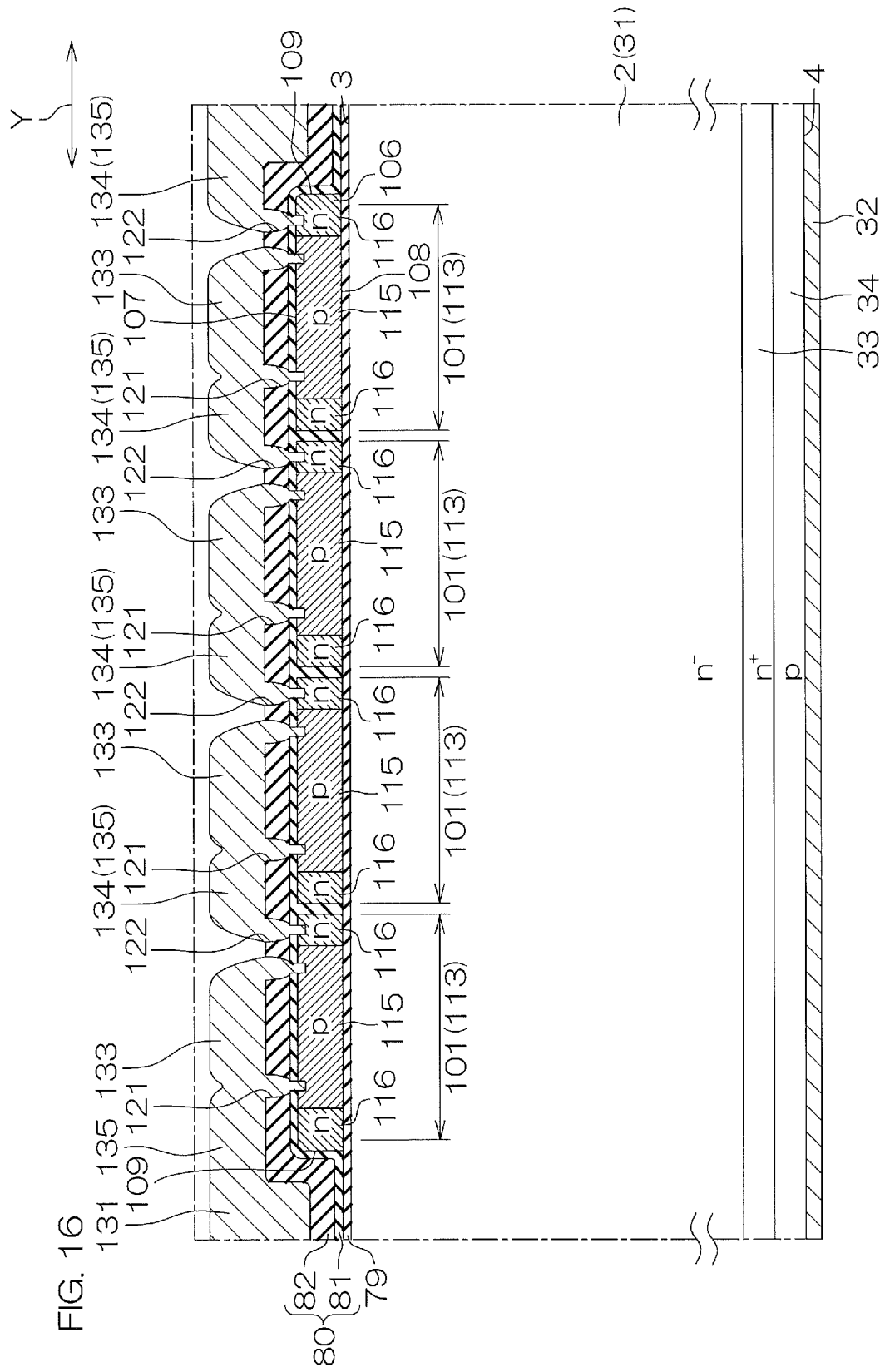
FIG. 16 is a cross-sectional view along line XVI-XVI shown in FIG. 14.
Figure 17:
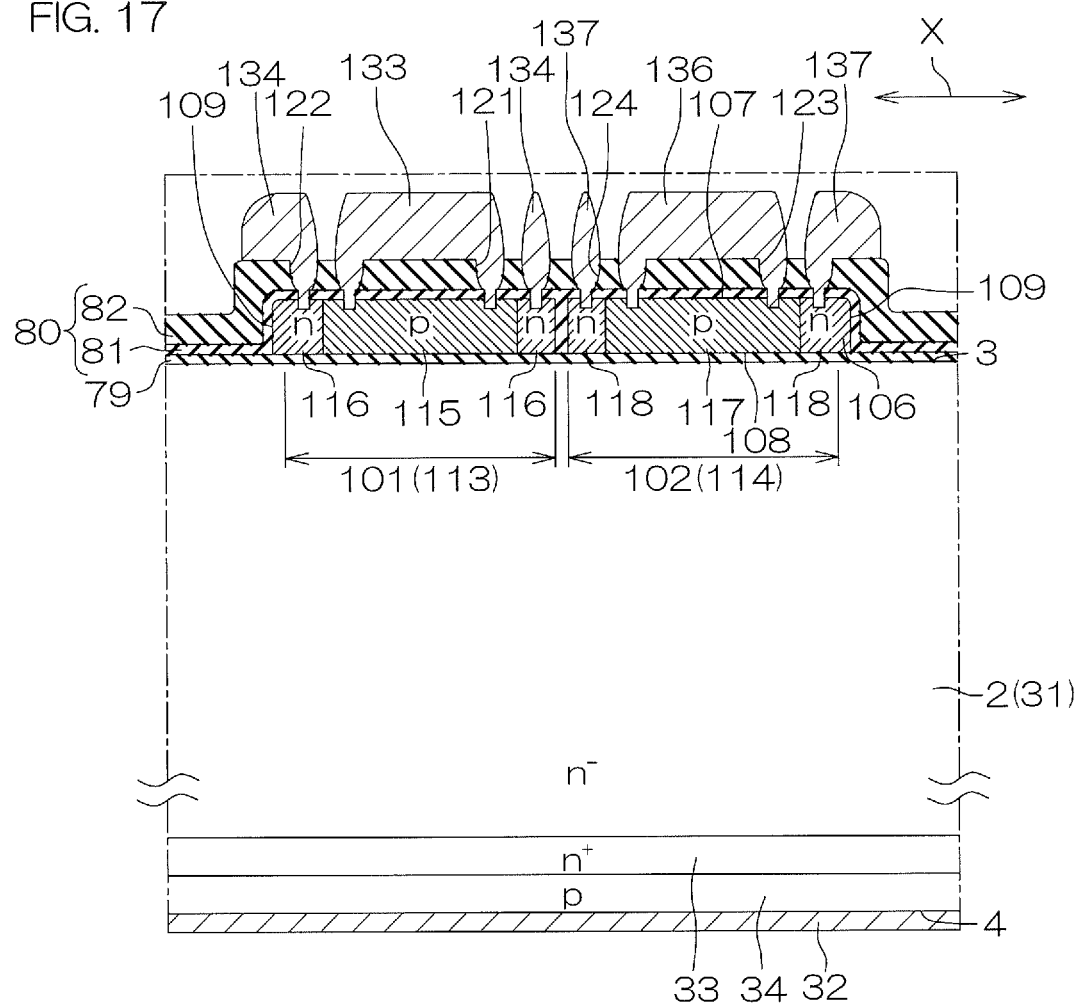
FIG. 17 is a cross-sectional view along line XVII-XVII shown in FIG. 14.

FIG. 14 is an enlarged view of region XIV shown in FIG. 1. FIG. 15 is a circuit diagram showing an electrical configuration of a region shown in FIG. 14. FIG. 16 is a cross-sectional view along line XVI-XVI shown in FIG. 14. FIG. 17 is a cross-sectional view along line XVII-XVII shown in FIG. 14.

Referring to FIG. 14 and FIG. 15, the semiconductor device 1 includes a temperature-sensitive diode sensor 100 that is an example of the temperature-sensitive device formed in the sensor region 11. The temperature-sensitive diode sensor 100 has a parallel circuit 103 including a first diode 101 and a second diode 102. A cathode of the first diode 101 is connected to an anode of the second diode 102. An anode of the first diode 101 is connected to a cathode of the second diode 102.

More specifically, the parallel circuit 103 has a form in which a first series circuit 104 including a plurality (in this embodiment, four) of the first diodes 101 that are connected in series in the forward direction and a second series circuit 105 including a plurality (in this embodiment, four) of the second diodes 102 that are connected in series in the forward direction are connected in parallel in the reverse direction.

Referring to FIG. 16 and FIG. 17, the temperature-sensitive diode sensor 100 includes a polysilicon layer 106 formed on the first main surface 3. The temperature-sensitive diode sensor 100 is formed by selectively introducing n-type impurities and p-type impurities into the polysilicon layer 106. The polysilicon layer 106 may be impurity-free.

More specifically, the polysilicon layer 106 is formed on the main surface insulating layer 79. The polysilicon layer 106 has a first surface 107 on one side, a second surface 108 on the other side, and a side surface 109 by which the first surface 107 and the second surface 108 are connected together. The first surface 107 and the second surface 108 are each formed in a quadrangular shape (in this embodiment, rectangular shape) in plan view. The second surface 108 of the polysilicon layer 106 is connected to the main surface insulating layer 79. The polysilicon layer 106 is electrically insulated from the semiconductor layer 2 by the main surface insulating layer 79.

The thickness of the polysilicon layer 106 may be not less than 0.2 µm and not more than 1 µm. The thickness of the polysilicon layer 106 may be not less than 0.2 µm and not more than 0.4 µm, not less than 0.4 µm and not more than 0.6 µm, not less than 0.6 µm and not more than 0.8 µm, or not less than 0.8 µm and not more than 1 µm.

The temperature-sensitive diode sensor 100 includes a first circuit region 111 and a second circuit region 112 formed in the polysilicon layer 106. The first circuit region 111 and the second circuit region 112 are formed with an interval between the first and second circuit regions 111 and 112 in a lateral direction of the polysilicon layer 106.

In this embodiment, the first circuit region 111 includes a plurality (in this embodiment, four) of first diode regions 113. The first diode region 113 is a region in which the first diode 101 is formed. The plurality of first diode regions 113 are formed with intervals between the first diode regions 113 in a longitudinal direction (in this embodiment, the first direction X) of the polysilicon layer 106.

In this embodiment, each of the first diode regions 113 is formed in a quadrangular shape in plan view. Each of the first diode regions 113 is divided from other regions in a cell shape by a slit formed in the polysilicon layer 106. Each of the first diode regions 113 may be divided from other regions in a cell shape by an impurity-free region of the polysilicon layer 106.

In this embodiment, the second circuit region 112 includes a plurality (in this embodiment, four) of second diode regions 114. The second diode region 114 is a region in which the second diode 102 is formed. The plurality of second diode regions 114 are formed with intervals between the second diode regions 114 in the longitudinal direction (in this embodiment, the first direction X) of the polysilicon layer 106.

In this embodiment, each of the second diode regions 114 is formed in a quadrangular shape in plan view. Each of the second diode regions 114 is divided from other regions in a cell shape by the slit formed in the polysilicon layer 106. Each of the second diode regions 114 may be divided from other regions in a cell shape by the impurity-free region of the polysilicon layer 106.

Each of the first diode regions 113 includes a p-type first anode region 115 and an n-type first cathode region 116. The first anode region 115 is formed in a central portion of the first diode region 113. In this embodiment, the first anode region 115 is exposed from the first surface 107 and the second surface 108 of the polysilicon layer 106.

The first anode region 115 is formed circularly in plan view. The planar shape of the first anode region 115 is arbitrary. The first anode region 115 may be formed in a polygonal shape, such as a triangular shape, a quadrangular shape, or a hexagonal shape, or in an elliptical shape in plan view.

The first cathode region 116 is formed along a circumferential edge of the first anode region 115. In this embodiment, the first cathode region 116 is formed in an annular shape surrounding the first cathode region 116 in plan view. In this embodiment, the first cathode region 116 is exposed from the first surface 107 and the second surface 108 of the polysilicon layer 106.

The first cathode region 116 is electrically connected to the first anode region 115. The first cathode region 116 is electrically connected to the first anode region 115 over the whole region in the thickness direction of the polysilicon layer 106. The first cathode region 116 forms a pn junction portion with the first anode region 115. Hence, each of the first diode regions 113 includes the single first diode 101 in which the first anode region 115 serves as an anode and in which the first cathode region 116 serves as a cathode.

Each of the second diode regions 114 includes a p-type second anode region 117 and an n-type second cathode region 118. The second anode region 117 is formed in a central portion of the second diode region 114. In this embodiment, the second anode region 117 is exposed from the first surface 107 and the second surface 108 of the polysilicon layer 106.

The second anode region 117 is formed circularly in plan view. The planar shape of the second anode region 117 is arbitrary. The second anode region 117 may be formed in a polygonal shape, such as a triangular shape, a quadrangular shape, or a hexagonal shape, or in an elliptical shape in plan view.

The second cathode region 118 is formed along a circumferential edge of the second anode region 117. In this embodiment, the second cathode region 118 is formed in an annular shape surrounding the second cathode region 118 in plan view. In this embodiment, the second cathode region 118 is exposed from the first surface 107 and the second surface 108 of the polysilicon layer 106.

The second cathode region 118 is electrically connected to the second anode region 117. The second cathode region 118 is electrically connected to the second anode region 117 over a whole region in the thickness direction of the polysilicon layer 106. The second cathode region 118 forms a pn junction portion with the second anode region 117. Hence, each of the second diode regions 114 includes the single second diode 102 in which the second anode region 117 serves as an anode and in which the second cathode region 118 serves as a cathode.

Referring to FIG. 16 and FIG. 17, the interlayer insulating layer 80 mentioned above covers the polysilicon layer 106. Apart that covers each of the first diode regions 113 in the interlayer insulating layer 80 includes a first anode opening 121 and a first cathode opening 122. Also, apart that covers each of the second diode regions 114 in the interlayer insulating layer 80 includes a second anode opening 123 and a second cathode opening 124.

In this embodiment, the first anode opening 121 is formed in each of the first diode regions 113 one by one. The number of the first anode openings 121 is arbitrary. Therefore, a plurality of the first anode openings 121 may be formed in each of the first diode regions 113 with intervals between the first anode openings 113.

The first anode opening 121 exposes the first anode region 115. The first anode opening 121 is formed by passing through the interlayer insulating layer 80 and digging a surface layer portion of the polysilicon layer 106 down. A bottom portion of the first anode opening 121 is positioned in the first anode region 115.

The first anode opening 121 extends in a belt shape along a circumferential edge of the first anode region 115 in plan view. More specifically, the first anode opening 121 is formed in an annular shape in plan view. The planar shape of the first anode opening 121 is arbitrary. The first anode opening 121 may be formed in a polygonal ring shape, such as a triangular ring shape, a quadrangular ring shape, or a hexagonal ring shape, or in an elliptical ring shape in plan view. The first anode opening 121 may be formed in a polygonal shape, such as a triangular shape, a quadrangular shape, or a hexagonal shape, or in a circular shape, or in an elliptical shape in plan view.

In this embodiment, the first cathode opening 122 is formed in each of the first diode regions 113 one by one. The number of the first cathode openings 122 is arbitrary. Therefore, a plurality of the first cathode openings 122 may be formed in each of the first diode regions 113 with intervals between the first cathode openings 113.

The first cathode opening 122 exposes the first cathode region 116. The first cathode opening 122 is formed by passing through the interlayer insulating layer 80 and digging the surface layer portion of the polysilicon layer 106 down. A bottom portion of the first cathode opening 122 is positioned in the first cathode region 116.

The first cathode opening 122 extends in a belt shape along the circumferential edge of the first anode region 115 in plan view. The first cathode opening 122 is formed in the shape of the letter C in plan view. The planar shape of the first cathode opening 122 is arbitrary. The first cathode opening 122 may be formed in a polygonal shape, such as a triangular shape, a quadrangular shape, or a hexagonal shape, or in an elliptical shape in plan view.

In this embodiment, the second anode opening 123 is formed in each of the second diode regions 114 one by one. The number of the second anode openings 123 is arbitrary. Therefore, a plurality of the second anode openings 123 may be formed in each of the second diode regions 114 with intervals between the second anode openings 123.

The second anode opening 123 exposes the second anode region 117. The second anode opening 123 is formed by passing through the interlayer insulating layer 80 and digging the surface layer portion of the polysilicon layer 106 down. A bottom portion of the second anode opening 123 is positioned in the second anode region 117.

The second anode opening 123 extends in a belt shape along a circumferential edge of the second anode region 117 in plan view. More specifically, the second anode opening 123 is formed in an annular shape in plan view. The planar shape of the second anode opening 123 is arbitrary. The second anode opening 123 may be formed in a polygonal ring shape, such as a triangular ring shape, a quadrangular ring shape, or a hexagonal ring shape, or in an elliptical ring shape in plan view. The second anode opening 123 may be formed in a polygonal shape, such as a triangular shape, a quadrangular shape, or a hexagonal shape, or in a circular shape, or in an elliptical shape in plan view.

In this embodiment, the second cathode opening 124 is formed in each of the second diode regions 114 one by one. The number of the second cathode openings 124 is arbitrary. Therefore, a plurality of the second cathode openings 124 may be formed in each of the second diode regions 114 with intervals between the second cathode openings 124.

The second cathode opening 124 exposes the second cathode region 118. The second cathode opening 124 is formed by passing through the interlayer insulating layer 80 and digging the surface layer portion of the polysilicon layer 106 down. A bottom portion of the second cathode opening 124 is positioned in the second cathode region 118.

The second cathode opening 124 extends in a belt shape along the circumferential edge of the second anode region 117 in plan view. The second cathode opening 124 is formed in the shape of the letter C in plan view. The planar shape of the second cathode opening 124 is arbitrary. The second cathode opening 124 may be formed in a polygonal shape, such as a triangular shape, a quadrangular shape, or a hexagonal shape, or in a circular shape, or in an elliptical shape in plan view.

The temperature-sensitive diode sensor 100 includes a first diode wiring 131 formed on a part that covers the first circuit region 111 in the interlayer insulating layer 80. The first diode wiring 131 connects the plurality of first diodes 101 together in series in the forward direction between the first sense wiring 20 and the second sense wiring 21. The first diode wiring 131 has one end portion connected to the first sense wiring 20 and the other end portion connected to the second sense wiring 21.

More specifically, the first diode wiring 131 includes a plurality of first anode electrodes 133, a plurality of first cathode electrodes 134, and a plurality of first connection electrodes 135. Each of the first anode electrodes 133 is formed on a part that covers the first diode region 113 corresponding thereto in the interlayer insulating layer 80.

Each of the first anode electrodes 133 is formed in a circular shape in plan view. The planar shape of each of the first anode electrodes 133 is arbitrary. Each of the first anode electrodes 133 may be formed in a polygonal shape, such as a triangular shape, a quadrangular shape, or a hexagonal shape, or in an elliptical shape in plan view.

Each of the first anode electrodes 133 enters the first anode opening 121 corresponding thereto from above the interlayer insulating layer 80. Each of the first anode electrodes 133 is electrically connected to the first anode region 115 in the first anode opening 121 corresponding thereto.

Each of the first cathode electrodes 134 is formed on a part that covers the first diode region 113 corresponding thereto in the interlayer insulating layer 80. Each of the first cathode electrodes 134 extends in a belt shape along the first anode electrode 133 corresponding thereto in plan view.

In this embodiment, each of the first cathode electrodes 134 is formed in the shape of the letter C in plan view. The planar shape of each of the first cathode electrodes 134 is arbitrary. The first cathode electrode 134 may be formed in a polygonal shape, such as a triangular shape, a quadrangular shape, or a hexagonal shape, or in a circular shape, or in an elliptical shape in plan view.

Each of the first cathode electrodes 134 enters the first cathode opening 122 corresponding thereto from above the interlayer insulating layer 80. Each of the first cathode electrodes 134 is electrically connected to the first cathode region 116 in the first cathode opening 122 corresponding thereto.

Each of the first connection electrodes 135 is formed on a part that covers a region between mutually adjoining ones of the plurality of first diode regions 113 adjoining in the interlayer insulating layer 80. Each of the first connection electrodes 135 connects the first anode electrode 133 and the first cathode electrode 134 together both of which correspond to the first connection electrode 135. In other words, each of the first connection electrodes 135 is led out from the first cathode electrode 134 of the first diode region 113 located on one side, and is connected to the first anode electrode 133 of the first diode region 113 located on the other side.

In this embodiment, each of the first connection electrodes 135 is formed in a belt shape extending along the longitudinal direction (in this embodiment, the first direction X) of the polysilicon layer 106 in plan view. Each of the first connection electrodes 135 may be linearly drawn around in a region between mutually adjoining ones of the plurality of first diode regions 113 that adjoin each other.

The single first connection electrode 135 positioned on the one-end-portion side in the longitudinal direction of the polysilicon layer 106 is connected to the second sense wiring 21. The single first connection electrode 135 positioned on the other-end-portion side in the longitudinal direction of the polysilicon layer 106 is connected to the first sense wiring 20.

Hence, the first series circuit 104 including a plurality (in this embodiment, four) of the first diodes 101 that are connected to the first sense wiring 20 in series in the forward direction is formed in a region between the first sense wiring 20 and the second sense wiring 21.

The first diode wiring 131 may include at least one of aluminum, copper, an AlSiCu (aluminum silicon copper) alloy, an AlSi (aluminum silicon) alloy, and an AlCu (aluminum copper) alloy.

The temperature-sensitive diode sensor 100 includes a second diode wiring 132 formed on a part that covers the second circuit region 112 in the interlayer insulating layer 80. The second diode wiring 132 connects the plurality of second diodes 102 together in series in the forward direction between the first sense wiring 20 and the second sense wiring 21. The second diode wiring 132 has one end portion connected to the first sense wiring 20 and the other end portion connected to the second sense wiring 21.

More specifically, the second diode wiring 132 includes a plurality of second anode electrodes 136, a plurality of second cathode electrodes 137, and a plurality of second connection electrodes 138. Each of the second anode electrodes 136 is formed on a part that covers the second diode region 114 corresponding thereto in the interlayer insulating layer 80.

Each of the second anode electrodes 136 is formed in a circular shape in plan view. The planar shape of the second anode electrode 136 is arbitrary. Each of the second anode electrodes 136 may be formed in a polygonal shape, such as a triangular shape, a quadrangular shape, or a hexagonal shape, or in an elliptical shape in plan view.

Each of the second anode electrodes 136 enters the second anode opening 123 corresponding thereto from above the interlayer insulating layer 80. Each of the second anode electrodes 136 is electrically connected to the second anode region 117 in the second anode opening 123 corresponding thereto.

Each of the second cathode electrodes 137 is formed on a part that covers the second diode region 114 corresponding thereto in the interlayer insulating layer 80. Each of the second cathode electrodes 137 extends in a belt shape along the second anode electrode 136 in plan view.

In this embodiment, each of the second cathode electrodes 137 is formed in the shape of the letter C in plan view. The planar shape of each of the second cathode electrodes 137 is arbitrary. Each of the second cathode electrodes 137 may be formed in a polygonal shape, such as a triangular shape, a quadrangular shape, or a hexagonal shape, or in a circular shape, or in an elliptical shape in plan view.

Each of the second cathode electrodes 137 enters the second cathode opening 124 corresponding thereto from above the interlayer insulating layer 80. Each of the second cathode electrodes 137 is electrically connected to the second cathode region 118 in the second cathode opening 124 corresponding thereto.

Each of the second connection electrodes 138 is formed on apart that covers a region between mutually adjoining ones of the plurality of second diode regions 114 adjoining in the interlayer insulating layer 80. Each of the second connection electrodes 138 connects the second anode electrode 136 and the second cathode electrode 137 together both of which correspond to the second connection electrode 138. In other words, each of the second connection electrodes 138 is led out from the second cathode electrode 137 of the second diode region 114 located on one side, and is connected to the second anode electrode 136 of the second diode region 114 located on the other side.

In this embodiment, each of the second connection electrodes 138 is formed in a belt shape extending along the longitudinal direction (in this embodiment, the first direction X) of the polysilicon layer 106 in plan view. Each of the second connection electrodes 138 may be linearly drawn around in a region between mutually adjoining ones of the plurality of second diode regions 114 that adjoin each other.

The single second connection electrode 138 positioned on the one-end-portion side in the longitudinal direction of the polysilicon layer 106 is connected to the second sense wiring 21. The single second connection electrode 138 positioned on the other-end-portion side in the longitudinal direction of the polysilicon layer 106 is connected to the first sense wiring 20.

Hence, the second series circuit 105 including a plurality (in this embodiment, four) of the second diodes 102 that are connected to the second sense wiring 21 in series in the forward direction is formed in a region between the first sense wiring 20 and the second sense wiring 21.

The second diode wiring 132 may include at least one of aluminum, copper, an AlSiCu (aluminum silicon copper) alloy, an AlSi (aluminum silicon) alloy, and an AlCu (aluminum copper) alloy.

Figure 18:
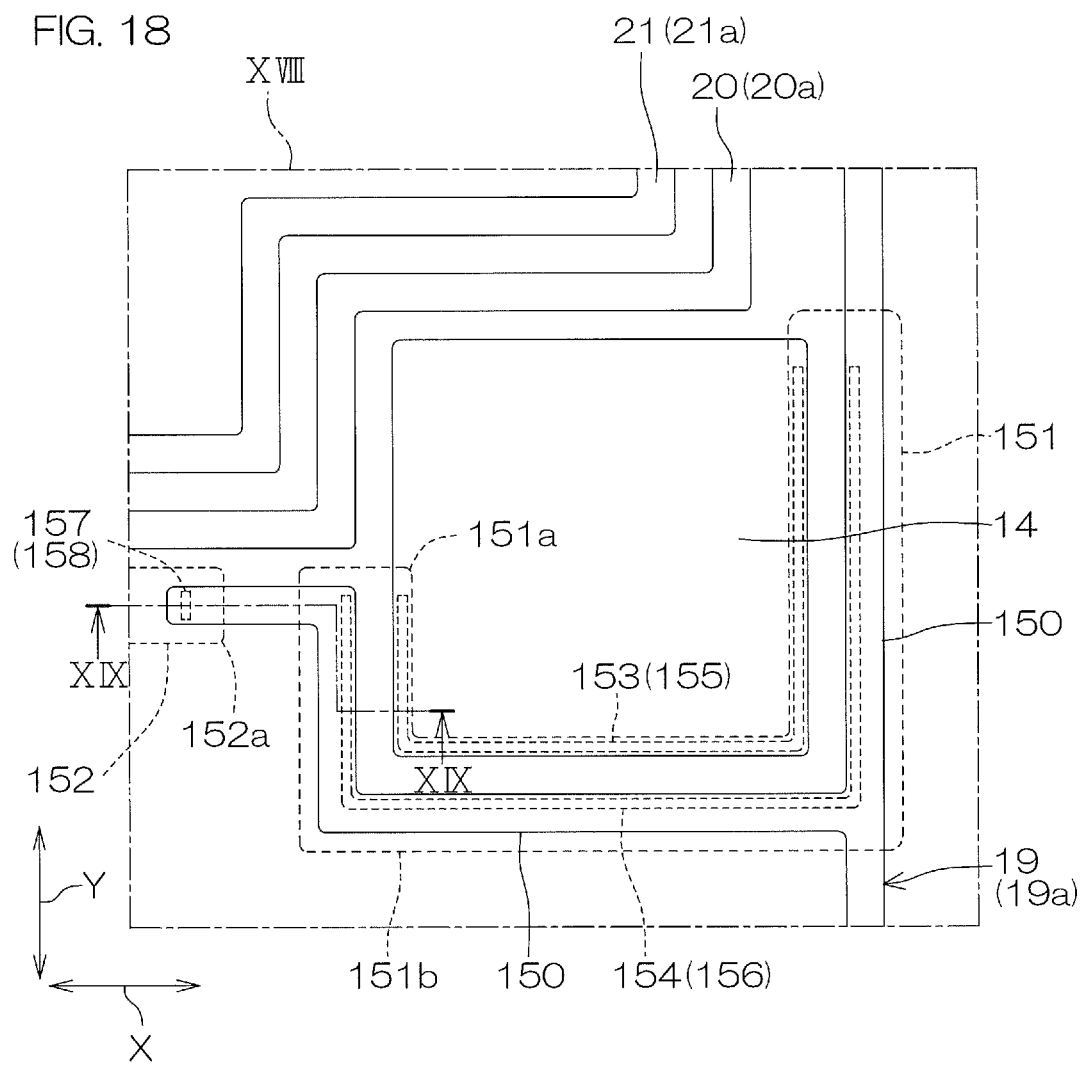
FIG. 18 is an enlarged view of region XVIII shown in FIG. 1.
Figure 19:
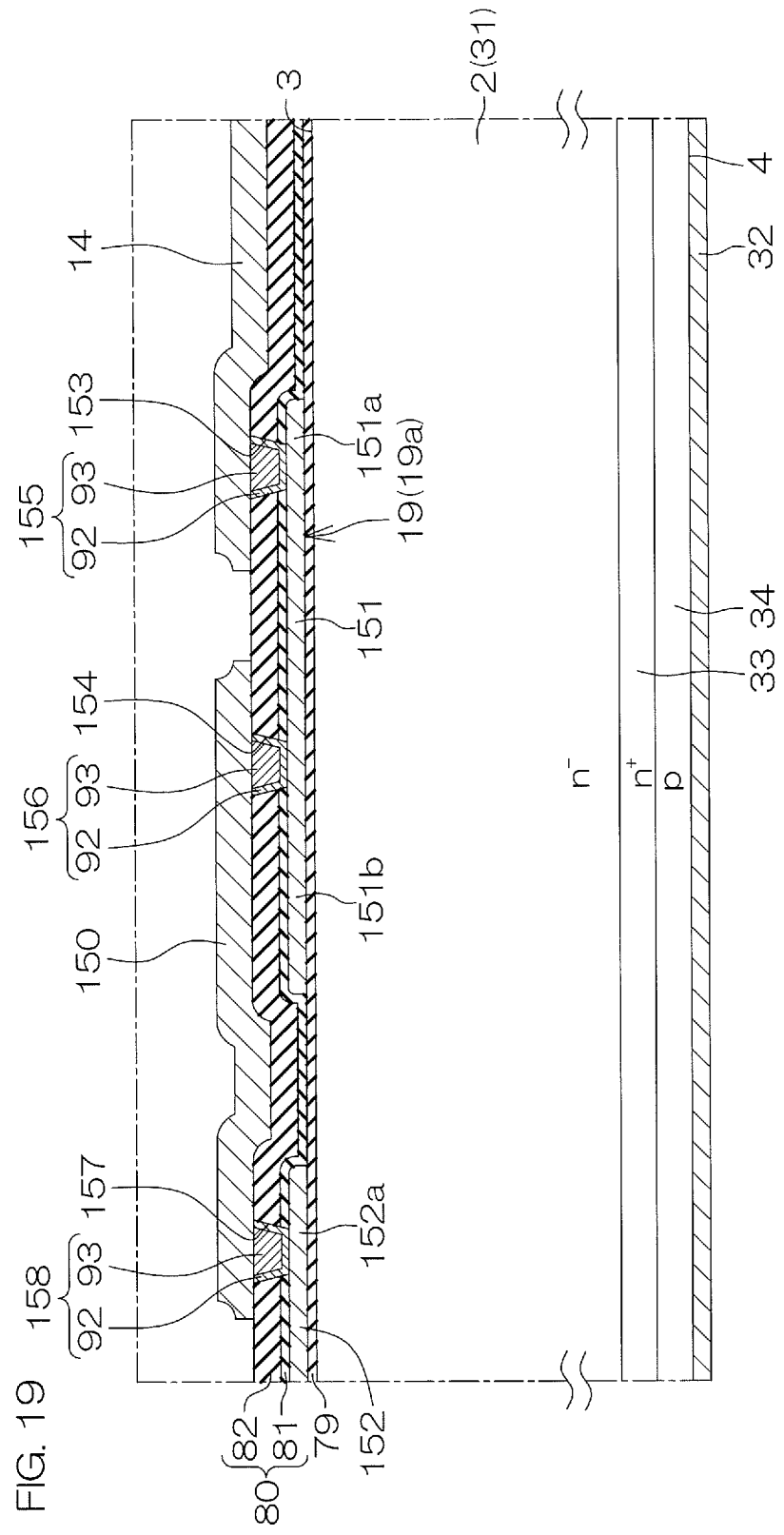
FIG. 19 is a cross-sectional view along line XIX-XIX shown in FIG. 18.

FIG. 18 is an enlarged view of region XVIII shown in FIG. 1. FIG. 19 is a cross-sectional view along line XIX-XIX shown in FIG. 18.

Referring to FIG. 18 and FIG. 19, in this embodiment, the gate wiring 19 includes a low-resistance wiring portion 150, a first high-resistance wiring portion 151, and a second high-resistance wiring portion 152.

The low-resistance wiring portion 150 has a relatively low resistance value, and forms a main current path for the gate wiring 19. The low-resistance wiring portion 150 is formed on the first main surface 3 (the interlayer insulating layer 80) away from the gate terminal electrode 14. The low-resistance wiring portion 150 is formed along the perimeter of the gate terminal electrode 14, and is selectively drawn around on the first main surface 3 (the interlayer insulating layer 80).

The low-resistance wiring portion 150 may include at least one of aluminum, copper, an AlSiCu (aluminum silicon copper) alloy, an AlSi (aluminum silicon) alloy, and an AlCu (aluminum copper) alloy. The low-resistance wiring portion 150 may be made of the same metallic material as the gate terminal electrode 14.

The first high-resistance wiring portion 151 has a resistance value that exceeds the resistance value of the low-resistance wiring portion 150. The first high-resistance wiring portion 151 may include conductive polysilicon. The first high-resistance wiring portion 151 is interposed between the gate terminal electrode 14 and the low-resistance wiring portion 150, and is electrically connected to the gate terminal electrode 14 and to the low-resistance wiring portion 150. A gate signal input into the gate terminal electrode 14 is transmitted to the low-resistance wiring portion 150 through the first high-resistance wiring portion 151.

More specifically, the first high-resistance wiring portion 151 is formed in a region below both the gate terminal electrode 14 and the low-resistance wiring portion 150. The first high-resistance wiring portion 151 is formed in a region between the first main surface 3 and the interlayer insulating layer 80. The first high-resistance wiring portion 151 is formed on the main surface insulating layer 79.

The first high-resistance wiring portion 151 includes a first lead-out portion 151a and a second lead-out portion 151b. The first lead-out portion 151a is led out to a region directly under the gate terminal electrode 14 from above the main surface insulating layer 79. The second lead-out portion 151b is led out to a region directly under the low-resistance wiring portion 150 from above the main surface insulating layer 79.

A region that covers the first high-resistance wiring portion 151 in the interlayer insulating layer 80 includes a first opening 153 and a second opening 154. The first opening 153 exposes the first lead-out portion 151a of the first high-resistance wiring portion 151. The second opening 154 exposes the second lead-out portion 151b of the second high-resistance wiring portion 152.

A first plug electrode 155 is embedded in the first opening 153. The first lead-out portion 151a is electrically connected to the gate terminal electrode 14 through the first plug electrode 155. A description of the emitter plug electrode 91 is applied correspondingly to a description of the first plug electrode 155. In the first plug electrode 155, the same reference sign is given to a structural component corresponding to that of the emitter plug electrode 91, and a description of this structural component is omitted.

A second plug electrode 156 is embedded in the second opening 154. The second lead-out portion 151b is electrically connected to the low-resistance wiring portion 150 through the second plug electrode 156. A description of the emitter plug electrode 91 is applied correspondingly to a description of the second plug electrode 156. In the second plug electrode 156, the same reference sign is given to a structural component corresponding to that of the emitter plug electrode 91, and a description of this structural component is omitted.

The second high-resistance wiring portion 152 has a resistance value that exceeds the resistance value of the low-resistance wiring portion 150. The second high-resistance wiring portion 152 may include conductive polysilicon. The second high-resistance wiring portion 152 is interposed in a region between the gate lead-out portion 41a and the low-resistance wiring portion 150, and is electrically connected to the gate lead-out portion 41a and to the low-resistance wiring portion 150. A gate signal transmitted to the low-resistance wiring portion 150 is transmitted to the gate lead-out portion 41a through the second high-resistance wiring portion 152.

More specifically, the second high-resistance wiring portion 152 is formed in a region below the low-resistance wiring portion 150. The second high-resistance wiring portion 152 is formed in the same layer as the gate lead-out portion 41a. The second high-resistance wiring portion 152 is formed in a region between the first main surface 3 and the interlayer insulating layer 80. The second high-resistance wiring portion 152 is formed on the main surface insulating layer 79.

The second high-resistance wiring portion 152 has a lead-out portion 152a led out to a region directly under the low-resistance wiring portion 150 from above the main surface insulating layer 79. Also, the second high-resistance wiring portion 152 has a connection portion continuous with the gate lead-out portion 41a in a region not shown.

A region that covers the second high-resistance wiring portion 152 in the interlayer insulating layer 80 includes a third opening 157. The third opening 157 exposes the lead-out portion 152a of the second high-resistance wiring portion 152.

A third plug electrode 158 is embedded in the third opening 157. The lead-out portion 152a is electrically connected to the low-resistance wiring portion 150 through the third plug electrode 158. A description of the emitter plug electrode 91 is applied correspondingly to a description of the third plug electrode 158. In the third plug electrode 158, the same reference sign is given to a structural component corresponding to that of the emitter plug electrode 91, and a description of this structural component is omitted.

It is possible to make the wiring resistance smaller in proportion to a decrease in distance between the low-resistance wiring portion 150 and the gate lead-out portion 41a. The connection position between the lead-out portion 152a and the low-resistance wiring portion 150 is arbitrary, and yet it is preferable to set the connection position therebetween in consideration of the wiring resistance between the low-resistance wiring portion 150 and the gate lead-out portion 41a.

As thus described, the gate wiring 19 includes the first high-resistance wiring portion 151 interposed between the low-resistance wiring portion 150 and the gate terminal electrode 14. A gate signal input into the gate terminal electrode 14 is transmitted to the gate lead-out portion 41a through the first high-resistance wiring portion 151, the low-resistance wiring portion 150, and the second high-resistance wiring portion 152. The gate signal transmitted to the gate lead-out portion 41a is transmitted to the gate electrode 41.

The first high-resistance wiring portion 151 prevents a rush current from flowing into the low-resistance wiring portion 150 from the gate terminal electrode 14. On the other hand, the low-resistance wiring portion 150 transmits a gate signal to the FET structure 35 while restraining the voltage drop of the gate signal. This makes it possible to prevent the FET structure 35 from malfunctioning because of a rush current. Also, it is also possible to reduce a switching noise because the malfunction of the FET structure 35 can be prevented.

On the other hand, the second high-resistance wiring portion 152 prevents a rush current from flowing into the gate lead-out portion 41a from the low-resistance wiring portion 150. This makes it possible to appropriately prevent the FET structure 35 from malfunctioning because of a rush current. Also, it is possible to appropriately reduce a switching noise because the malfunction of the FET structure 35 can be appropriately prevented.

Figure 20:
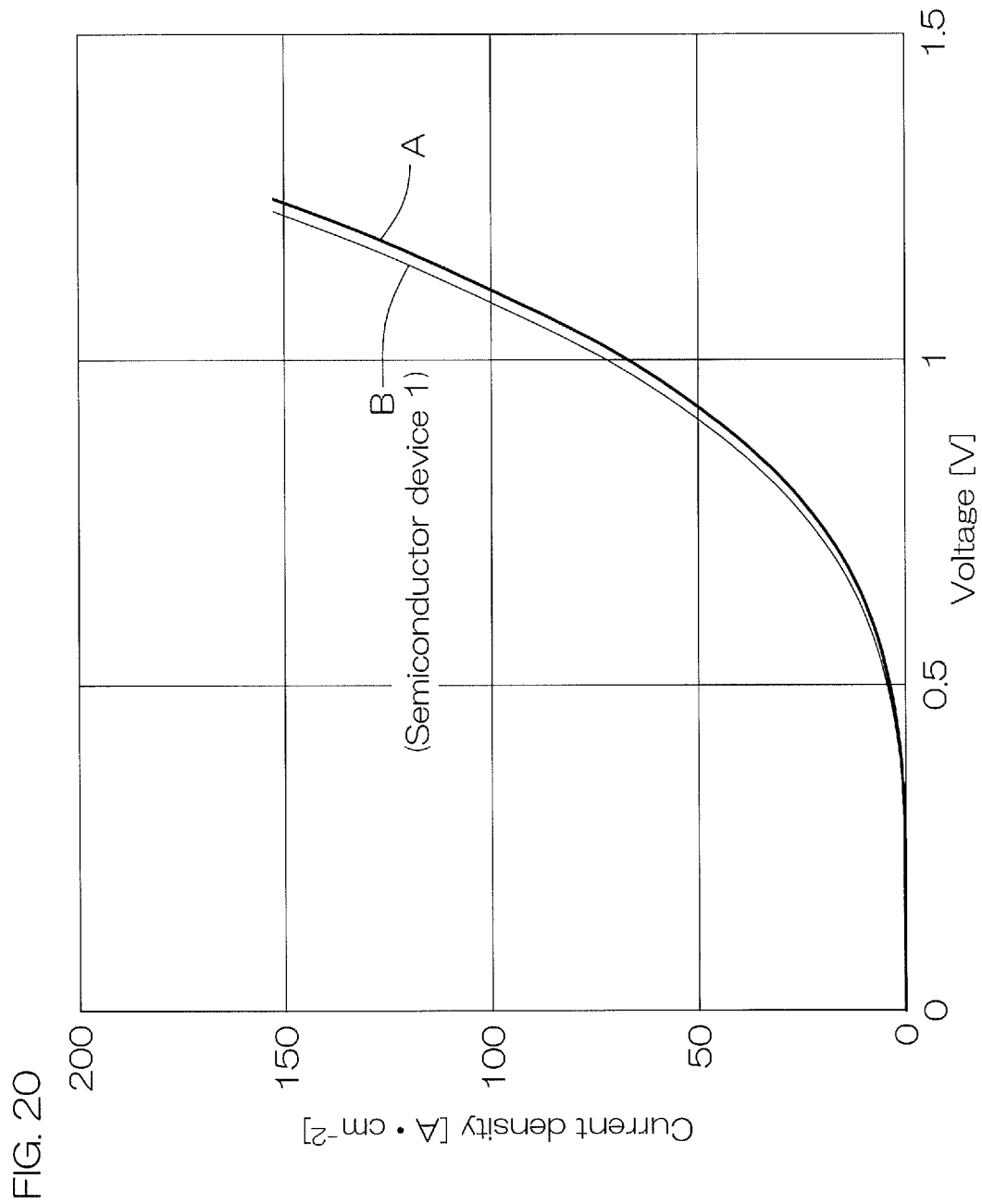
FIG. 20 is a graph in which a forward characteristic of a pn junction diode has been examined by simulation.

FIG. 20 is a graph in which a forward characteristic of a pn junction diode D has been examined by simulation. In FIG. 20, the ordinate axis represents a current density [A·cm$^{-2}$], and the abscissa axis represents a voltage [V].

A first characteristic A and a second characteristic B are shown in FIG. 20. The first characteristic A shows a forward characteristic of a semiconductor device according to a reference example. The second characteristic B shows a forward characteristic of the semiconductor device 1. The semiconductor device according to the reference example has the same structure as the semiconductor device 1 with the exception of the fact that the semiconductor device according to the reference example does not have the boundary region 10. A detailed description of the semiconductor device according to the reference example is omitted.

Referring to the first characteristic A and the second characteristic B, the forward characteristic of the semiconductor device 1 was improved in comparison with the forward characteristic of the semiconductor device according to the reference example.

Figure 21B:
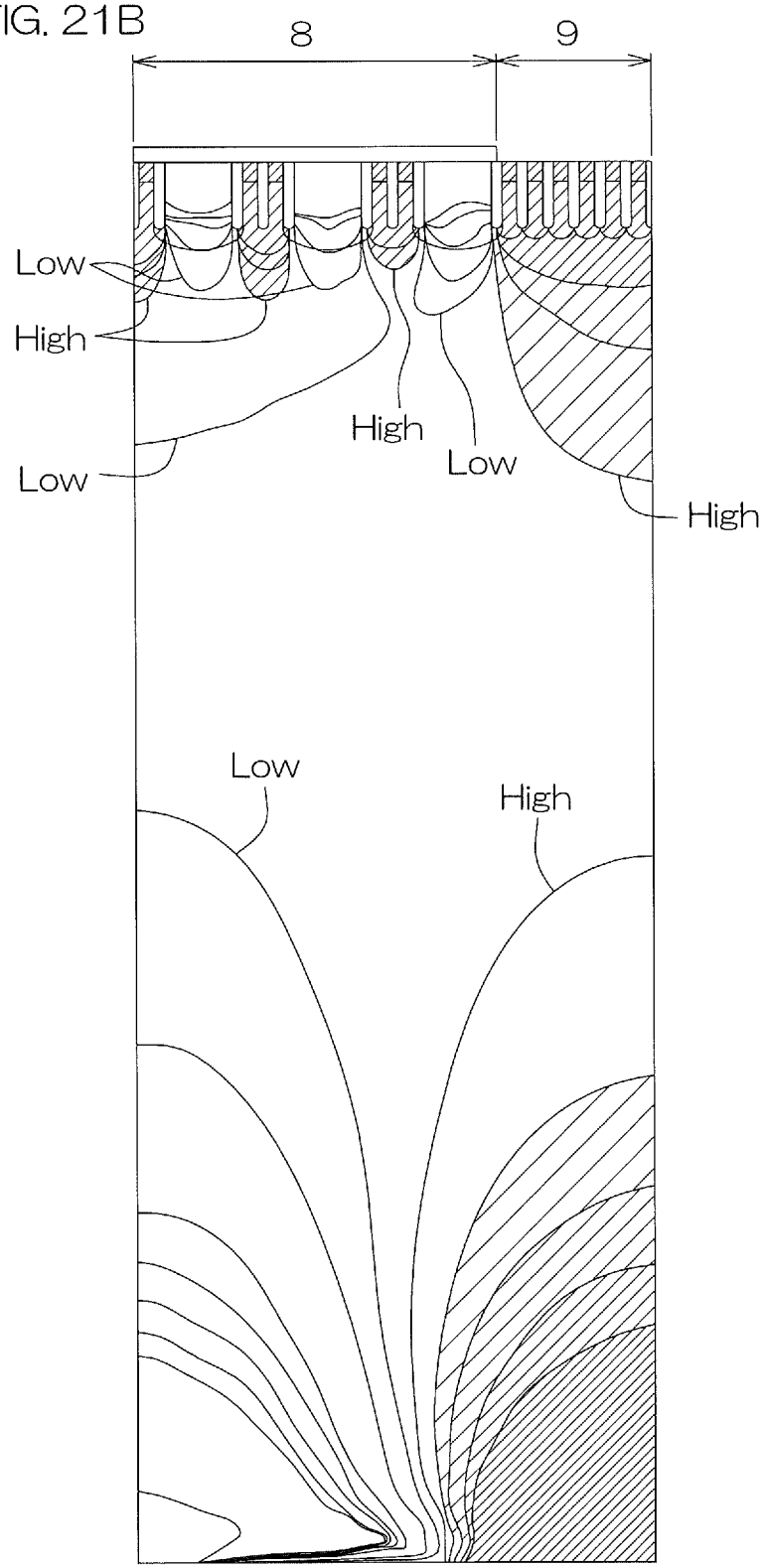
FIG. 21B is a view in which the hole current density of a semiconductor device according to a reference example has been examined by simulation.

FIG. 21A is a view in which the hole density of the semiconductor device according to the reference example has been examined by simulation. FIG. 21B is a view in which the hole current density of the semiconductor device according to the reference example has been examined by simulation.

The hole density and the hole current density examined when the pn junction diode D is operated in the forward direction are shown in FIG. 21A and FIG. 21B, respectively. Also, a region having a high density is shown by hatching in FIG. 21A and FIG. 21B.

Referring to FIG. 21A, in the semiconductor device according to the reference example, holes are distributed with a relatively high density in the IGBT region 8 and the diode region 9. The hole density is particularly high in a region near the FET structure 35 of the IGBT region 8.

Referring to FIG. 21B, in the semiconductor device according to the reference example, a great disproportion in the hole current density is formed between the IGBT region 8 and the diode region 9. More specifically, the hole current density of the diode region 9 is higher than the hole current density of the IGBT region 8. In the IGBT region 8, the hole current density is relatively high in a region near the FET structure 35, and yet the hole current density is relatively low in regions other than the region therenear.

FIG. 22A is a view in which the hole density of the semiconductor device 1 has been examined by simulation. FIG. 22B is a view in which the hole current density of the semiconductor device 1 has been examined by simulation. The hole density and the hole current density examined when the pn junction diode D is operated in the forward direction are shown in FIG. 22A and FIG. 22B, respectively. Also, a region having a high density is shown by hatching in FIG. 22A and FIG. 22B.

Referring to FIG. 22A, an increase in the hole density in the diode region 9 is restrained in the semiconductor device 1. Also, an increase in the hole density in a region near the boundary FET structure 77 in the boundary region 10 is restrained in the semiconductor device 1.

Referring to FIG. 22B, a disproportion in the hole current density between the boundary region 10 and the diode region 9 is restrained in the semiconductor device 1. The reason why the hole density and the hole current density shown as above were reached is that holes were injected into the semiconductor layer 2 from the well region 71 that was emitter-grounded.

As thus described, in the semiconductor device 1, it is possible to restrain a disproportion in the hole density and a disproportion in the hole current density by the well region 71 that has been emitter-grounded. Also, when the pn junction diode D is operated in the forward direction, holes are also injected from the well region 71, hence making it possible to raise the hole current density. This makes it possible to improve the forward characteristic of the semiconductor device 1.

Figure 23:
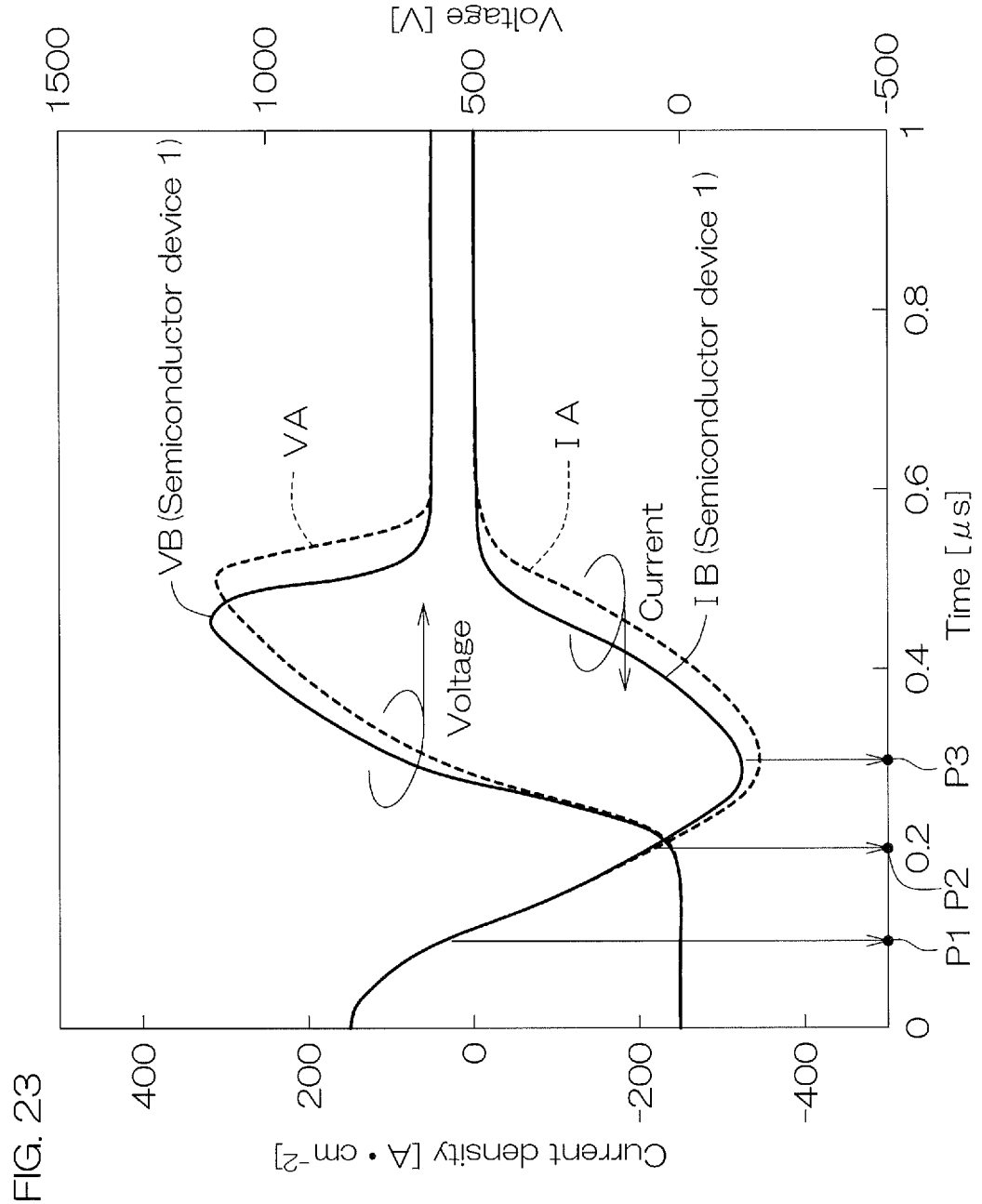
FIG. 23 is a graph in which a reverse recovery characteristic of a pn junction diode has been examined by simulation.

FIG. 23 is a graph in which a reverse recovery characteristic of the pn junction diode D has been examined by simulation. In FIG. 23, the left ordinate axis represents a current density [A·cm$^{-2}$], and the right ordinate axis represents a voltage [V], and the abscissa axis represents time [μs].

When the pn junction diode D performs switching from an ON state to an OFF state, a reverse recovery current flows to the pn junction diode D, and a reverse recovery voltage is generated. In FIG. 23, a first reverse recovery current characteristic IA and a first reverse recovery voltage characteristic VA are each shown by the broken line, and a second reverse recovery current characteristic IB and a second reverse recovery voltage characteristic VB are each shown by the solid line.

The first reverse recovery current characteristic IA and the first reverse recovery voltage characteristic VA show the characteristic of the pn junction diode D of the semiconductor device according to the reference example. The second reverse recovery current characteristic IB and the second reverse recovery voltage characteristic VB show the characteristic of the pn junction diode D of the semiconductor device 1.

Referring to the first reverse recovery current characteristic IA and the second reverse recovery current characteristic IB, the reverse recovery current of the semiconductor device 1 became lower than the reverse recovery current of the semiconductor device according to the reference example. Also, the reverse recovery time of the semiconductor device 1 became shorter than the reverse recovery time of the semiconductor device according to the reference example.

Referring to the first reverse recovery voltage characteristic VA and the second reverse recovery voltage characteristic VB, the reverse recovery voltage of the semiconductor device 1 became smaller in accordance with a decrease in reverse recovery current than the reverse recovery voltage of the semiconductor device according to the reference example. In other words, the reverse recovery loss of the semiconductor device 1 became smaller than the reverse recovery loss of the semiconductor device according to the reference example.

Figure 24C:
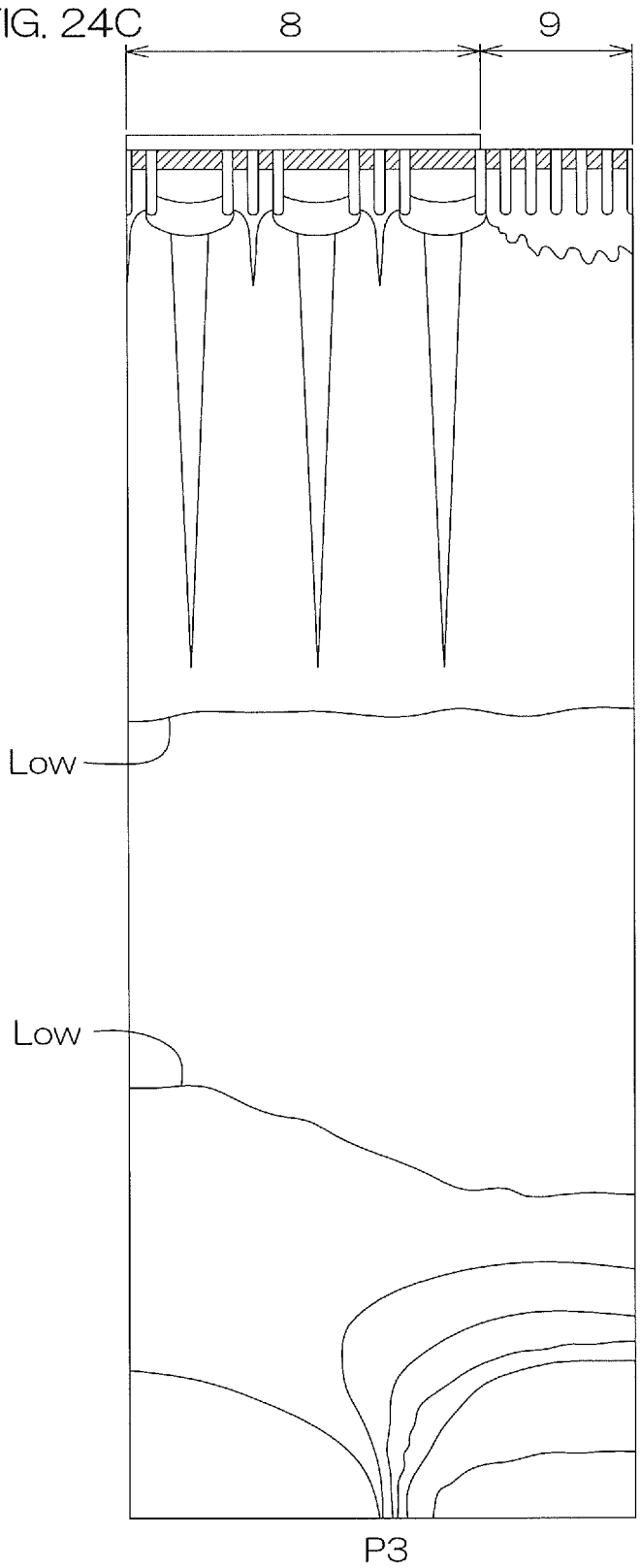
FIG. 24C is a view in which the hole current density of a semiconductor device according to a reference example has been examined by simulation.

FIG. 24A to FIG. 24C are views in which the hole current density of the semiconductor device according to the reference example has been examined by simulation in a first measurement point P1, in a second measurement point P2, and in a third measurement point P3, respectively, which are shown in FIG. 23. A region having a high density is shown by hatching in FIG. 24A to FIG. 24C.

The first measurement point P1 is a phase in which the pn junction diode D performs switching from an ON state to an OFF state, and then a forward current is flowing to the pn junction diode D. The second measurement point P2 is a phase in which a reverse current is flowing to the pn junction diode D. The third measurement point P3 is a phase in which a reverse current reaches a peak.

Referring to FIG. 24A, holes distributed in the IGBT region 8 and in the diode region 9 are drawn back to the FET structure 35 and to the anode region 62 while a forward voltage flows to the pn junction diode D in the first measurement point P1. In the IGBT region 8, holes drawn back stagnate near the FET structure 35, and therefore a relatively high hole density is formed. Particularly in the IGBT region 8 into which the IE structure 51 has been introduced, an increase in the hole density resulting from holes to be drawn back is remarkably observed.

Referring to FIG. 24B, in the second measurement point P2, holes stagnate in the IGBT region 8. The holes stagnate in a region between the FET structure 35 and the collector region 34 in the semiconductor layer 2. Also, in the second measurement point P2, the formation of a depletion layer is observed in the IGBT region 8 and in the diode region 9. However, the formation of the depletion layer on the IGBT region 8 side is obstructed by the stagnating holes. Therefore, the depletion layer on the IGBT region 8 side is smaller than the depletion layer on the diode region 9 side.

Referring to FIG. 24C, in the third measurement point P3, holes stagnating in the IGBT region 8 are drawn back, and a depletion layer spreads to a halfway portion in the depth direction of the semiconductor layer 2.

Figure 25A:
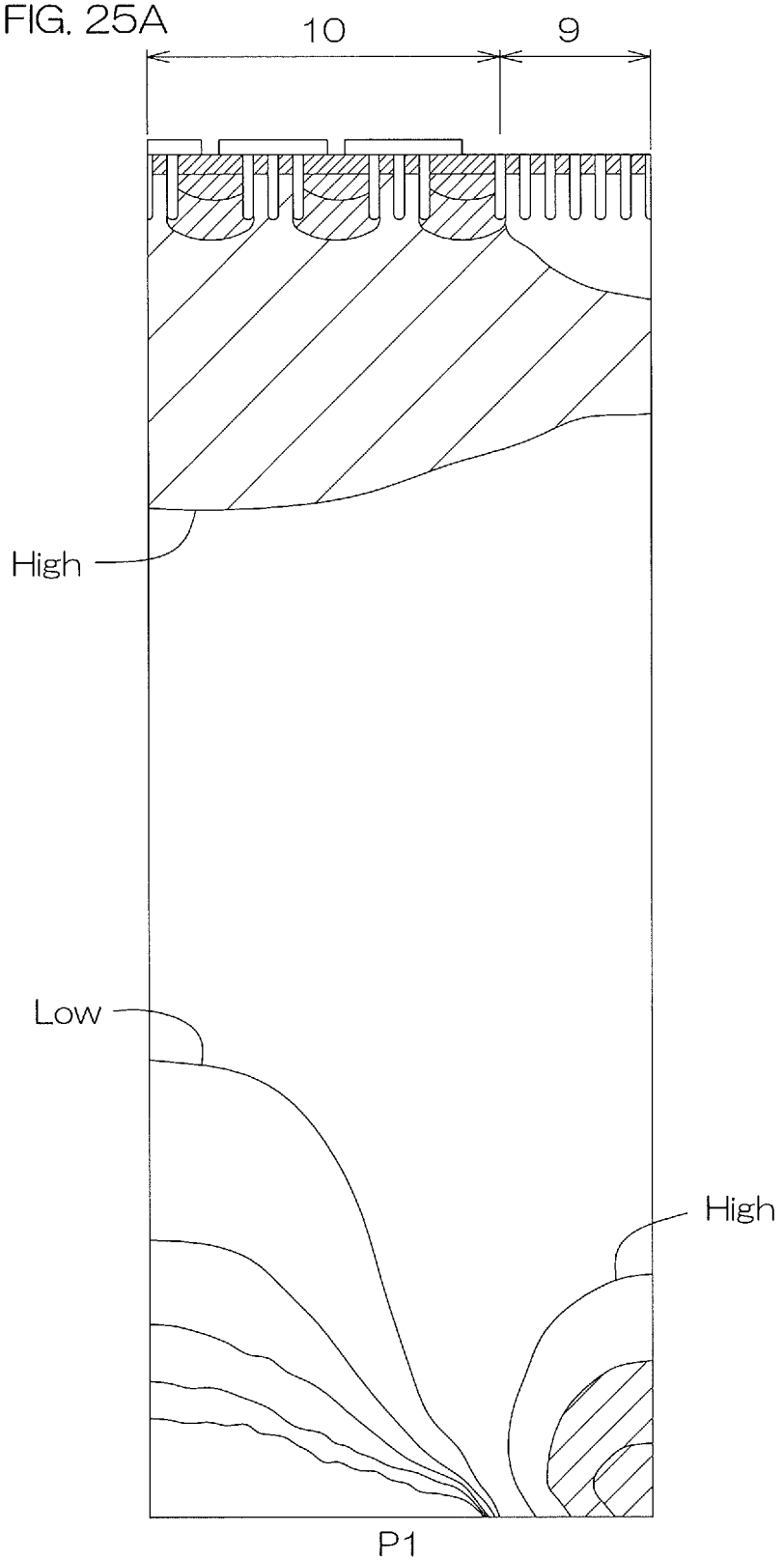
FIG. 25A is a view in which the hole current density of the semiconductor device shown in FIG. 1 has been examined by simulation.

FIG. 25A to FIG. 25C are views in which the hole current density of the semiconductor device 1 has been examined by simulation in the first measurement point P1, in the second measurement point P2, and in the third measurement point P3, respectively, which are shown in FIG. 23. A region having a high density is shown by hatching in FIG. 25A to FIG. 25C.

Referring to FIG. 25A, in the first measurement point P1 in the semiconductor device 1, the stagnation of holes is restrained in comparison with the semiconductor device according to the reference example. The reason for this is that, when the pn junction diode D performs switching from an ON state to an OFF state, holes distributed in the boundary region 10 and in the diode region 9 are drawn back to the boundary FET structure 77, to the well region 71, and to the anode region 62.

The well region 71 is introduced in the boundary region 10 of the semiconductor device 1, and therefore the hole density can also be considered as being raised. However, the well region 71 in the boundary region 10 is emitter-grounded. Therefore, when the pn junction diode D performs a reverse recovery operation, holes stagnating at the semiconductor layer 2 are swiftly discharged by this well region 71, and therefore an increase in the hole density is restrained.

Referring to FIG. 25B, in the second measurement point P2, holes can hardly stagnate in the boundary region 10 and in the diode region 9. In the semiconductor device 1, a depletion layer is swiftly formed in the boundary region 10 and in the diode region 9 in response to the discharge of holes. Variation in a depletion layer formed in the boundary region 10 and variation in a depletion layer formed in the diode region 9 are restrained.

Referring to FIG. 25C, in the third measurement point P3, a depletion layer spreads to a halfway portion in the depth direction of the semiconductor layer 2.

As described above, according to the semiconductor device 1, the IGBT region 8, the diode region 9, and the boundary region 10 are formed in the semiconductor layer 2. The IGBT region 8 and the diode region 9 adjoin each other. The boundary region 10 is formed in a region between the IGBT region 8 and the diode region 9.

The IGBT region 8 includes the FET structure 35 and the collector region 34. The FET structure 35 includes the body region 45, the emitter region 46, the gate insulating layer 40, and the gate electrode 41. The diode region 9 includes the cathode region 61 and the anode region 62. The boundary region 10 includes the well region 71.

The emitter region 46 of the IGBT region 8, the anode region 62 of the diode region 9, and the well region 71 of the boundary region 10 are electrically connected to the emitter terminal electrode 13. The emitter region 46 of the IGBT region 8 and the cathode region 61 of the diode region 9 are electrically connected to the collector terminal electrode 32.

Hence, it is possible to swiftly discharge holes existing in the boundary region 10 by the well region 71 when the pn junction diode D performs a reverse recovery operation. As a result, it is possible to restrain the stagnation of holes in the boundary region 10, and hence it is possible to restrain a reverse recovery current. Therefore, it is possible to reduce reverse recovery loss.

Also, according to the semiconductor device 1, the boundary region 10 includes the well region 71 formed in a region that overlaps the collector region 34 in plan view. This makes it possible to appropriately restrain the accumulation of holes in a region between the well region 71 and the collector region 34 in the semiconductor layer 2. Therefore, it is possible to appropriately reduce reverse recovery loss.

Also, according to the semiconductor device 1, a plurality of the well regions 71 are formed in the surface layer portion of the first main surface 3. The plurality of well regions 71 are each electrically connected to the emitter terminal electrode 13. This makes it possible to efficiently discharge holes existing in the boundary region 10 by the plurality of well regions 71. Therefore, it is possible to efficiently reduce reverse recovery loss.

Also, according to the semiconductor device 1, the boundary region 10 includes the boundary FET structure 77 formed in a region adjoining the well region 71 in the first main surface 3. More specifically, the boundary region 10 includes a plurality of the boundary FET structures 77. The plurality of boundary FET structures 77 are each formed in a region between the plurality of well regions 71. Each of the boundary FET structures 77 has a structure corresponding to the FET structure 35 of the IGBT region 8. Hence, it is possible to obtain an IGBT characteristic by the boundary FET structure 77 and a hole discharging effect by the well region 71 in the boundary region 10.

Also, according to the semiconductor device 1, the IGBT region 8 includes the floating region 52 adjoining the FET structure 35 in the surface layer portion of the first main surface 3. The floating region 52 is electrically insulated from the emitter terminal electrode 13.

The bottom portion of the floating region 52 is formed in a region on the second main surface 4 side with respect to the bottom portion of the body region 45 with respect to the normal direction Z. It is possible to improve withstand voltage by forming the floating region 52 that is deeper than the body region 45. Meanwhile, the body region 45 is not required to be deeply formed, and therefore it is possible to reduce the on-voltage by shortening a channel length.

Also, according to the semiconductor device 1, the IGBT region 8 includes the region separation structure 50. The region separation structure 50 includes the floating region 52 and the region separation trench structure 53. The region separation trench structure 53 divides the floating region 52 from the FET structure 35.

Hence, the IE structure 51 including the FET structure 35 and the region separation structure 50 is formed in the IGBT region 8. In the IE structure 51, a plurality of the FET structures 35 are formed in such a manner as to be separated by the region separation structure 50. In this embodiment, the FET structure 35 and the region separation structure 50 are alternately formed along the first direction X.

The region separation structure 50 restricts the movement of holes injected into the semiconductor layer 2. In other words, holes detour the region separation structure 50, and flow into the boundary FET structure 77. Hence, the hole density of a region directly under the FET structure 35 is raised in the semiconductor layer 2. As a result, it is possible to reduce the on-resistance and reduce the on-voltage in the IGBT region 8.

Meanwhile, the boundary region 10 includes the well region 71 and the well separation structure 72 that are formed in the same manner as the IE structure 51. According to the thus formed structure, the hole density can also be considered as being raised in a region directly under the well region 71 in the semiconductor layer 2.

However, the well region 71 is emitter-grounded unlike the floating region 52. Therefore, it is possible to swiftly discharge holes stagnating at the semiconductor layer 2 by the well region 71 when the pn junction diode D performs a reverse recovery operation. This makes it possible to restrain an increase in the hole density in the semiconductor layer 2.

Also, in the semiconductor device 1, the RC-IGBT array 12 (device region) is formed of the IGBT region 8, the diode region 9, and the boundary region 10 that are arranged along the first direction X. More specifically, the RC-IGBT array 12 has a loop sequence that repeatedly includes the IGBT region 8, the boundary region 10, the diode region 9, the boundary region 10, the IGBT region 8, the boundary region 10, the diode region 9, . . . .

In the semiconductor device 1, a plurality of the RC-IGBT arrays 12 are formed with intervals between the RC-IGBT arrays 12 along the second direction Y. Hence, it is possible to appropriately form a plurality of mutually different regions in a limited region of the semiconductor layer 2, and, at the same time, it is possible to fulfill the aforementioned effect in the different regions of the semiconductor layer 2.

Also, in the semiconductor device 1, the temperature-sensitive diode sensor 100 is formed in a region between two RC-IGBT arrays 12 adjoining in the second direction Y. The gate wiring 19, the first sense wiring 20, and the second sense wiring 21 are formed in a region between the adjoining RC-IGBT arrays 12.

The gate wiring 19, the first sense wiring 20, and the second sense wiring 21 are arranged side by side along the RC-IGBT array 12. The gate wiring 19 transmits a gate signal to each of the IGBT regions 8 of two RC-IGBT arrays 12 adjoining in the second direction Y. The first sense wiring 20 and the second sense wiring 21 transmit an electric signal to the temperature-sensitive diode sensor 100. According to this structure, it is possible to appropriately reduce the wiring-forming area. In other words, it is possible to expand the active region 6 by reducing the wiring-forming area.

Figure 26:
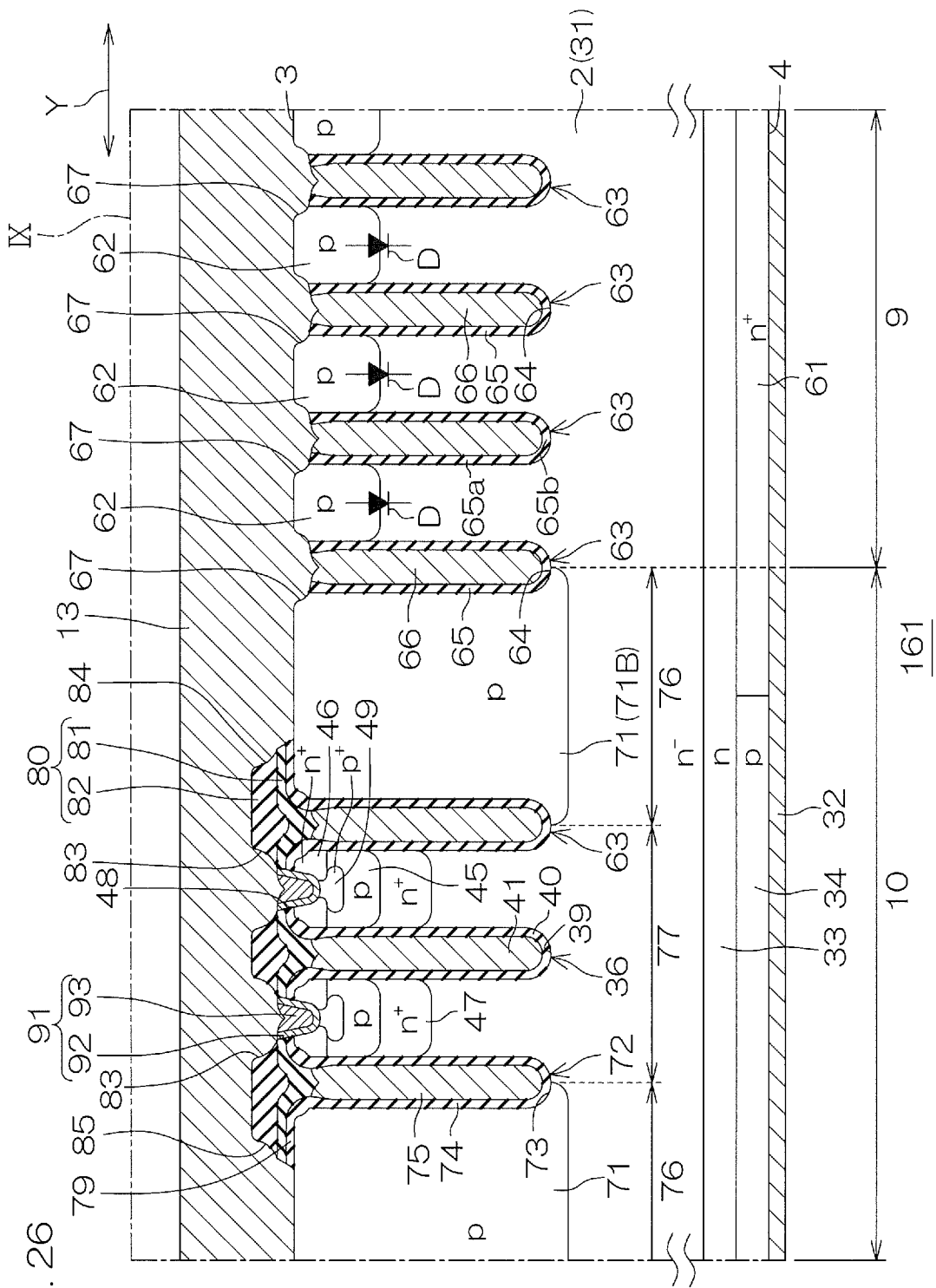
FIG. 26 is a cross-sectional view of a part corresponding to FIG. 9, and shows a semiconductor device according to a second preferred embodiment of the present invention.

FIG. 26 is a cross-sectional view of a part corresponding to FIG. 9, and shows a semiconductor device 161 according to a second preferred embodiment of the present invention. Hereinafter, the same reference sign is given to a structural component corresponding to that of the semiconductor device 1, and a description of this structural component is omitted.

Referring to FIG. 26, the boundary region 10 according to the semiconductor device 161 includes the well region 71 formed in a region that overlaps the cathode region 61 of the diode region 9 in plan view. More specifically, a part of the second proximal well region 71B among the plurality of well regions 71 is formed in a region that overlaps the cathode region 61 in plan view. The part of the second proximal well region 71B is formed in a region that overlaps the collector region 34 in plan view.

As described above, the semiconductor device 161 also makes it possible to bring about the same effect as the effect mentioned concerning the semiconductor device 1.

Figure 27:
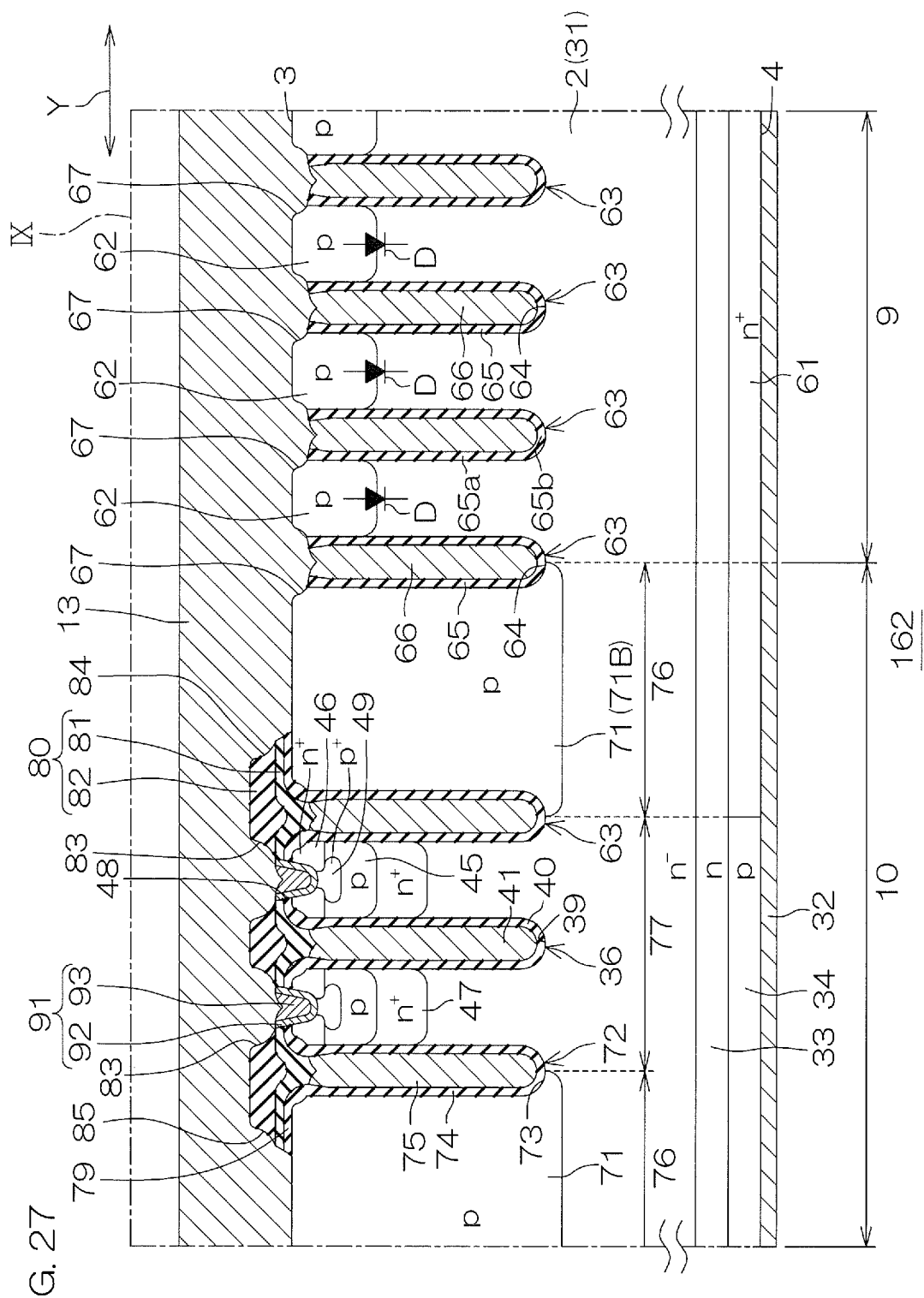
FIG. 27 is a cross-sectional view of a part corresponding to FIG. 9, and shows a semiconductor device according to a third preferred embodiment of the present invention.

FIG. 27 is a cross-sectional view of a part corresponding to FIG. 9, and shows a semiconductor device 162 according to a third preferred embodiment of the present invention. Hereinafter, the same reference sign is given to a structural component corresponding to that of the semiconductor device 1, and a description of this structural component is omitted.

Referring to FIG. 27, the boundary region 10 according to the semiconductor device 162 includes the well region 71 formed in a region that overlaps the cathode region 61 of the diode region 9 in plan view. More specifically, a whole region of the second proximal well region 71B among the plurality of well regions 71 is formed in a region that overlaps the cathode region 61 in plan view. The second proximal well region 71B does not overlap the collector region 34 in plan view.

As described above, the semiconductor device 162 also makes it possible to bring about the same effect as the effect mentioned concerning the semiconductor device 1.

Figure 28:
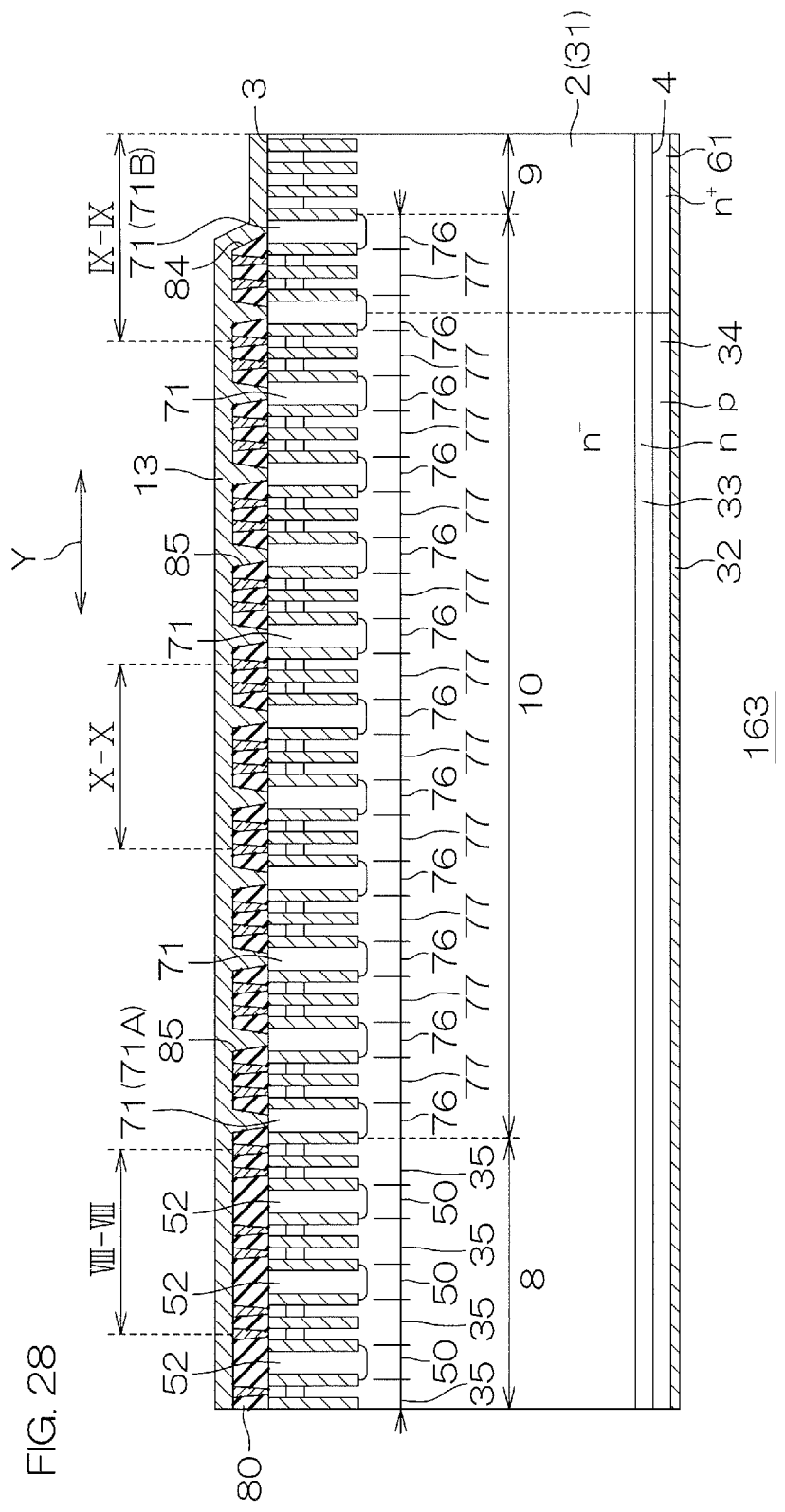
FIG. 28 is a cross-sectional view of a part corresponding to FIG. 7, and shows a semiconductor device according to a fourth preferred embodiment of the present invention.

FIG. 28 is a cross-sectional view of a part corresponding to FIG. 7, and shows a semiconductor device 163 according to a fourth preferred embodiment of the present invention. Hereinafter, the same reference sign is given to a structural component corresponding to that of the semiconductor device 1, and a description of this structural component is omitted.

Referring to FIG. 28, the boundary region 10 according to the semiconductor device 163 includes the well region 71 formed in a region that overlaps the cathode region 61 of the diode region 9 in plan view. More specifically, a whole region of the second proximal well region 71B among the plurality of well regions 71 is formed in a region that overlaps the cathode region 61 in plan view. The second proximal well region 71B does not overlap the collector region 34 in plan view.

Also, a part of the well region 71 adjoining the second proximal well region 71B is formed in a region that overlaps the cathode region 61 in plan view. The part of the well region 71 adjoining the second proximal well region 71B is formed in a region that overlaps the collector region 34 in plan view.

As described above, the semiconductor device 163 also makes it possible to bring about the same effect as the effect mentioned concerning the semiconductor device 1.

Figure 29:
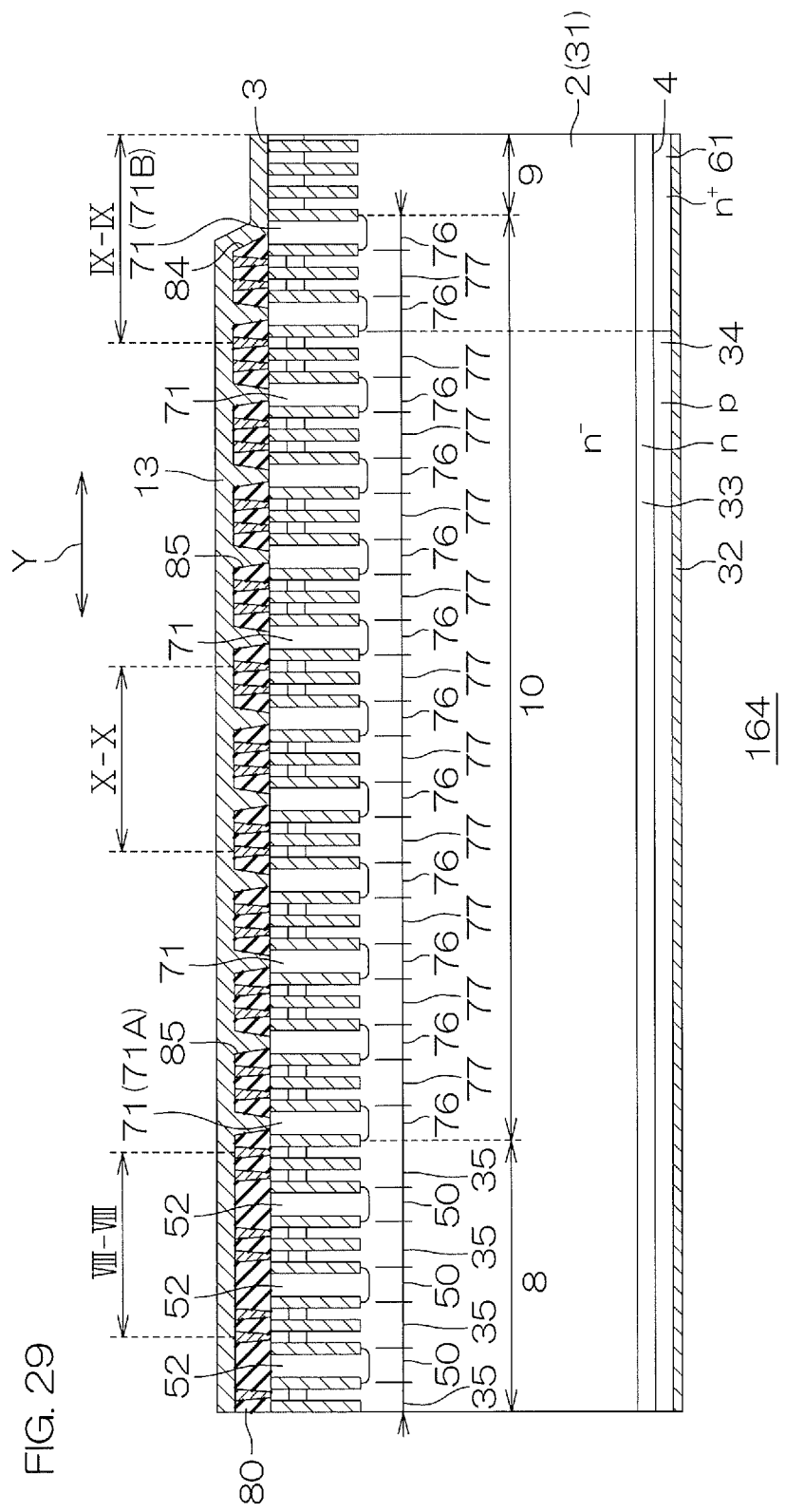
FIG. 29 is a cross-sectional view of a part corresponding to FIG. 7, and shows a semiconductor device according to a fifth preferred embodiment of the present invention.

FIG. 29 is a cross-sectional view of a part corresponding to FIG. 7, and shows a semiconductor device 164 according to a fifth preferred embodiment of the present invention. Hereinafter, the same reference sign is given to a structural component corresponding to that of the semiconductor device 1, and a description of this structural component is omitted.

Referring to FIG. 29, the boundary region 10 according to the semiconductor device 164 includes the well region 71 formed in a region that overlaps the cathode region 61 of the diode region 9 in plan view. The boundary region 10 may include a plurality (two or more) of the well regions 71 formed in a region that overlaps the cathode region 61 in plan view.

In this embodiment, a whole region of the second proximal well region 71B among the plurality of well regions 71 is formed in a region that overlaps the cathode region 61 in plan view. The second proximal well region 71B does not overlap the collector region 34 in plan view.

Also, in this embodiment, a whole region of the well region 71 adjoining the second proximal well region 71B is formed in a region that overlaps the cathode region 61 in plan view. The well region 71 adjoining the second proximal well region 71B does not overlap the collector region 34 in plan view.

As described above, the semiconductor device 164 also makes it possible to bring about the same effect as the effect mentioned concerning the semiconductor device 1.

Figure 30:
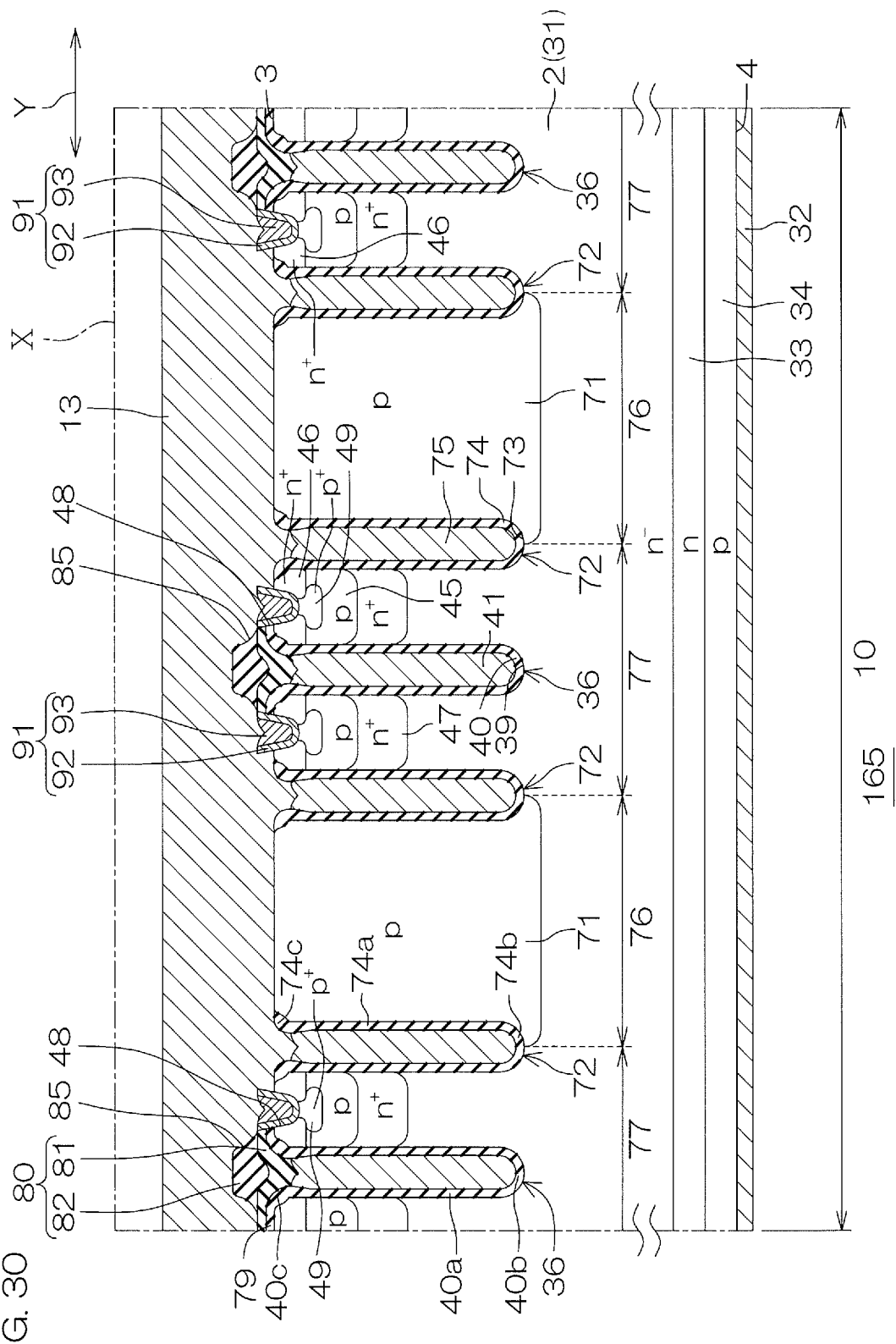
FIG. 30 is a cross-sectional view of a part corresponding to FIG. 10, and shows a semiconductor device according to a sixth preferred embodiment of the present invention.

FIG. 30 is a cross-sectional view of a part corresponding to FIG. 10, and shows a semiconductor device 165 according to a sixth preferred embodiment of the present invention. Hereinafter, the same reference sign is given to a structural component corresponding to that of the semiconductor device 1, and a description of this structural component is omitted.

Referring to FIG. 30, each of the well openings 85 according to the semiconductor device 165 exposes a whole region of a part exposed from the first main surface 3 in the well region 71 corresponding thereto. More specifically, each of the well openings 85 exposes the well separation structure 72 that defines the corresponding well region 71 in addition to the corresponding well region 71. Each of the well openings 85 exposes the boundary region separation structure 76 including the corresponding well region 71 in a one-on-one relationship.

Each of the well openings 85 may expose the emitter plug electrode 91 formed on both sides of the boundary region separation structure 76. Each of the well openings 85 may expose an upper surface of the emitter plug electrode 91 and a side surface that faces the boundary region separation structure 76 in the emitter plug electrode 91.

The emitter terminal electrode 13 covers a whole region of a part exposed from the first main surface 3 in the well region 71, and is electrically connected to the well region 71 in each of the well openings 85. The emitter terminal electrode 13 covers the well separation electrode layer 75, and is electrically connected to the well separation electrode layer 75 in each of the well openings 85. The emitter terminal electrode 13 covers the upper surface and the side surface of the emitter plug electrode 91, and is electrically connected to the emitter plug electrode 91 in each of the well openings 85.

As described above, the semiconductor device 165 also makes it possible to bring about the same effect as the effect mentioned concerning the semiconductor device 1.

Figure 31:
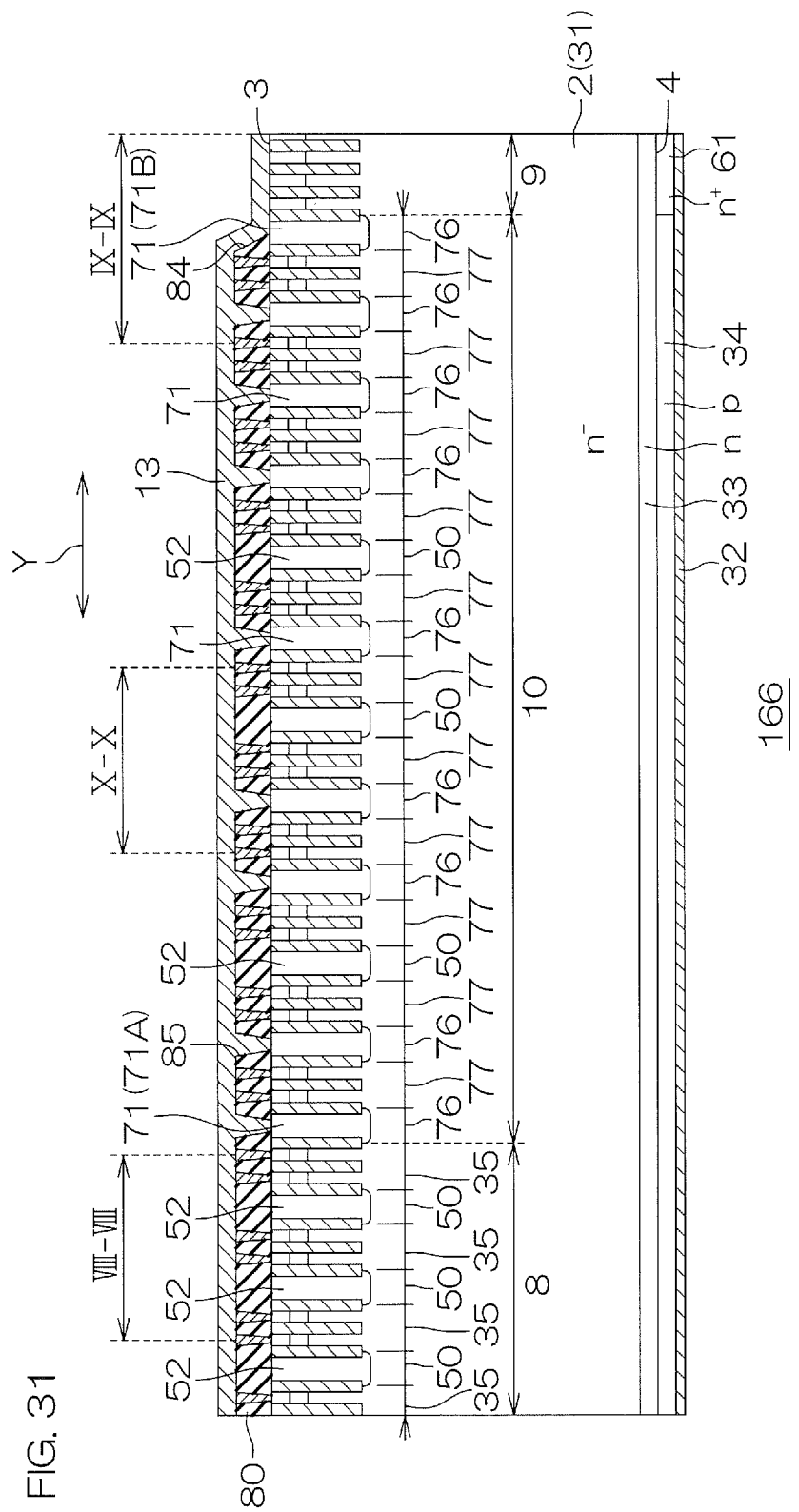
FIG. 31 is a cross-sectional view of a part corresponding to FIG. 7, and shows a semiconductor device according to a seventh preferred embodiment of the present invention.

FIG. 31 is a cross-sectional view of a part corresponding to FIG. 7, and shows a semiconductor device 166 according to a seventh preferred embodiment of the present invention. Hereinafter, the same reference sign is given to a structural component corresponding to that of the semiconductor device 1, and a description of this structural component is omitted.

Referring to FIG. 31, the boundary region 10 according to the semiconductor device 166 includes one or a plurality of the well regions 71 electrically insulated from the emitter terminal electrode 13. In other words, the boundary region 10 includes a plurality of the well regions 71 and one or a plurality of the floating regions 52. The boundary region 10 may include one or a plurality of the floating regions 52 formed in a region between the first proximal well region 71A and the second proximal well region 71B.

As described above, the semiconductor device 166 also makes it possible to bring about the same effect as the effect mentioned concerning the semiconductor device 1.

Figure 32:
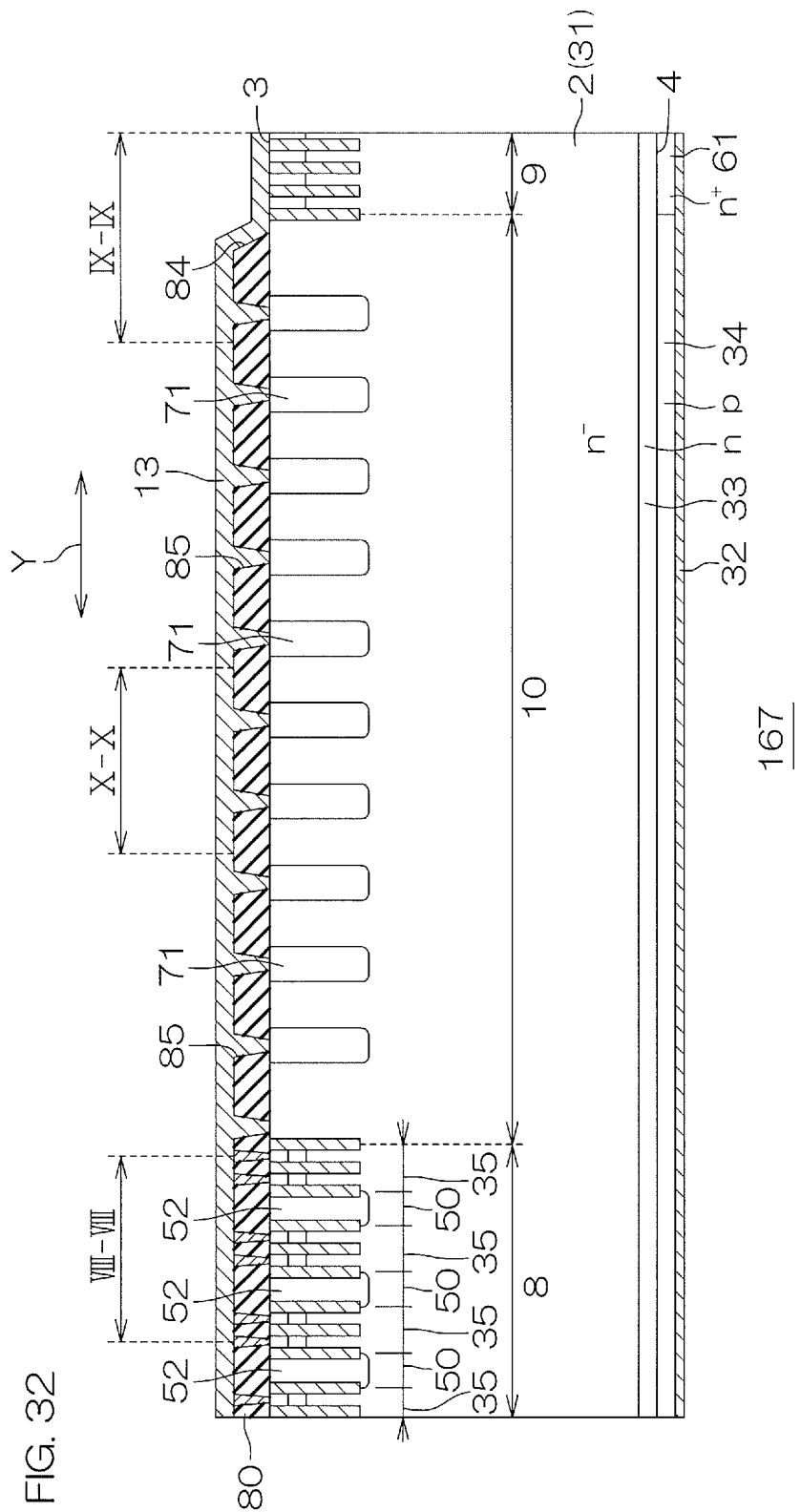
FIG. 32 is a cross-sectional view of a part corresponding to FIG. 7, and shows a semiconductor device according to an eighth preferred embodiment of the present invention.

FIG. 32 is a cross-sectional view of a part corresponding to FIG. 7, and shows a semiconductor device 167 according to an eighth preferred embodiment of the present invention. Hereinafter, the same reference sign is given to a structural component corresponding to that of the semiconductor device 1, and a description of this structural component is omitted.

Referring to FIG. 32, in this embodiment, the boundary region 10 according to the semiconductor device 167 does not have the well separation structure 72. In this embodiment, a plurality of the well regions 71 are formed with intervals between the well regions 71 along the first direction X in plan view. The plurality of well regions 71 face each other in a lateral direction parallel to the first main surface 3 with regions, each of which is a part of the semiconductor layer 2, between the well regions 71.

As described above, the semiconductor device 167 also makes it possible to bring about the same effect as the effect mentioned concerning the semiconductor device 1.

Figure 33:
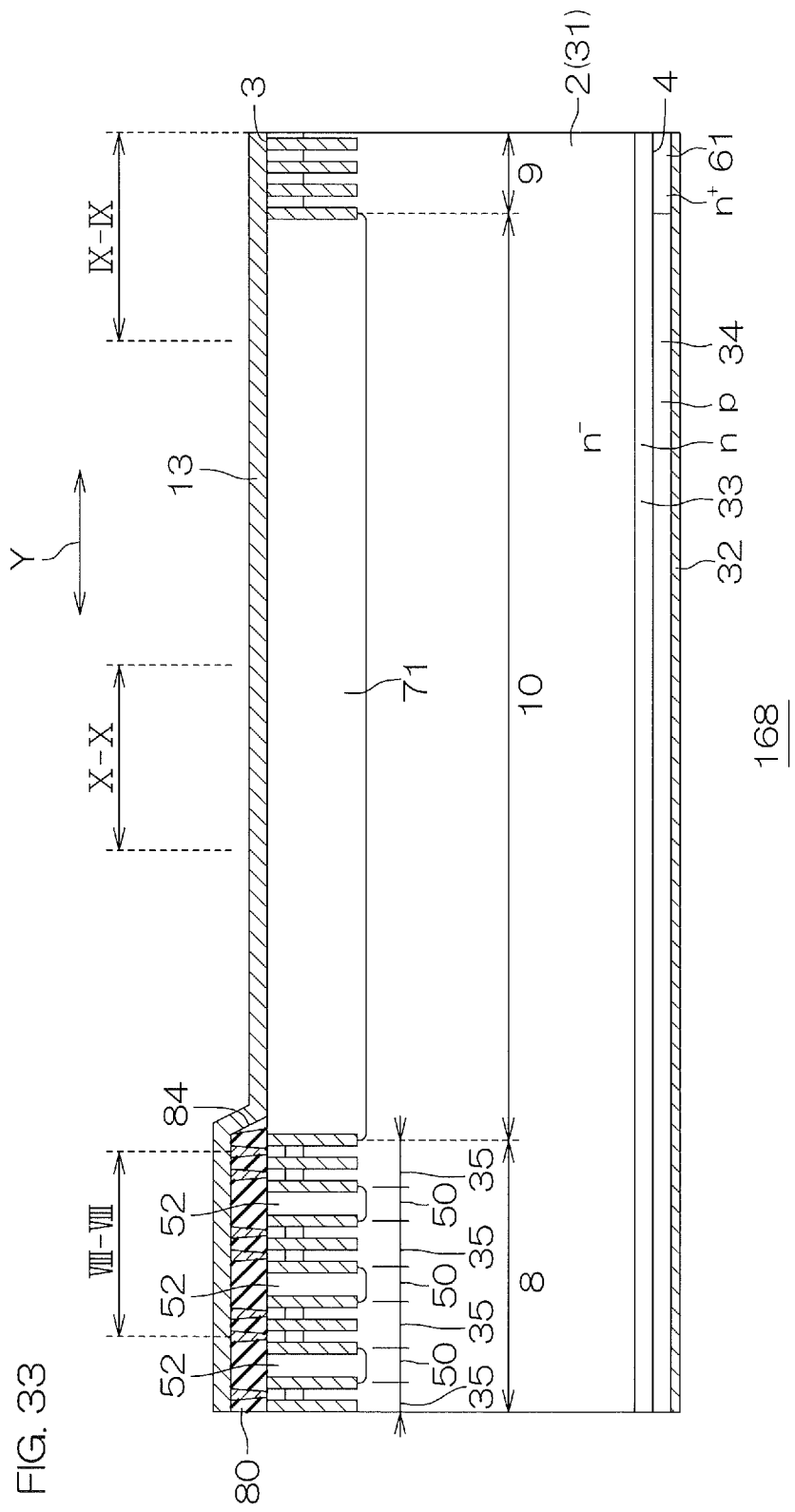
FIG. 33 is a cross-sectional view of a part corresponding to FIG. 7, and shows a semiconductor device according to a ninth preferred embodiment of the present invention.

FIG. 33 is a cross-sectional view of a part corresponding to FIG. 7, and shows a semiconductor device 168 according to a ninth preferred embodiment of the present invention. Hereinafter, the same reference sign is given to a structural component corresponding to that of the semiconductor device 1, and a description of this structural component is omitted.

Referring to FIG. 33, the boundary region 10 according to the semiconductor device 168 includes a single well region 71. The single well region 71 is divided from the IGBT region 8 and from the diode region 9 by the region separation structure 50. In other words, the boundary region 10 has a structure in which the first proximal well region 71A and the second proximal well region 71B are formed integrally with each other.

A whole region of the single well region 71 overlaps the collector region 34 in plan view. The single well region 71 may have a part that overlaps the collector region 34 and a part that overlaps the cathode region 61 in plan view.

In this embodiment, the anode opening 84 exposes the anode region 62 and the well region 71. The emitter terminal electrode 13 is electrically connected to the anode region 62 and to the well region 71 in the anode opening 84.

As described above, the semiconductor device 168 also makes it possible to bring about the same effect as the effect mentioned concerning the semiconductor device 1.

Figure 34:
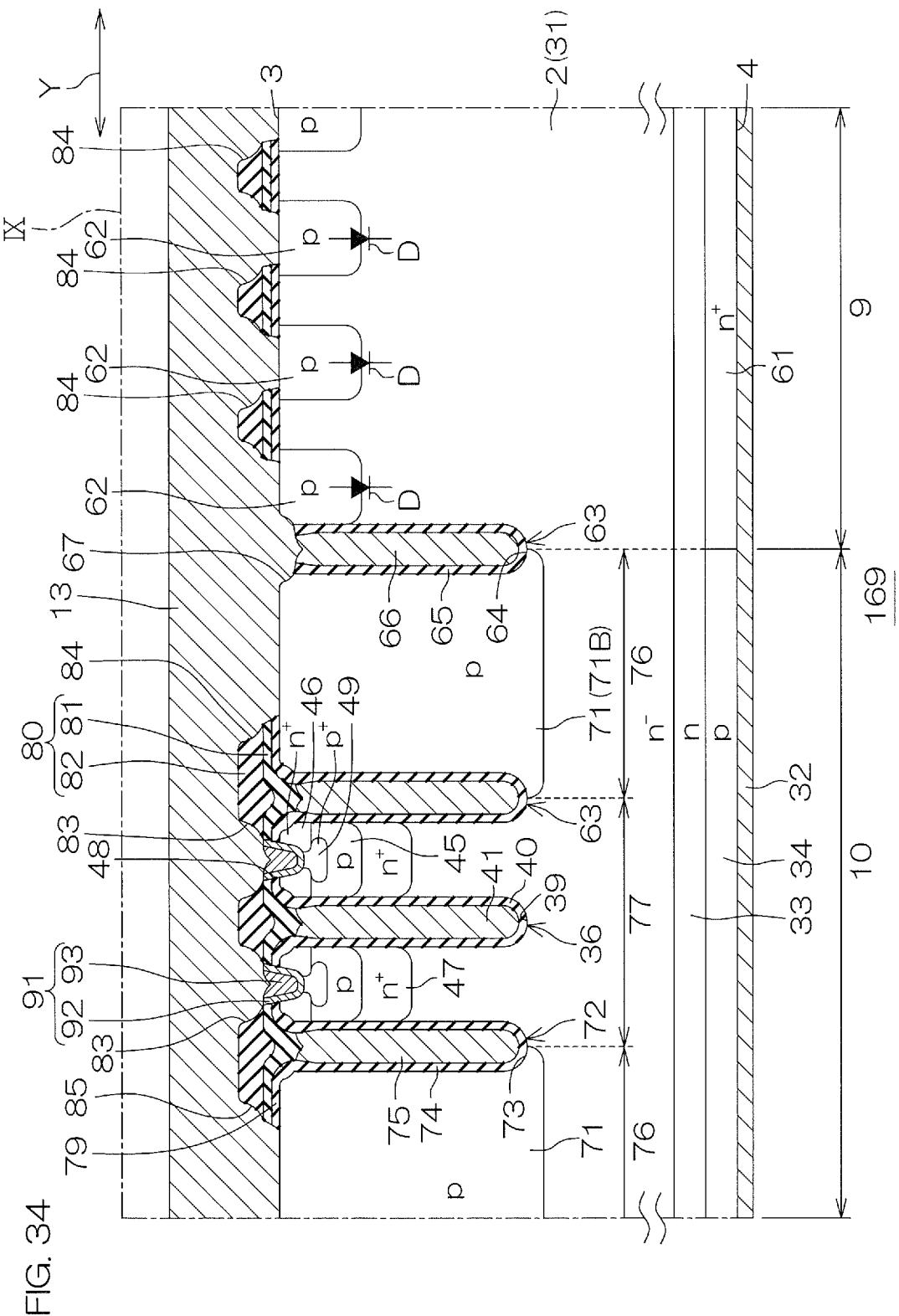
FIG. 34 is a cross-sectional view of a part corresponding to FIG. 9, and shows a semiconductor device according to a tenth preferred embodiment of the present invention.

FIG. 34 is a cross-sectional view of a part corresponding to FIG. 9, and shows a semiconductor device 169 according to a tenth preferred embodiment of the present invention. Hereinafter, the same reference sign is given to a structural component corresponding to that of the semiconductor device 1, and a description of this structural component is omitted.

Referring to FIG. 34, in this embodiment, the diode region 9 according to the semiconductor device 169 does not have the anode separation structure 63. In this embodiment, a plurality of the anode regions 62 are formed with intervals between the anode regions 62 along the first direction X in plan view.

The plurality of anode regions 62 face each other in a lateral direction parallel to the first main surface 3 with regions, each of which is apart of the semiconductor layer 2, between the anode regions 62. In this embodiment, the plurality of anode openings 84 are formed in the interlayer insulating layer 80. The plurality of anode openings 84 expose the plurality of anode regions 62 in a one-on-one relationship.

More specifically, each of the anode openings 84 passes through the interlayer insulating layer 80 and through the main surface insulating layer 79, and exposes the anode region 62. Each of the anode openings 84 is formed such that its opening width narrows from its opening side toward its bottom wall side.

More specifically, each of the anode openings 84 has a wide portion and a narrow portion. The wide portion of each of the anode openings 84 is formed in the second interlayer insulating layer 82. The narrow portion of each of the anode openings 84 has an opening width smaller than the wide portion. The narrow portion of each of the anode openings 84 is formed in the first interlayer insulating layer 81. The emitter terminal electrode 13 is electrically connected to the plurality of anode regions 62 in the plurality of anode openings 84.

As described above, the semiconductor device 169 also makes it possible to bring about the same effect as the effect mentioned concerning the semiconductor device 1.

Figure 35:
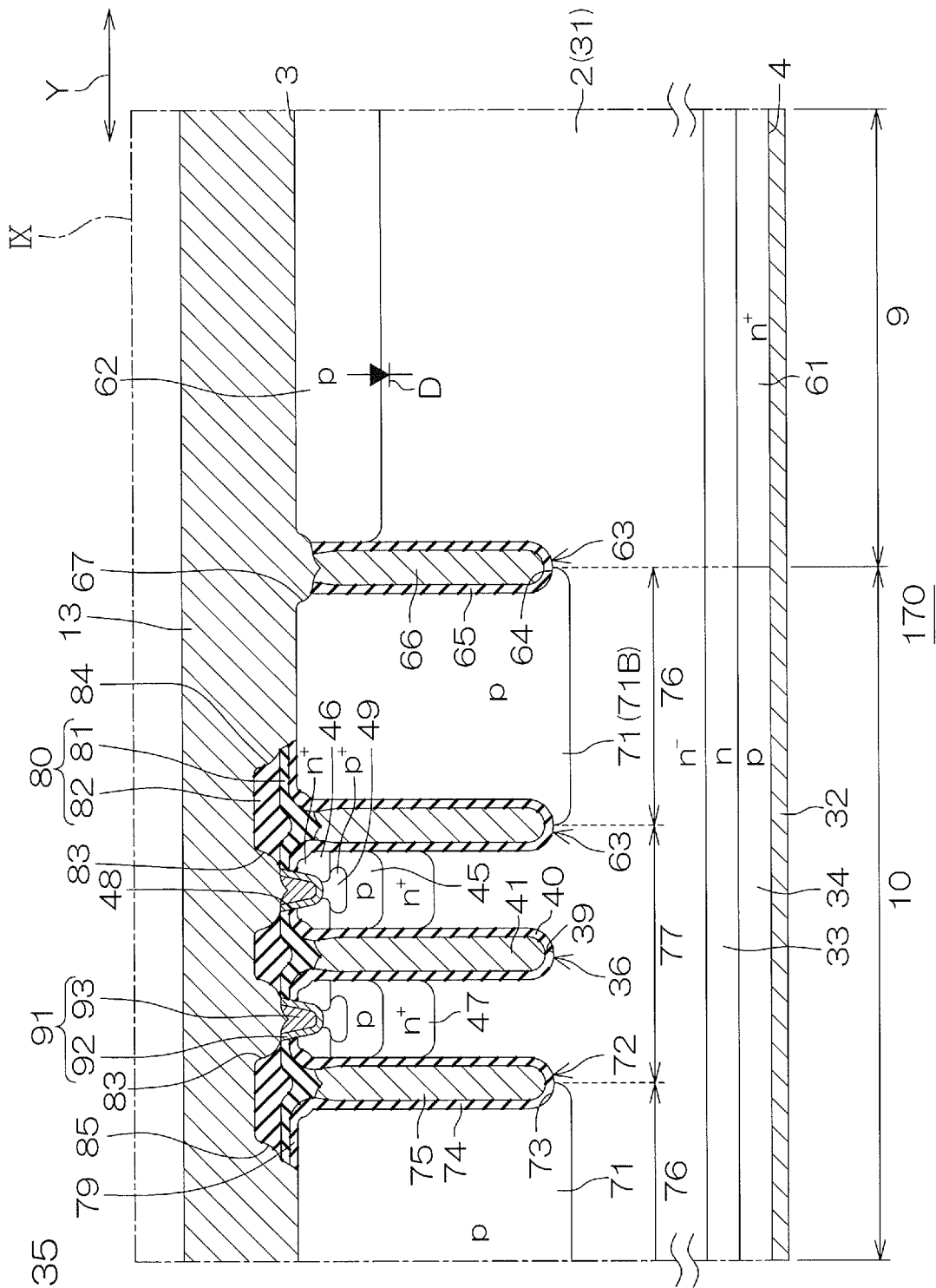
FIG. 35 is a cross-sectional view of a part corresponding to FIG. 9, and shows a semiconductor device according to an eleventh preferred embodiment of the present invention.

FIG. 35 is a cross-sectional view of a part corresponding to FIG. 9, and shows a semiconductor device 170 according to an eleventh preferred embodiment of the present invention. Hereinafter, the same reference sign is given to a structural component corresponding to that of the semiconductor device 1, and a description of this structural component is omitted.

Referring to FIG. 35, the diode region 9 according to the semiconductor device 170 includes a single anode region 62. The single anode region 62 is divided from the adjoining boundary region 10 by the anode separation structure 63.

As described above, the semiconductor device 170 also makes it possible to bring about the same effect as the effect mentioned concerning the semiconductor device 1.

Figure 36:
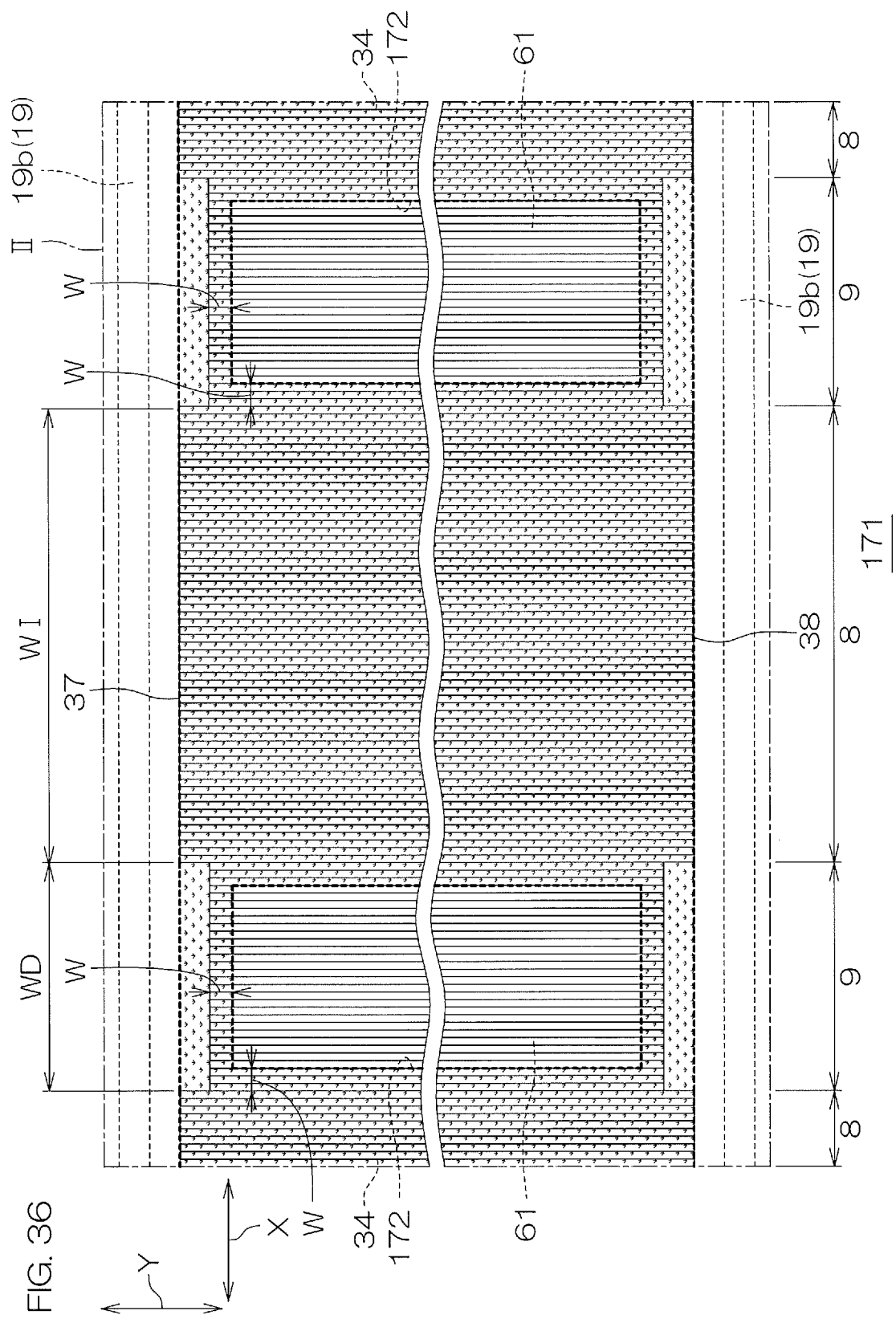
FIG. 36 is a plan view of a part corresponding to FIG. 2, and shows a semiconductor device according to a twelfth preferred embodiment of the present invention.
Figure 37:
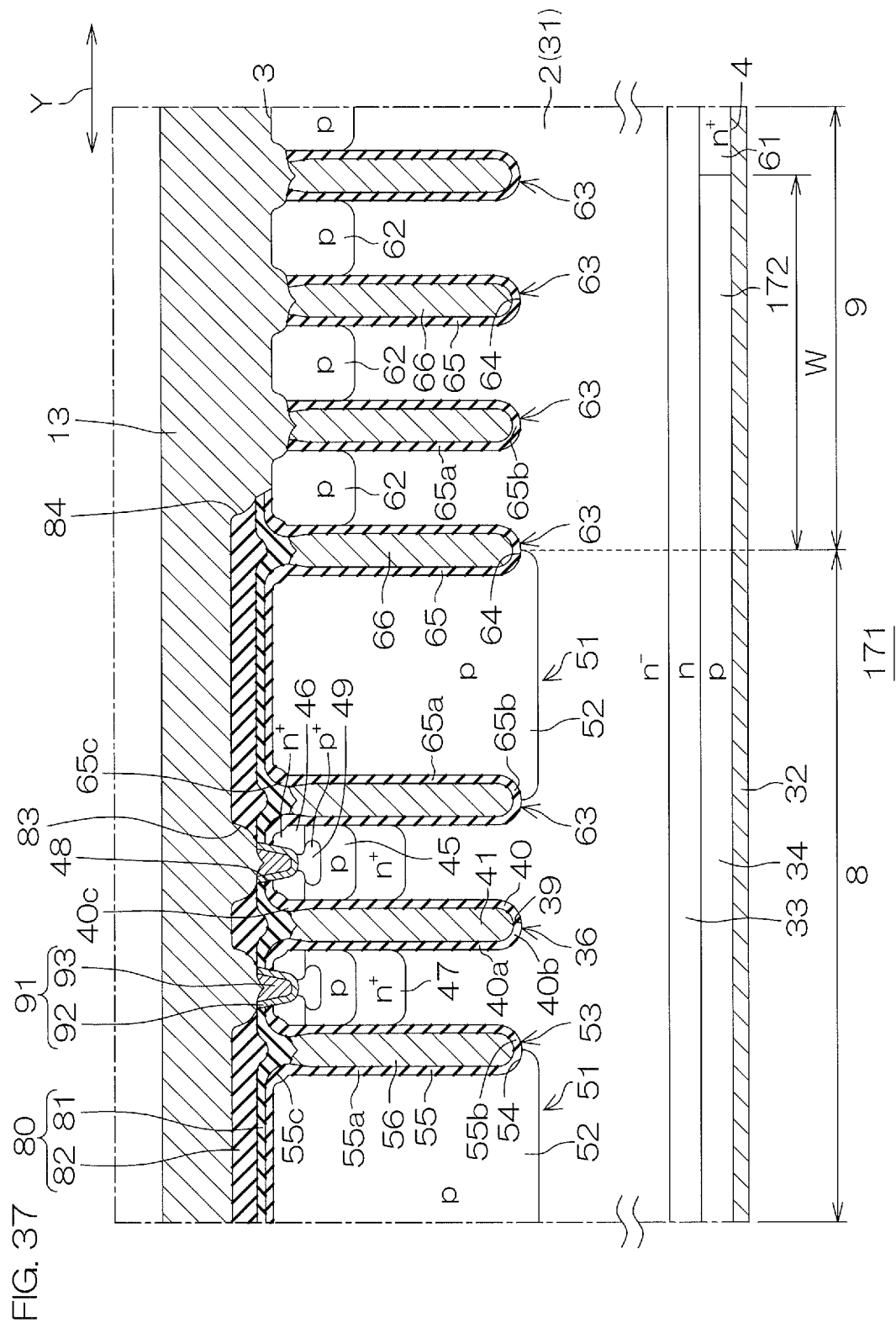
FIG. 37 is a cross-sectional view of a part corresponding to FIG. 9, and is a cross-sectional view to describe a structure of the semiconductor device shown in FIG. 36.

FIG. 36 is a plan view of a part corresponding to FIG. 2, and shows a semiconductor device 171 according to a twelfth preferred embodiment of the present invention. FIG. 37 is a cross-sectional view of a part corresponding to FIG. 9, and is a cross-sectional view to describe a structure of the semiconductor device 171 shown in FIG. 36. Hereinafter, the same reference sign is given to a structural component corresponding to that of the semiconductor device 1, and a description of this structural component is omitted. The collector region 34 formed in the surface layer portion of the second main surface 4 is shown by dot hatching in FIG. 36.

Figure 38:
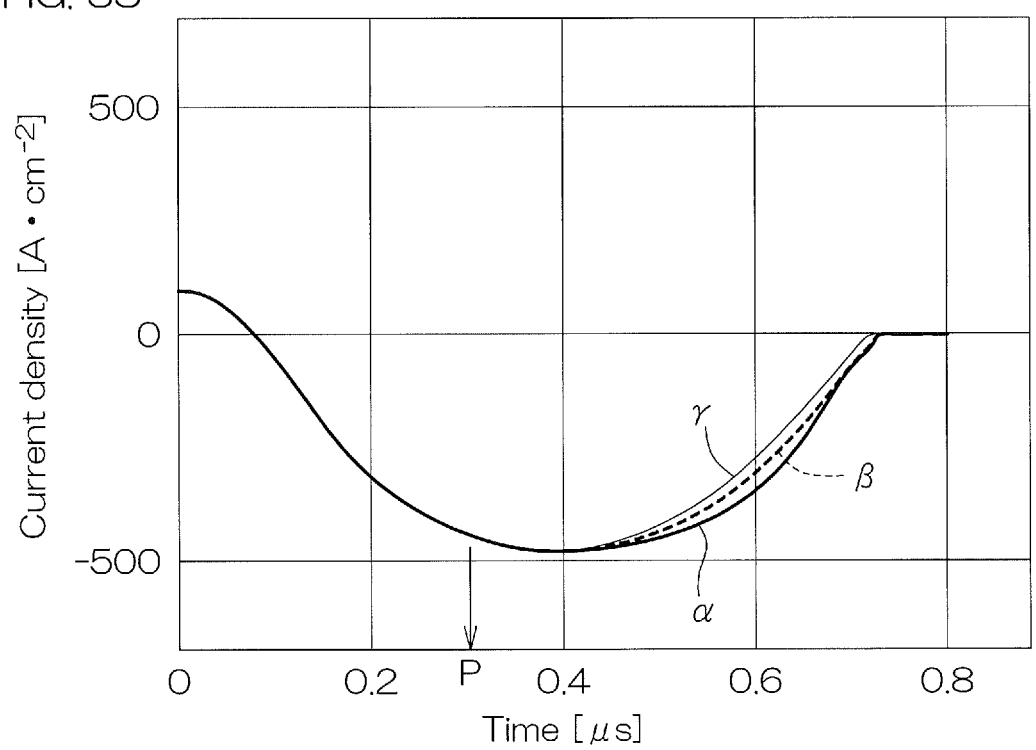
FIG. 38 is a graph in which the reverse recovery characteristic of a pn junction diode has been examined by simulation.

Referring to FIG. 36 to FIG. 38, the semiconductor device 171 does not include the boundary region 10 in this embodiment. In other words, the RC-IGBT array 12 includes the IGBT region 8 and the diode region 9 arranged along the first direction X in this embodiment.

More specifically, the RC-IGBT array 12 has a loop sequence that repeatedly includes the IGBT region 8, the diode region 9, the IGBT region 8, the diode region 9, . . . that are arranged in a line along the first direction X.

In the active region 6, a plurality (in this embodiment, six) of the RC-IGBT arrays 12 having the thus formed structure are formed with intervals between the RC-IGBT arrays 12 in the second direction Y (also see FIG. 1). The RC-IGBT array 12 has a starting point positioned on the lateral surface 5B side and an ending point positioned on the lateral surface 5D side. The starting point of the RC-IGBT array 12 may be the IGBT region 8 or the diode region 9. The ending point of the RC-IGBT array 12 may be the IGBT region 8 or the diode region 9.

Referring to FIG. 37, each of the IGBT regions 8 includes the collector region 34 formed in the surface layer portion of the second main surface 4. In this embodiment, the collector region 34 crosses a boundary between the IGBT region 8 and the diode region 9, and is led out from the IGBT region 8 to the diode region 9. In other words, the collector region 34 includes a lead-out collector region 172 that is led out from the IGBT region 8 to the diode region 9 along the first direction X.

In this embodiment, the lead-out collector region 172 is formed in a belt shape extending along a circumferential edge of the diode region 9 in plan view. More specifically, the lead-out collector region 172 is formed in an annular shape surrounding an inward region of the diode region 9 in plan view. Even more specifically, the lead-out collector region 172 is formed in an endless shape surrounding an inward region of the diode region 9 in plan view.

In the surface layer portion of the second main surface 4 in the diode region 9, the cathode region 61 is formed in a region other than the lead-out collector region 172. In other words, in this embodiment, the cathode region 61 is surrounded by the collector region 34 (the lead-out collector region 172) in the diode region 9.

The lead-out collector region 172 overlaps the diode region 9 with a predetermined overlapping width W in plan view. The starting point of the overlapping width W is set at the boundary between the IGBT region 8 and the diode region 9. In this embodiment, the starting point of the overlapping width W is set at a central portion of the anode separation trench 64 that becomes closest to the IGBT region 8 and that comes into contact with the anode region 62. The ending point of the overlapping width W is set at the boundary between the lead-out collector region 172 and the cathode region 61.

The ratio W/WD of the overlapping width W with respect to the width WD of the diode region 9 may be not less than 0.001 and not more than 0.5. The ratio W/WD may be not less than 0.001 and not more than 0.01, not less than 0.01 and not more than 0.05, not less than 0.05 and not more than 0.1, not less than 0.1 and not more than 0.15, not less than 0.15 and not more than 0.2, not less than 0.2 and not more than 0.25, not less than 0.25 and not more than 0.3, not less than 0.3 and not more than 0.35, not less than 0.35 and not more than 0.4, not less than 0.4 and not more than 0.45, or not less than 0.45 and not more than 0.5.

The overlapping width W may be not less than 1 μm and not more than 200 μm. The overlapping width W may be not less than 1 μm and not more than 50 μm, not less than 50 μm and not more than 100 μm, not less than 100 μm and not more than 150 μm, or not less than 150 μm and not more than 200 μm. The overlapping width W may be not less than 1 μm and not more than 20 μm, not less than 20 μm and not more than 40 μm, not less than 40 μm and not more than 60 μm, not less than 60 μm and not more than 80 μm, not less than 80 μm and not more than 100 μm, not less than 100 μm and not more than 120 μm, not less than 120 μm and not more than 140 μm, not less than 140 μm and not more than 160 μm, not less than 160 μm and not more than 180 μm, or not less than 180 μm and not more than 200 μm.

The overlapping width W may be not less than 1 μm and not more than 10 μm, not less than 10 μm and not more than 20 μm, not less than 20 μm and not more than 30 μm, not less than 30 μm and not more than 40 μm, not less than 40 μm and not more than 50 μm, not less than 50 μm and not more than 60 μm, not less than 60 μm and not more than 70 μm, not less than 70 μm and not more than 80 μm, not less than 80 μm and not more than 90 μm, not less than 90 μm and not more than 100 μm, not less than 100 μm and not more than 110 μm, not less than 110 μm and not more than 120 μm, not less than 120 μm and not more than 130 μm, not less than 130 μm and not more than 140 μm, not less than 140 μm and not more than 150 μm, not less than 150 μm and not more than 160 μm, not less than 160 μm and not more than 170 μm, not less than 170 μm and not more than 180 μm, not less than 180 μm and not more than 190 μm, or not less than 190 μm and not more than 200 μm.

Preferably, the lead-out collector region 172 faces at least one anode region 62 with respect to the normal direction Z. The lead-out collector region 172 may face one, two, three, four, five, six, seven, eight, nine, ten, eleven, twelve, thirteen, fourteen, fifteen, sixteen, seventeen, eighteen, nineteen, or twenty anode regions 62.

Preferably, the lead-out collector region 172 faces at least one anode separation trench 64 with respect to the normal direction Z. The lead-out collector region 172 may face one, two, three, four, five, six, seven, eight, nine, ten, eleven, twelve, thirteen, fourteen, fifteen, sixteen, seventeen, eighteen, nineteen, or twenty anode separation trenches 64.

FIG. 38 is a graph in which the reverse recovery characteristic of a pn junction diode D has been examined by simulation. In FIG. 38, the ordinate axis represents a current density [$A \cdot cm^{-2}$], and the abscissa axis represents time [μs].

A first characteristic α, a second characteristic β, and a third characteristic γ are shown in FIG. 38. The first characteristic α shows the reverse recovery current characteristic of the pn junction diode D when the overlapping width W is set at 0 μm. The second characteristic β shows the reverse recovery current characteristic of the pn junction diode D when the overlapping width W is set at 100 μm. The third characteristic γ shows the reverse recovery current characteristic of the pn junction diode D when the overlapping width W is set at 150 μm.

Referring to the first characteristic α, the second characteristic β, and the third characteristic γ, the reverse recovery current of the pn junction diode D became smaller in proportion to an increase in the overlapping width W. Also, the reverse recovery time of the pn junction diode D became shorter in proportion to an increase in the overlapping width W. In other words, the reverse recovery loss became smaller in proportion to an increase in the overlapping width W.

Figure 39A:
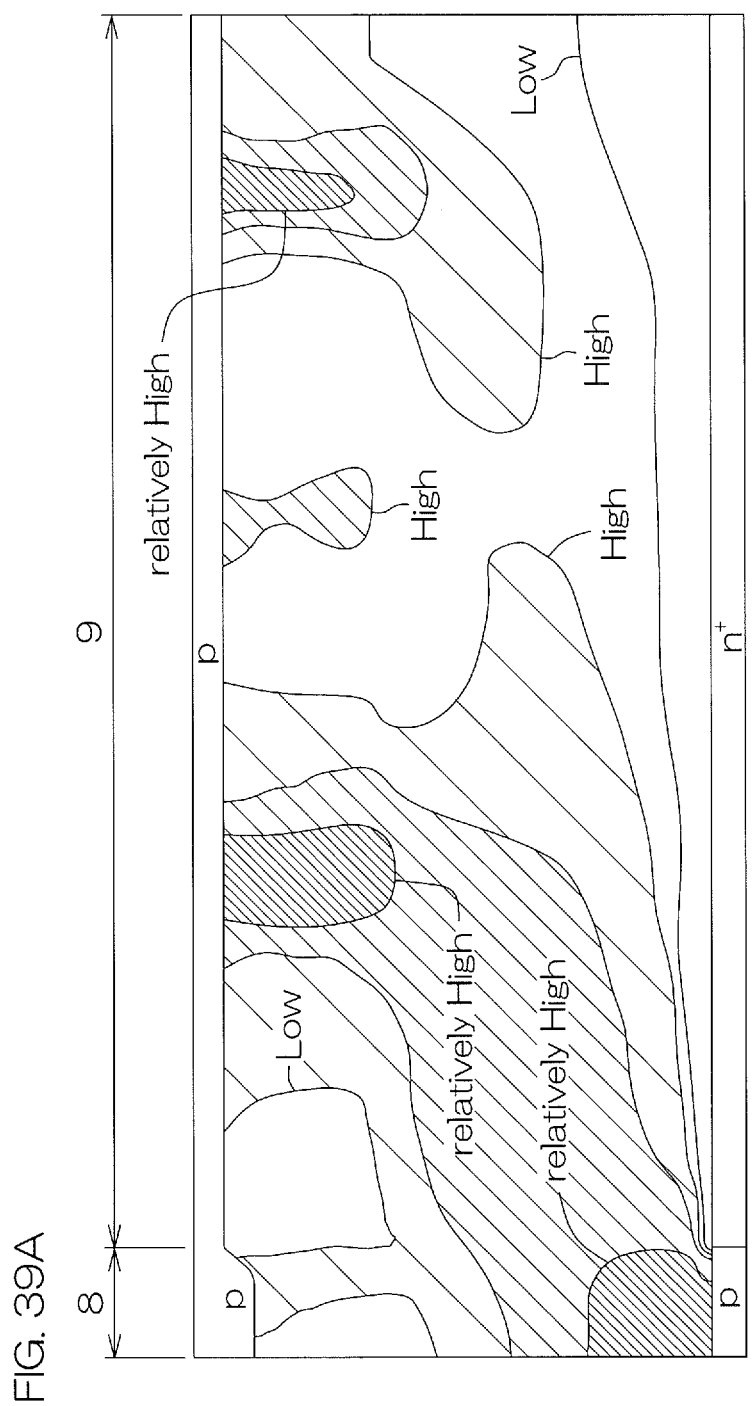
FIG. 39A is a view in which a hole current density has been examined by simulation when the overlapping width W is set at 0 μm.
Figure 39B:
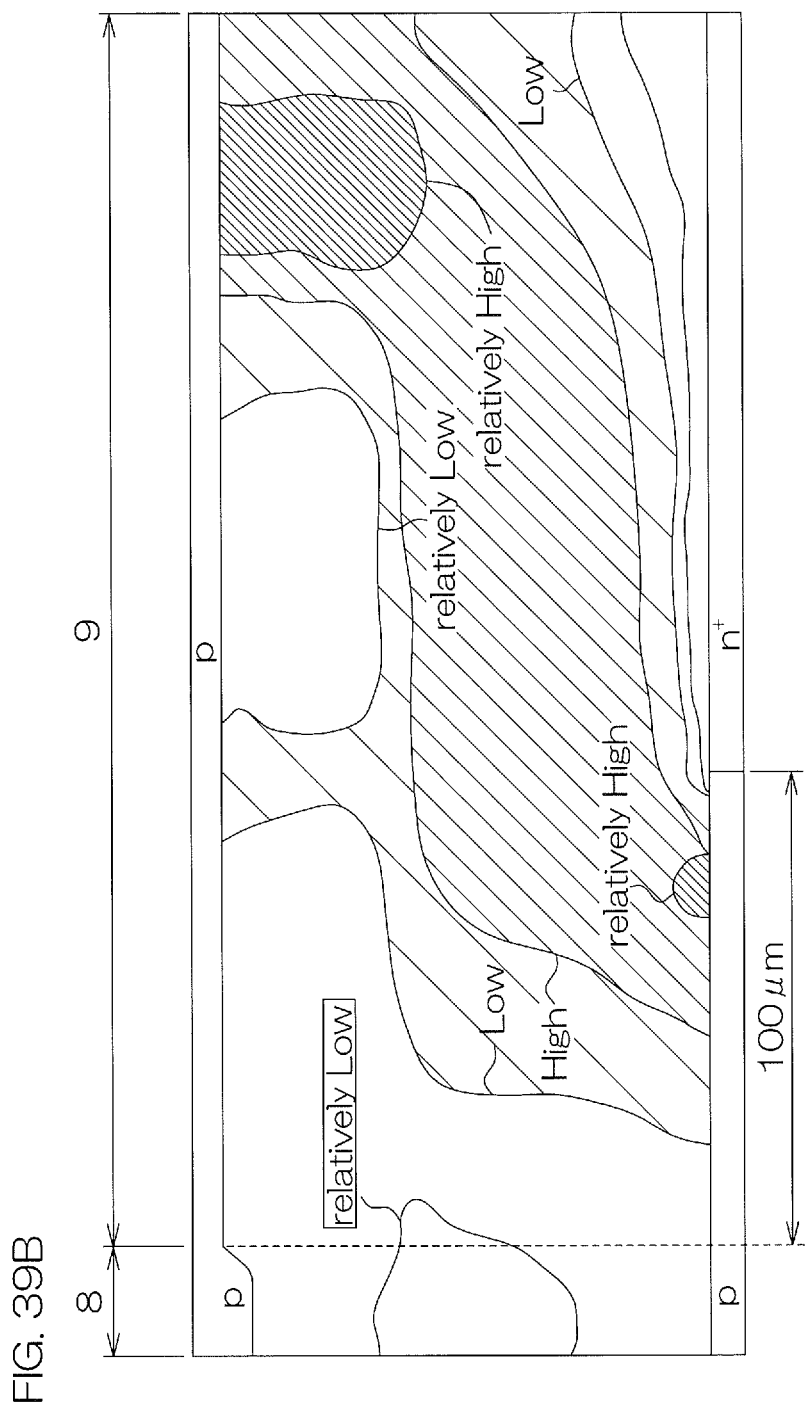
FIG. 39B is a view in which a hole current density has been examined by simulation when the overlapping width W is set at 100 μm.
Figure 39C:
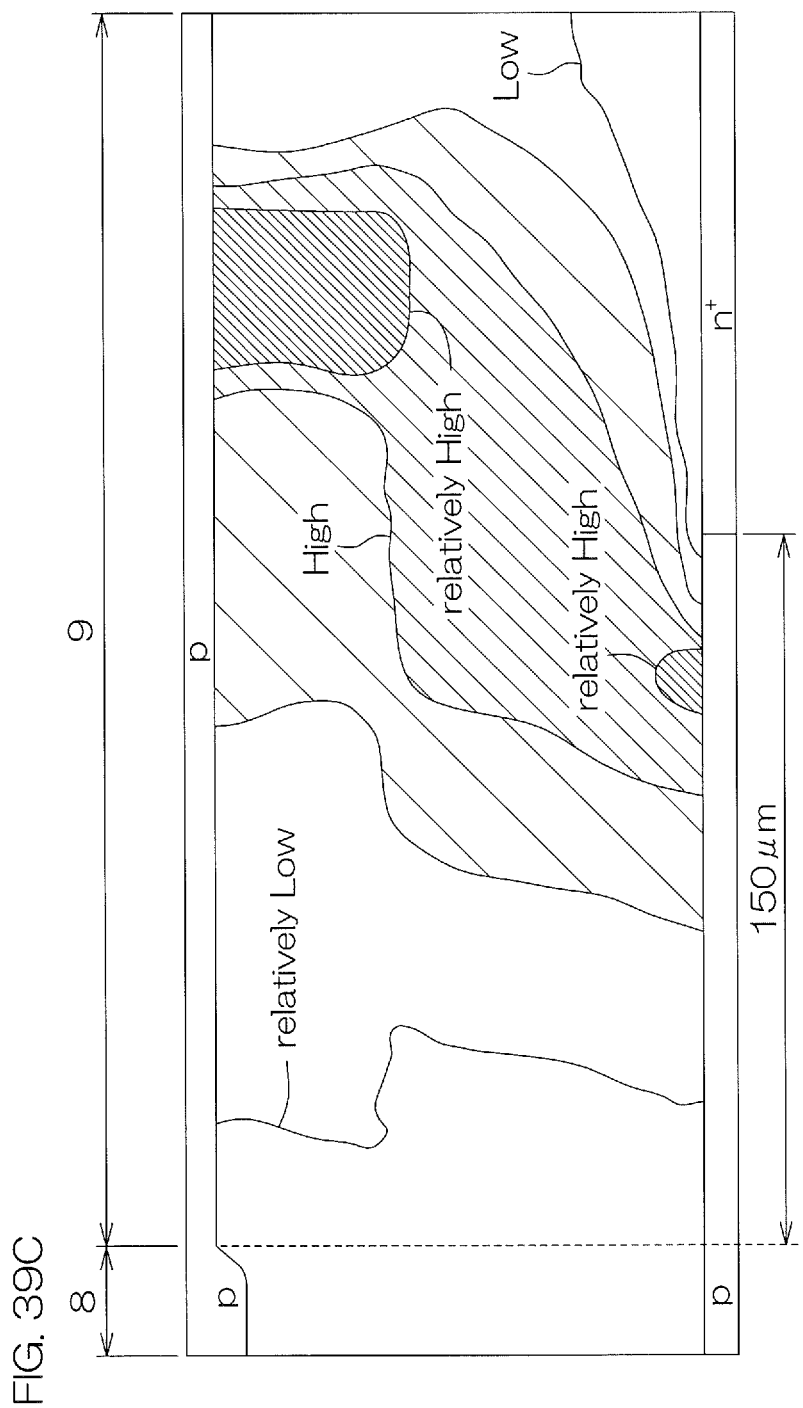
FIG. 39C is a view in which a hole current density has been examined by simulation when the overlapping width W is set at 150 μm.

FIG. 39A to FIG. 39C are views in which a hole current density in the measurement point P shown in FIG. 36 has been examined by simulation when the overlapping width W is set at 0 μm, 100 μm, and 150 μm, respectively. A region having a high density is shown by hatching in FIG. 39A to FIG. 39C.

Referring to FIG. 39A, when the overlapping width W is set at 0 μm, drawn-back holes stagnate near the boundary between the IGBT region 8 and the diode region 9 when the pn junction diode D is operated in a reverse direction. Therefore, a relatively high hole current density is formed near the boundary between the IGBT region 8 and the diode region 9. Particularly in the IGBT region 8 into which the IE structure 51 has been introduced, an increase in the hole current density resulting from holes to be drawn back is remarkably observed near the boundary between the IGBT region 8 and the diode region 9.

Referring to FIG. 39B, when the overlapping width W is set at 100 μm, the hole current density near the boundary between the IGBT region 8 and the diode region 9 becomes smaller than when the overlapping width W is set at 0 μm. The reason for this is that holes injected into the semiconductor layer 2 have decreased near the boundary between the IGBT region 8 and the diode region 9.

Referring to FIG. 39C, when the overlapping width W is set at 150 μm, the hole current density near the boundary between the IGBT region 8 and the diode region 9 became even smaller than when the overlapping width W is set at 100 μm.

As described above, according to the semiconductor device 171, each of the IGBT regions 8 includes the collector region 34 that crosses the boundary between the IGBT region 8 and the diode region 9 and that is led out from the IGBT region 8 to the diode region 9 in the surface layer portion of the second main surface 4. In other words, the collector region 34 includes the lead-out collector region 172 led out from the IGBT region 8 to the diode region 9 along the first direction X. The cathode region 61 of the diode region 9 is formed in a region other than the lead-out collector region 172 in the surface layer portion of the second main surface 4.

Hence, it is possible to reduce the density of holes near the boundary between the diode region 9 and the boundary region 10 when the pn junction diode D performs a reverse recovery operation. As a result, it is possible to restrain the stagnation of holes near the boundary between the diode region 9 and the boundary region 10, and therefore it is possible to restrain the reverse recovery current of the pn junction diode D. Therefore, it is possible to reduce the reverse recovery loss.

Also, according to the semiconductor device 171, the lead-out collector region 172 is formed in a belt shape along the circumferential edge of the diode region 9 near the boundary between the IGBT region 8 and the diode region 9 in plan view. This makes it possible to appropriately reduce the hole current density near the boundary between the IGBT region 8 and the diode region 9.

Also, the lead-out collector region 172 is formed in an annular shape surrounding the inward region of the diode region 9 in plan view. This makes it possible to appropriately restrain an undesired increase in the hole current density in the circumferential edge of the diode region 9.

Figure 40:
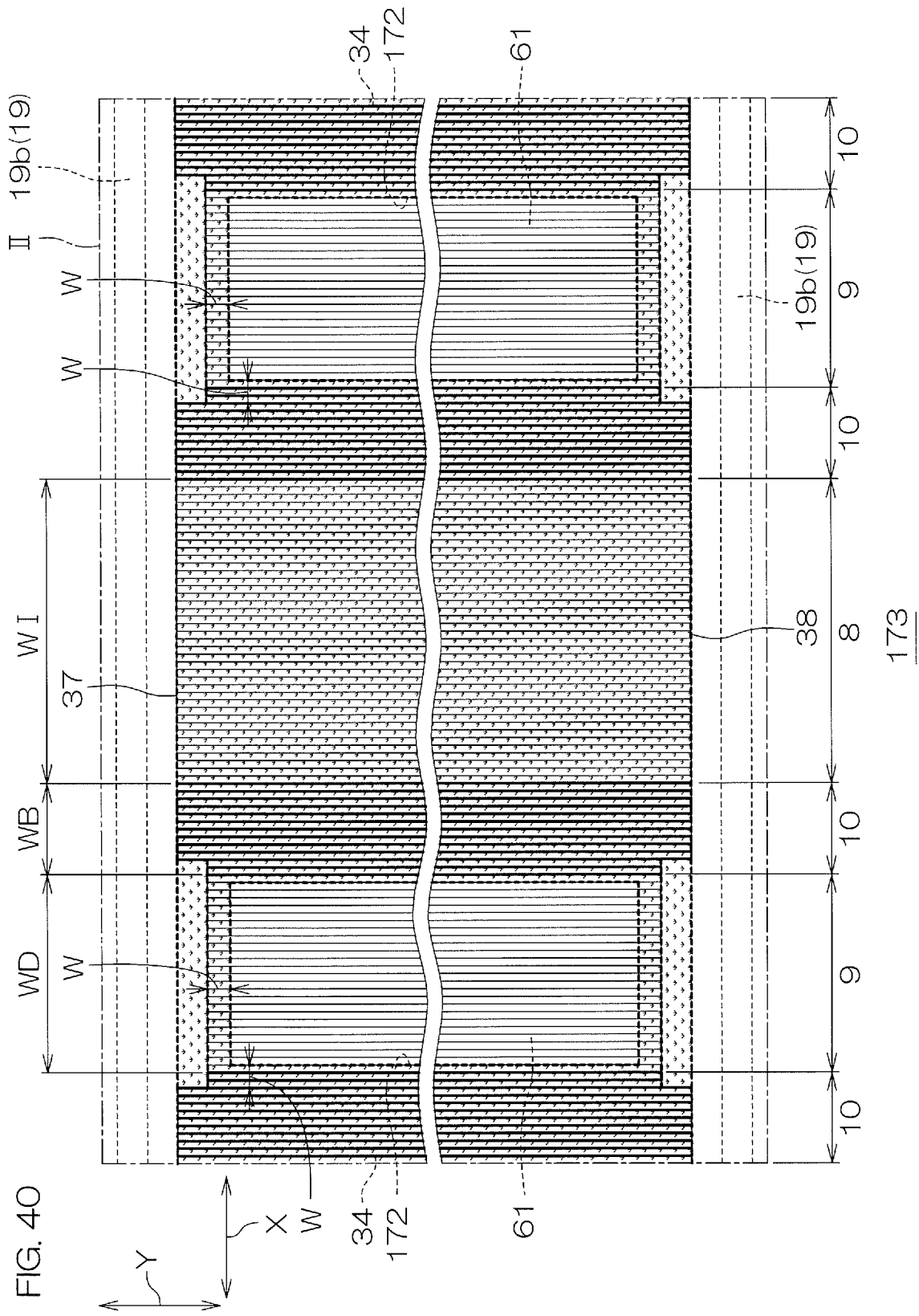
FIG. 40 is a plan view of a part corresponding to FIG. 2, and shows a semiconductor device according to a thirteenth preferred embodiment of the present invention.
Figure 41:
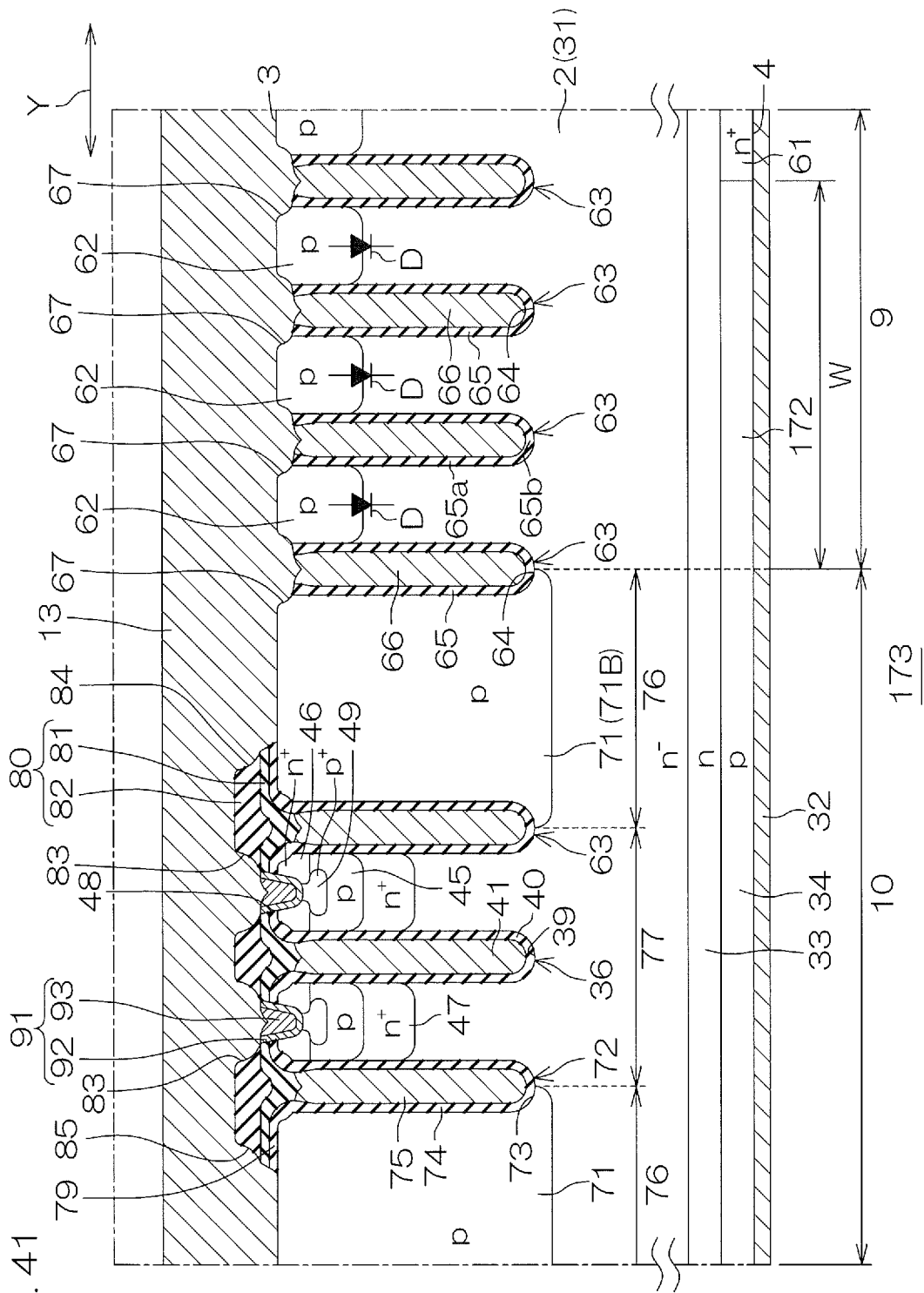
FIG. 41 is a cross-sectional view of a part corresponding to FIG. 9, and is a cross-sectional view to describe a structure of the semiconductor device shown in FIG. 40.

FIG. 40 is a plan view of a part corresponding to FIG. 2, and shows a semiconductor device 173 according to a thirteenth preferred embodiment of the present invention. FIG. 41 is a cross-sectional view of a part corresponding to FIG. 9, and is a cross-sectional view to describe a structure of the semiconductor device 173 shown in FIG. 40. Hereinafter, the same reference sign is given to a structural component corresponding to that of the semiconductor device 1, and a description of this structural component is omitted. The collector region 34 formed in the surface layer portion of the second main surface 4 is shown by dot hatching in FIG. 40.

Referring to FIG. 40 and FIG. 41, the semiconductor device 173 has a structure in which the semiconductor device 1 according to the first preferred embodiment and the semiconductor device 171 according to the twelfth preferred embodiment have been combined together.

In this embodiment, the collector region 34 includes the lead-out collector region 172 that crosses the boundary region 10 from the IGBT region 8 along the first direction X and that is led out to the diode region 9.

The lead-out collector region 172 faces all of the well regions 71 in the normal direction Z in the boundary region 10. Also, the lead-out collector region 172 faces all of the well separation trenches 73 in the normal direction Z. Also, the lead-out collector region 172 faces all of the boundary FET structures 77 in the normal direction Z.

The lead-out collector region 172 is formed in a belt shape along the circumferential edge of the diode region 9 in plan view. More specifically, the lead-out collector region 172 is formed in an annular shape surrounding the inward region of the diode region 9 in plan view. Even more specifically, the lead-out collector region 172 is formed in an endless shape surrounding the inward region of the diode region 9 in plan view.

In the surface layer portion of the second main surface 4 in the diode region 9, the cathode region 61 is formed in a region other than the lead-out collector region 172. In other words, in this embodiment, the cathode region 61 is surrounded by the collector region 34 (the lead-out collector region 172) in the diode region 9.

The lead-out collector region 172 overlaps the diode region 9 with a predetermined overlapping width W in plan view. In this embodiment, the starting point of the overlapping width W is set at the boundary between the boundary region 10 and the diode region 9. In this embodiment, the starting point of the overlapping width W is set at the central portion of the anode separation trench 64 that becomes closest to the boundary region 10 and that comes into contact with the anode region 62. The ending point of the overlapping width W is set at the boundary between the lead-out collector region 172 and the cathode region 61.

The ratio W/WD of the overlapping width W with respect to the width WD of the diode region 9 may be not less than 0.001 and not more than 0.5. The ratio W/WD may be not less than 0.001 and not more than 0.01, not less than 0.01 and not more than 0.05, not less than 0.05 and not more than 0.1, not less than 0.1 and not more than 0.15, not less than 0.15 and not more than 0.2, not less than 0.2 and not more than 0.25, not less than 0.25 and not more than 0.3, not less than 0.3 and not more than 0.35, not less than 0.35 and not more than 0.4, not less than 0.4 and not more than 0.45, or not less than 0.45 and not more than 0.5.

The overlapping width W may be not less than 1 μm and not more than 200 μm. The overlapping width W may be not less than 1 μm and not more than 50 μm, not less than 50 μm and not more than 100 μm, not less than 100 μm and not more than 150 μm, or not less than 150 μm and not more than 200 μm. The overlapping width W may be not less than 1 μm and not more than 20 μm, not less than 20 μm and not more than 40 μm, not less than 40 μm and not more than 60 μm, not less than 60 μm and not more than 80 μm, not less than 80 μm and not more than 100 μm, not less than 100 μm and not more than 120 μm, not less than 120 μm and not more than 140 μm, not less than 140 μm and not more than 160 μm, not less than 160 μm and not more than 180 μm, or not less than 180 μm and not more than 200 μm.

The overlapping width W may be not less than 1 μm and not more than 10 μm, not less than 10 μm and not more than 20 μm, not less than 20 μm and not more than 30 μm, not less than 30 μm and not more than 40 μm, not less than 40 μm and not more than 50 μm, not less than 50 μm and not more than 60 μm, not less than 60 μm and not more than 70 μm, not less than 70 μm and not more than 80 μm, not less than 80 μm and not more than 90 μm, not less than 90 μm and not more than 100 μm, not less than 100 μm and not more than 110 μm, not less than 110 μm and not more than 120 μm, not less than 120 μm and not more than 130 μm, not less than 130 μm and not more than 140 μm, not less than 140 μm and not more than 150 μm, not less than 150 μm and not more than 160 μm, not less than 160 μm and not more than 170 μm, not less than 170 μm and not more than 180 μm, not less than 180 μm and not more than 190 μm, or not less than 190 μm and not more than 200 μm.

Preferably, the lead-out collector region 172 faces at least one anode region 62 in the normal direction Z. The lead-out collector region 172 may face one, two, three, four, five, six, seven, eight, nine, ten, eleven, twelve, thirteen, fourteen, fifteen, sixteen, seventeen, eighteen, nineteen, or twenty anode regions 62.

Preferably, the lead-out collector region 172 faces at least one anode separation trench 64 in the normal direction Z. The lead-out collector region 172 may face one, two, three, four, five, six, seven, eight, nine, ten, eleven, twelve, thirteen, fourteen, fifteen, sixteen, seventeen, eighteen, nineteen, or twenty anode separation trenches 64.

As described above, according to the semiconductor device 173, it is possible to fulfill the effect mentioned concerning the semiconductor device 1 according to the first preferred embodiment. Also, according to the semiconductor device 173, it is also possible to fulfill the effect mentioned concerning the semiconductor device 171 according to the twelfth preferred embodiment.

In other words, according to the semiconductor device 173, it is possible to swiftly discharge holes existing in the boundary region 10 by the well region 71 when the pn junction diode D performs a reverse recovery operation. This makes it possible to restrain the stagnation of holes in the boundary region 10, and hence it is possible to restrain a reverse recovery current. As a result, it is possible to reduce the reverse recovery loss.

Also, according to the semiconductor device 173, the collector region 34 includes the lead-out collector region 172 that crosses the boundary region 10 from the IGBT region 8 along the first direction X and that is led out to the diode region 9. Hence, it is possible to reduce the density of holes near the boundary between the diode region 9 and the boundary region 10 when the pn junction diode D performs a reverse recovery operation. As a result, it is possible to restrain the stagnation of holes near the boundary between the diode region 9 and the boundary region 10, and therefore it is possible to restrain the reverse recovery current. Therefore, it is possible to reduce the reverse recovery loss.

In this embodiment, a structure in which the lead-out collector region 172 is combined with the semiconductor device 1 according to the first preferred embodiment has been described. However, the lead-out collector region 172 may be combined with the semiconductor device 165 according to the sixth preferred embodiment. Also, the lead-out collector region 172 may be combined with the semiconductor device 166 according to the seventh preferred embodiment.

Also, the lead-out collector region 172 may be combined with the semiconductor device 167 according to the eighth preferred embodiment. Also, the lead-out collector region 172 may be combined with the semiconductor device 168 according to the ninth preferred embodiment.

Also, the lead-out collector region 172 may be combined with the semiconductor device 169 according to the tenth preferred embodiment. Also, the lead-out collector region 172 may be combined with the semiconductor device 170 according to the eleventh preferred embodiment.

Figure 42:
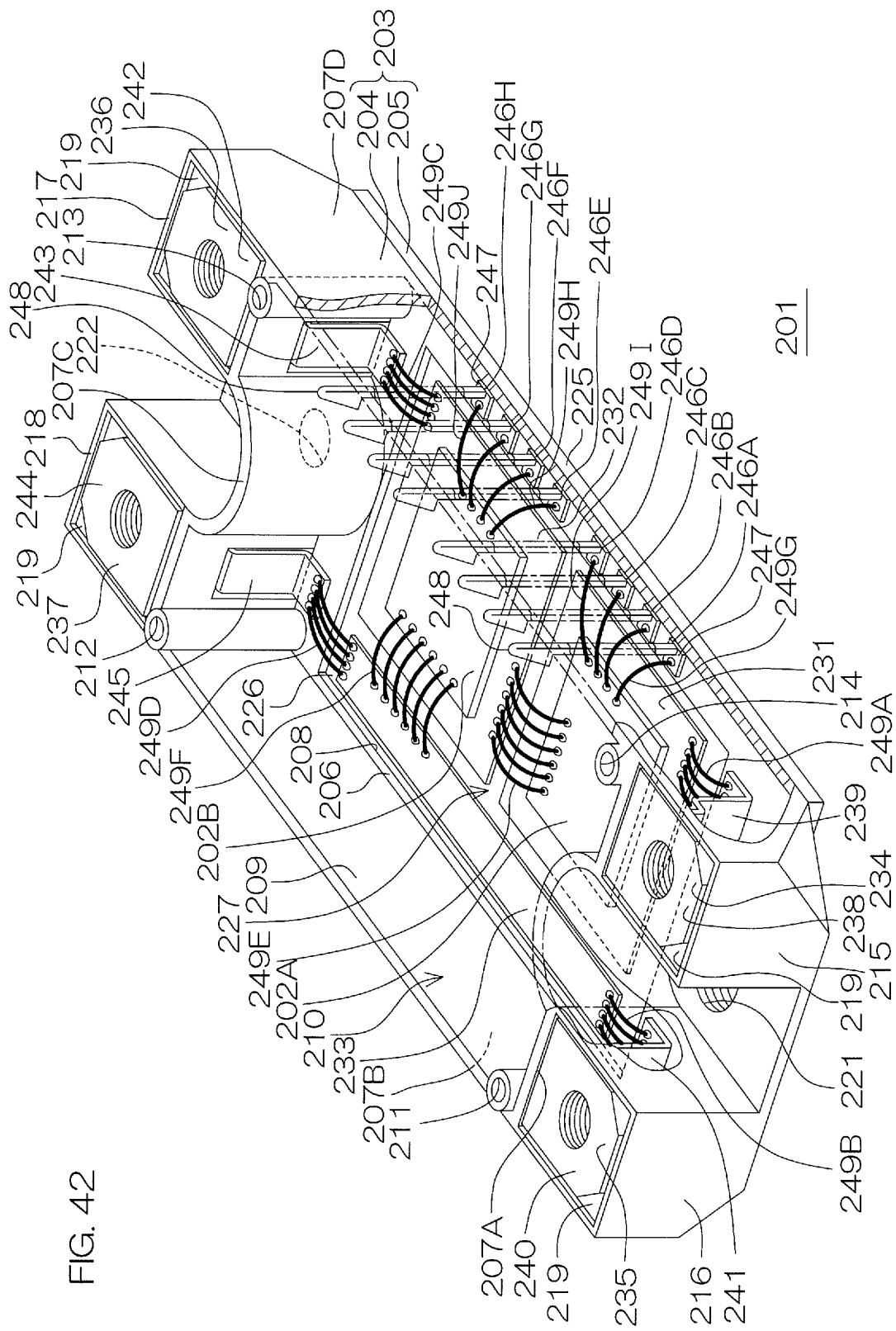
FIG. 42 is a perspective view showing one configuration example of a semiconductor module into which a semiconductor device has been incorporated.

FIG. 42 is a perspective view showing one configuration example of a semiconductor module 201.

Referring to FIG. 42, one or two or more semiconductor chips 202 are incorporated into the semiconductor module 201. In this embodiment, the semiconductor module 201 has a structure in which two semiconductor chips 202 are incorporated thereinto. In the following description, for convenience, the two semiconductor chips 202 are referred to as a first semiconductor chip 202A and a second semiconductor chip 202B, respectively.

Any one of the semiconductor devices 1, 161, 162, 163, 164, 165, 166, 167, 168, 169, 170, 171, and 173 according to the first to thirteenth preferred embodiments is applied to the first semiconductor chip 202A. Any one of the semiconductor devices 1, 161, 162, 163, 164, 165, 166, 167, 168, 169, 170, 171, and 173 according to the first to thirteenth preferred embodiments is applied to the second semiconductor chip 202B.

The semiconductor module 201 includes a housing 203 that houses the first semiconductor chip 202A and the second semiconductor chip 202B. The housing 203 includes a resin case 204 and a support substrate 205. The support substrate 205 is a substrate by which the first semiconductor chip 202A and the second semiconductor chip 202B are supported.

The resin case 204 includes a bottom wall 206 and side walls 207A, 207B, 207C, and 207D. The bottom wall 206 is formed in a quadrangular shape (in this embodiment, a rectangular shape) in plan view seen from its normal direction.

A through-hole 208 is formed in the bottom wall 206. The through-hole 208 is formed in a region away from a circumferential edge to the inward region in the bottom wall 206. In this embodiment, the through-hole 208 is formed in a quadrangular shape (in this embodiment, a rectangular shape) in plan view.

The side walls 207A to 207D are erected from the circumferential edge of the bottom wall 206 to the side opposite to the bottom wall 206. The side wall 207A and the side wall 207C extend along the lateral direction of the bottom wall 206, and face the longitudinal direction of the bottom wall 206. The side wall 207B and the side wall 207D extend along the longitudinal direction of the bottom wall 206, and face the lateral direction of the bottom wall 206. The side walls 207A to 207D define an opening 209 on the side opposite to the bottom wall 206. The side walls 207A to 207D define an internal space 210 with the bottom wall 206.

Bolt through-holes 211, 212, 213, and 214 are formed in four corners of the internal space 210, respectively. The internal space 210 is closed with a lid member not shown. The lid member is bolt-fixed to the bolt through-holes 211, 212, 213, and 214.

The resin case 204 includes a plurality of terminal support portions 215, 216, 217, and 218. In this embodiment, the plurality of terminal support portions 215 to 218 include a first terminal support portion 215, a second terminal support portion 216, a third terminal support portion 217, and a fourth terminal support portion 218.

The first terminal support portion 215 and the second terminal support portion 216 are attached to an outer wall of the side wall 207A. In this embodiment, the first terminal support portion 215 and the second terminal support portion 216 are formed integrally with the outer wall of the side wall 207A. The first terminal support portion 215 and the second terminal support portion 216 are formed with an interval between the first and second terminal support portions 215 and 216 in the lateral direction. The first terminal support portion 215 and the second terminal support portion 216 are formed in a block shape. The first terminal support portion 215 and the second terminal support portion 216 protrude outwardly in the longitudinal direction from the outer wall of the side wall 207A.

The third terminal support portion 217 and the fourth terminal support portion 218 are attached to an outer wall of the side wall 207C. In this embodiment, the third terminal support portion 217 and the fourth terminal support portion 218 are formed integrally with the outer wall of the side wall 207C. The third terminal support portion 217 and the fourth terminal support portion 218 are formed with an interval between the third and fourth terminal support portions 217 and 218 in the lateral direction. The third terminal support portion 217 and the fourth terminal support portion 218 are formed in a block shape. The third terminal support portion 217 and the fourth terminal support portion 218 protrude outwardly in the longitudinal direction from the outer wall of the side wall 207C.

The first terminal support portion 215, the second terminal support portion 216, the third terminal support portion 217, and the fourth terminal support portion 218 each have a supporting wall 219. The supporting wall 219 is positioned in a region closer to the opening 209 than the bottom wall 206. Each of the supporting walls 219 is formed in a quadrangular shape in plan view.

A first bolt through-hole 221 is formed in a region between the first terminal support portion 215 and the second terminal support portion 216. A second bolt through-hole 222 is formed in a region between the third terminal support portion 217 and the fourth terminal support portion 218.

The support substrate 205 includes a heat dissipation plate 225, an insulating material 226, and a circuit portion 227. The support substrate 205 is attached to an outer surface of the resin case 204 such that the circuit portion 227 is exposed from the through-hole 208 of the bottom wall 206. The support substrate 205 may be attached to the outer surface of the resin case 204 by bonding the heat dissipation plate 225 to the outer surface of the resin case 204.

The heat dissipation plate 225 may be a metallic plate. The heat dissipation plate 225 may be an insulation plate covered with a metal film. The heat dissipation plate 225 is formed in a quadrangular shape (in this embodiment, a rectangular shape) in plan view seen from its normal direction.

The insulating material 226 is formed on the heat dissipation plate 225. The insulating material 226 may be a mounting board including an insulating material. The insulating material 226 may be an insulating film formed in a film shape on the heat dissipation plate 225.

The circuit portion 227 is formed on the heat dissipation plate 225 through the insulating material 226. The circuit portion 227 includes a plurality of wirings 231, 232, and 233, the first semiconductor chip 202A, and the second semiconductor chip 202B. In this embodiment, the wirings 231 to 233 include a first collector wiring 231, a second collector wiring 232, and an emitter wiring 233.

The first collector wiring 231 is formed in a plate shape or in a film shape. The first collector wiring 231 is formed in a quadrangular shape in plan view. The first collector wiring 231 is disposed in a region on one side in the longitudinal direction (on the side wall 207A side) and on one side in the lateral direction (on the side wall 207D side) in the heat dissipation plate 225.

The second collector wiring 232 is formed in a plate shape or in a film shape. The second collector wiring 232 is formed in a quadrangular shape in plan view. The second collector wiring 232 is disposed in a region on the other side in the longitudinal direction (on the side wall 207C side) and on one side in the lateral direction (on the side wall 207D side) in the heat dissipation plate 225 away from the first collector wiring 231.

The emitter wiring 233 is formed in a plate shape or in a film shape. The emitter wiring 233 is formed in a quadrangular shape in plan view. The emitter wiring 233 is disposed in a region on the other side in the lateral direction (on the side wall 207B side) in the heat dissipation plate 225 away from the first collector wiring 231 and from the second collector wiring 232. In this embodiment, the emitter wiring 233 is formed in a rectangular shape extending along the longitudinal direction of the heat dissipation plate 225.

The first semiconductor chip 202A is disposed on the first collector wiring 231 in an orientation in which the collector terminal electrode 32 is allowed to face the heat dissipation plate. The collector terminal electrode 32 of the first semiconductor chip 202A is bonded to the first collector wiring 231 through an electroconductive bonding material. The collector terminal electrode 32 of the first semiconductor chip 202A is electrically connected to the first collector wiring 231. The electroconductive bonding material may include solder or electroconductive paste.

The second semiconductor chip 202B is disposed on the second collector wiring 232 in an orientation in which the collector terminal electrode 32 is allowed to face the heat dissipation plate. The collector terminal electrode 32 of the second semiconductor chip 202B is bonded to the second collector wiring 232 through an electroconductive bonding material. The collector terminal electrode 32 of the second semiconductor chip 202B is electrically connected to the second collector wiring 232. The electroconductive bonding material may include solder or electroconductive paste.

The semiconductor module 201 includes a plurality of terminals 234, 235, 236, and 237. The plurality of terminals 234 to 237 include a collector terminal 234, a first emitter terminal 235, a common terminal 236, and a second emitter terminal 237.

The collector terminal 234 is disposed at the first terminal support portion 215. The collector terminal 234 is electrically connected to the first collector wiring 231. The collector terminal 234 includes a first region 238 and a second region 239. The first region 238 of the collector terminal 234 is positioned outside the internal space 210. The second region 239 of the collector terminal 234 is positioned inside the internal space 210.

The first region 238 of the collector terminal 234 is supported by the supporting wall 219 of the first terminal support portion 215. The second region 239 of the collector terminal 234 passes through the side wall 207A from the first region 238, and is led out into the internal space 210. The second region 239 of the collector terminal 234 is electrically connected to the first collector wiring 231.

The first emitter terminal 235 is disposed at the second terminal support portion 216. The first emitter terminal 235 is electrically connected to the emitter wiring 233. The first emitter terminal 235 includes a first region 240 and a second region 241. The first region 240 of the first emitter terminal 235 is positioned outside the internal space 210. The second region 241 of the first emitter terminal 235 is positioned inside the internal space 210.

The first region 240 of the first emitter terminal 235 is supported by the supporting wall 219 of the second terminal support portion 216. The second region 241 of the first emitter terminal 235 passes through the side wall 207A from the first region 240, and is led out into the internal space 210. The second region 241 of the first emitter terminal 235 is electrically connected to the emitter wiring 233.

The common terminal 236 is disposed at the third terminal support portion 217. The common terminal 236 is electrically connected to the second collector wiring 232. The common terminal 236 includes a first region 242 and a second region 243. The first region 242 of the common terminal 236 is positioned outside the internal space 210. The second region 243 of the common terminal 236 is positioned inside the internal space 210.

The first region 242 of the common terminal 236 is supported by the supporting wall 219 of the second terminal support portion 216. The second region 243 of the common terminal 236 passes through the side wall 207C from the first region 240, and is led out into the internal space 210. The second region 243 of the common terminal 236 is electrically connected to the second collector wiring 232.

The second emitter terminal 237 is disposed at the fourth terminal support portion 218. The second emitter terminal 237 is electrically connected to the emitter wiring 233. The second emitter terminal 237 includes a first region 244 and a second region 245. The first region 244 of the second emitter terminal 237 is positioned outside the internal space 210. The second region 245 of the second emitter terminal 237 is positioned inside the internal space 210.

The first region 244 of the second emitter terminal 237 is supported by the supporting wall 219 of the fourth terminal support portion 218. The second region 245 of the second emitter terminal 237 passes through the side wall 207C from the first region 244, and is led out into the internal space 210. The second region 245 of the second emitter terminal 237 is electrically connected to the emitter wiring 233.

The semiconductor module 201 includes a plurality (in this embodiment, six) of side wall terminals 246A to 246H. The plurality of side wall terminals 246A to 246H are disposed with intervals between the side wall terminals 246A to 246H along the side wall 207D in the internal space 210.

The plurality of side wall terminals 246A to 246H each include an internal connection portion 247 and an external connection portion 248. The internal connection portion 247 is disposed at the bottom wall 206. The external connection portion 248 extends from the internal connection portion 247 linearly along the side wall 207D, and is led out to the outside of the internal space 210.

The plurality of side wall terminals 246A to 246H include three side wall terminals 246A to 246D for the first semiconductor chip 202A and three side wall terminals 246E to 246H for the second semiconductor chip 202B.

The side wall terminals 246A to 246D face the first collector wiring 231 along the lateral direction. The side wall terminal 246A is formed as a gate terminal that is connected to the gate terminal electrode 14 of the first semiconductor chip 202A.

The side wall terminals 246B to 246D are respectively formed as terminals connected to the first sense terminal electrode 15, to the second sense terminal electrode 16, and to the current detection terminal electrode 17, of the first semiconductor chip 202A. At least one of the side wall terminals 246B to 246D may be an open terminal.

The side wall terminals 246E to 246H face the second collector wiring 232 along the lateral direction. The side wall terminal 246E is formed as a gate terminal that is connected to the gate terminal electrode 14 of the second semiconductor chip 202B.

The side wall terminals 246F to 246H are respectively formed as terminals connected to the first sense terminal electrode 15, to the second sense terminal electrode 16, and to the current detection terminal electrode 17, of the second semiconductor chip 202B. At least one of the side wall terminals 246F to 246H may be an open terminal.

The semiconductor module 201 includes a plurality of lead wires 249A to 249J. The plurality of lead wires 249A to 249J may each include at least one of gold, silver, copper, and aluminum. The lead wires 249A to 249J may each include a bonding wire. The lead wires 249A to 249J may each include an electroconductive plate.

The plurality of lead wires 249A to 249J include a first lead wire 249A, a second lead wire 249B, a third lead wire 249C, a fourth lead wire 249D, a fifth lead wire 249E, a sixth lead wire 249F, a seventh lead wire 249G, an eighth lead wire 249H, a ninth lead wire 249I, and a tenth lead wire 249J.

The first lead wire 249A connects the collector terminal 234 and the first collector wiring 231 together. The second lead wire 249B connects the first emitter terminal 235 and the emitter wiring 233 together. The third lead wire 249C connects the common terminal 236 and the second collector wiring 232 together.

The fourth lead wire 249D connects the second emitter terminal 237 and the emitter wiring 233 together. The fifth lead wire 249E connects the emitter terminal electrode 13 of the first semiconductor chip 202A and the second collector wiring 232 together. The sixth lead wire 249F connects the emitter terminal electrode 13 of the second semiconductor chip 202B and the emitter wiring 233 together.

The seventh lead wire 249G connects the gate terminal electrode 14 of the first semiconductor chip 202A and the side wall terminal 246A together. The eighth lead wire 249H connects the gate terminal electrode 14 of the second semiconductor chip 202B and the side wall terminal 246E together.

The ninth lead wire 249I connects the first sense terminal electrode 15, the second sense terminal electrode 16, the current detection terminal electrode 17 of the first semiconductor chip 202A and the side wall terminals 246B to 246D together. The tenth lead wire 249J connects the first sense terminal electrode 15, the second sense terminal electrode 16, the current detection terminal electrode 17 of the second semiconductor chip 202B and the side wall terminals 246F to 246H together.

Figure 43:
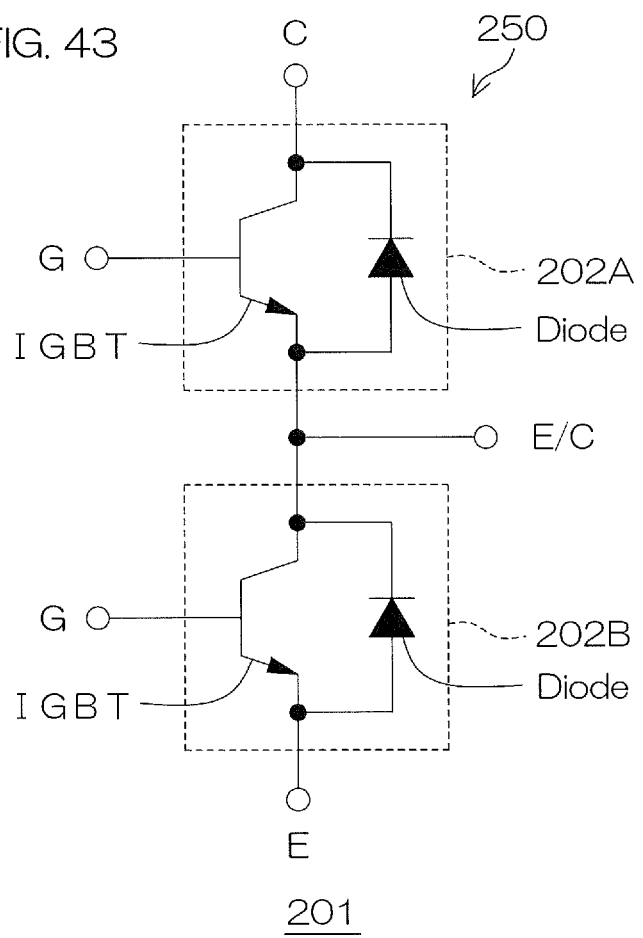
FIG. 43 is a circuit diagram showing an electrical configuration of the semiconductor module shown in FIG. 42.

FIG. 43 is a circuit diagram showing an electrical configuration of the semiconductor module 201 shown in FIG. 42.

Referring to FIG. 43, the semiconductor module 201 includes a half bridge circuit 250. The half bridge circuit 250 includes the first semiconductor chip 202A and the second semiconductor chip 202B. The first semiconductor chip 202A is a constituent of a high-voltage-side arm of the half bridge circuit 250. The second semiconductor chip 202B is a constituent of a low-voltage-side arm of the half bridge circuit 250.

A gate terminal (side wall terminal 246A) is connected to the gate terminal electrode 14 of the first semiconductor chip 202A. The collector terminal 234 is connected to the collector terminal electrode 32 of the first semiconductor chip 202A.

The collector terminal electrode 32 of the second semiconductor chip 202B is connected to the emitter terminal electrode 13 of the first semiconductor chip 202A. The common terminal 236 is connected to a connection portion between the emitter terminal electrode 13 of the first semiconductor chip 202A and the collector terminal electrode 32 of the second semiconductor chip 202B.

A gate terminal (side wall terminal 246D) is connected to the gate terminal electrode 14 of the second semiconductor chip 202B. The first emitter terminal 235 (second emitter terminal 237) is connected to the emitter terminal electrode 13 of the second semiconductor chip 202B.

Agate driver IC, etc., may be connected to the gate terminal electrode 14 of the first semiconductor chip 202A through the gate terminal (side wall terminal 246A). A gate driver IC, etc., may be connected to the gate terminal electrode 14 of the second semiconductor chip 202B through the gate terminal (side wall terminal 246D).

The semiconductor module 201 may be an inverter module that, in a three-phase motor having a U phase, a V phase, and a W phase, drives any one of the U phase, the V phase, and the W phase. An inverter device that drives the three-phase motor may be composed of three semiconductor modules 201 corresponding to the U phase, the V phase, and the W phase of the three-phase motor.

In this case, a DC power source is connected to the collector terminal 234 and the first emitter terminal 235 (second emitter terminal 237) of each of the semiconductor modules 201. Also, any one of the U phase, the V phase, and the W phase of the three-phase motor is connected as a load to the common terminal 236 of each of the semiconductor modules 201. In the inverter device, the first semiconductor chip 202A and the second semiconductor chip 202B are controllably driven by a predetermined switching pattern. Hence, a direct voltage is converted into a three-phase alternating voltage, and the three-phase motor is driven by a sine wave.

The present invention can also be embodied in still other modes.

In each of the preferred embodiments mentioned above, the semiconductor layer 2 may have a laminated structure that includes a p-type semiconductor substrate, instead of the $n^-$-type semiconductor substrate 31, and an $n^-$-type epitaxial layer formed on the semiconductor substrate.

Both the p-type semiconductor substrate and the $n^-$-type epitaxial layer may be made of silicon. The $n^-$-type epitaxial layer is formed by epitaxially growing silicon from a main surface of the p-type semiconductor substrate. In this case, the p-type semiconductor substrate corresponds to the collector region 34. Also, the $n^-$-type epitaxial layer corresponds to a drift region.

In each of the preferred embodiments mentioned above, a structure in which the conductivity type of each semiconductor part has been reversed may be employed. In other words, a p-type part may be formed into an n-type, and an n-type part may be formed into a p-type.

Examples of features extracted from this description and from the drawings will be hereinafter shown.

[Item 1] A semiconductor device comprising: a first-conductivity-type semiconductor layer that includes a first main surface on one side and a second main surface on the other side; a diode region that includes a second-conductivity-type first impurity region formed in a surface layer portion of the first main surface and a first-conductivity-type second impurity region formed in a surface layer portion of the second main surface; an IGBT region that includes an FET structure including a second-conductivity-type body region formed in the first main surface, a first-conductivity-type emitter region formed in a surface layer portion of the body region, and a gate electrode that faces the body region and the emitter region across a gate insulating layer; and a second-conductivity-type collector region formed in the surface layer portion of the second main surface and having a lead-out region that is led out to the diode region.

According to this semiconductor device, it is possible to reduce the density of carriers near the boundary between the IGBT region and the diode region when the diode performs a reverse recovery operation. Hence, it is possible to restrain the stagnation of carriers near the boundary between the IGBT region and the diode region, and therefore it is possible to restrain the reverse recovery current. As a result, it is possible to reduce the reverse recovery loss.

[Item 2] The semiconductor device according to Item 1, further including: a first main surface electrode that is electrically connected to the emitter region and to the first impurity region on the first main surface; and a second main surface electrode that is electrically connected to the collector region and to the second impurity region on the second main surface.

[Item 3] The semiconductor device according to Item 1 or 2, wherein the lead-out region of the collector region faces the first impurity region of the diode region in a normal direction of the first main surface.

[Item 4] The semiconductor device according to any one of Items 1 to 3, wherein the diode region includes a plurality of the first impurity regions, and the lead-out region of the collector region faces at least one of the first impurity regions in the normal direction of the first main surface.

[Item 5] The semiconductor device according to Item 4, wherein the diode region includes a trench formed in a region between a plurality of the first impurity regions such as to define the first impurity region, and the lead-out region of the collector region faces the trench in the normal direction of the first main surface.

[Item 6] The semiconductor device according to Item 5, wherein the diode region includes a plurality of the trenches, and the lead-out region of the collector region faces at least one of the trenches in the normal direction of the first main surface.

[Item 7] The semiconductor device according to any one of Items 1 to 6, where an overlapping width of the lead-out region of the collector region with respect to the diode region is not less than 1 μm and not more than 200 μm in plan view.

[Item 8] The semiconductor device according to any one of Items 1 to 7, further including: a boundary region having a second-conductivity-type well region that is formed in the surface layer portion of the first main surface of the semiconductor layer in a region between the IGBT region and the diode region and that is electrically connected to the emitter region.

According to this semiconductor device, it is possible to swiftly discharge carriers existing in the boundary region when the diode performs a reverse recovery operation. This makes it possible to restrain the stagnation of carriers in the boundary region, and hence it is possible to restrain the reverse recovery current. As a result, it is possible to reduce the reverse recovery loss.

[Item 9] The semiconductor device according to Item 8, wherein the lead-out region of the collector region is led out to the diode region while crossing the boundary region, and faces the well region in the normal direction of the first main surface.

According to this semiconductor device, it is possible to reduce the density of carriers near the boundary between the boundary region and the diode region when the diode performs a reverse recovery operation. Hence, it is possible to restrain the stagnation of carriers near the boundary between the boundary region and the diode region, and therefore it is possible to restrain the reverse recovery current. As a result, it is possible to reduce the reverse recovery loss.

[Item 10] The semiconductor device according to Item 8 or 9, wherein the boundary region includes a boundary FET structure that has a second-conductivity-type boundary body region formed in the surface layer portion of the first main surface, a first-conductivity-type boundary emitter region formed in a surface layer portion of the boundary body region, and a boundary gate electrode facing the boundary body region and the boundary emitter region across a boundary gate insulating layer and that is formed in a region adjoining the well region in the first main surface, and the lead-out region of the collector region faces the boundary FET structure in the normal direction of the first main surface.

[Item 11] The semiconductor device according to Item 10, wherein the well region is divided from the boundary FET structure by a well separation trench formed in the first main surface in the boundary region, and the lead-out region of the collector region faces the well separation trench along the normal direction of the first main surface.

[Item 12] The semiconductor device according to Item 8 or 9, wherein a plurality of the well regions are formed in the surface layer portion of the first main surface, and the lead-out region of the collector region faces a plurality of the well regions in the normal direction of the first main surface.

[Item 13] The semiconductor device according to Item 12, wherein the boundary region includes a boundary FET structure that has a second-conductivity-type boundary body region formed in the surface layer portion of the first main surface, a first-conductivity-type boundary emitter region formed in a surface layer portion of the boundary body region, and a boundary gate electrode facing the boundary body region and the boundary emitter region across a boundary gate insulating layer and that is formed in a region between the plurality of well regions in the first main surface, and the lead-out region of the collector region faces the boundary FET structure in the normal direction of the first main surface.

[Item 14] The semiconductor device according to Item 13, wherein the well region is divided from the boundary FET structure by a well separation trench formed in the first main surface, and the lead-out region of the collector region faces the well separation trench in the normal direction of the first main surface.

[Item 15] The semiconductor device according to any one of Items 8 to 14, wherein the IGBT region, the boundary region, the diode region, the boundary region, and the IGBT region are formed in this order along a one-way direction in plan view.

[Item 16] The semiconductor device according to any one of Items 7 to 15, wherein the diode region, the boundary region, the IGBT region, the boundary region, and the diode region are formed in this order along a one-way direction in plan view.

[Item 17] The semiconductor device according to any one of Items 1 to 16, wherein the IGBT region includes a second-conductivity-type floating region formed in a region adjoining the FET structure in the surface layer portion of the first main surface.

[Item 18] The semiconductor device according to Item 17, wherein the IGBT region includes a plurality of the FET structures and the floating region formed in a region between a plurality of the FET structures in the surface layer portion of the first main surface.

[Item 19] The semiconductor device according to Item 17 or 18, wherein the floating region is formed in an electrically floating state.

[Item 20] The semiconductor device according to any one of Items 17 to 19, wherein the floating region is divided from the FET structure by a region separation trench formed in the first main surface.

[Item 21] The semiconductor device according to any one of Items 1 to 20, wherein the gate electrode faces the body region and the emitter region with the gate insulating layer between the gate electrode and the body region and between the gate electrode and the emitter region in a gate trench formed in the first main surface.

This application corresponds to Japanese Patent Application No. 2018-103900 filed in the Japan Patent Office on May 30, 2018, the entire disclosure of which is incorporated herein by reference. Although the preferred embodiments of the present invention have been described in detail, these embodiments are merely concrete examples used to clarify the technical contents of the present invention, and the present invention should not be understood by being limited to these concrete examples, and the scope of the present invention is limited solely by the appended Claims.

REFERENCE SIGNS LIST

1 Semiconductor device
2 Semiconductor layer
3 First main surface
4 Second main surface
8 IGBT region
9 Diode region
10 Boundary region
34 Collector region
35 FET structure
39 Gate trench
40 Gate insulating layer
41 Gate electrode
45 Body region
46 Emitter region
52 Floating region
54 Region separation trench
71 Well region
77 Boundary FET structure
161 Semiconductor device
162 Semiconductor device
163 Semiconductor device
164 Semiconductor device
165 Semiconductor device
166 Semiconductor device
167 Semiconductor device
168 Semiconductor device
169 Semiconductor device
170 Semiconductor device
171 Semiconductor device
173 Semiconductor device
Z Normal direction

The invention claimed is:

1. A semiconductor device comprising:
a first-conductivity-type semiconductor layer that includes a first main surface on one side and a second main surface on another side;
an IGBT region that includes an FET structure and a second-conductivity-type collector region formed in a surface layer portion of the second main surface, the FET structure including:
a second-conductivity-type body region formed in a surface layer portion of the first main surface,
a first-conductivity-type emitter region formed in a surface layer portion of the body region, and
a gate electrode facing both the body region and the emitter region across a gate insulating layer;
a diode region that includes:
a second-conductivity-type first impurity region formed in the surface layer portion of the first main surface, and
a first-conductivity-type second impurity region formed in the surface layer portion of the second main surface;
a boundary region that includes a second-conductivity-type well region formed in the surface layer portion of the first main surface in a region between the IGBT region and the diode region;
a first main surface electrode that is electrically connected to the emitter region, to the first impurity region, and to the well region on the first main surface; and
a trench formed on the first main surface divides the diode region and the boundary region,
wherein one end of the trench is in contact with the diode region, and a part of another end of the trench is in contact with only the second-conductivity-type well region of the boundary region in a cross-section.

2. The semiconductor device according to claim 1, further comprising:
a second main surface electrode that is electrically connected to the collector region and to the second impurity region on the second main surface.

3. The semiconductor device according to claim 1, wherein the boundary region includes the well region formed in a region that overlaps the collector region in plan view.

4. The semiconductor device according to claim 1, wherein the boundary region includes the well region formed in a region that does not overlap the second impurity region in plan view.

5. The semiconductor device according to claim 1, wherein the boundary region includes a boundary FET structure formed in a region adjoining the well region in the first main surface, the boundary FET structure including:
a second-conductivity-type boundary body region formed in the surface layer portion of the first main surface,
a first-conductivity-type boundary emitter region formed in a surface layer portion of the boundary body region, and
a boundary gate electrode facing both the boundary body region and the boundary emitter region across a boundary gate insulating layer.

6. The semiconductor device according to claim 5, wherein a plurality of the well regions are formed in the surface layer portion of the first main surface, and the boundary FET structure is formed in a region between the plurality of well regions in the surface layer portion of the first main surface.

7. The semiconductor device according to claim 5, wherein the well region is divided from the boundary FET structure by a region separation trench formed in the first main surface.

8. The semiconductor device according to claim 5, wherein the IGBT region includes a second-conductivity-type floating region formed such as to adjoin the FET structure in the surface layer portion of the first main surface.

9. The semiconductor device according to claim 8, wherein the IGBT region includes:

a plurality of the FET structures formed with an interval between the FET structures; and the floating region formed in a region between the plurality of FET structures in the surface layer portion of the first main surface.

10. The semiconductor device according to claim 8, wherein the floating region is electrically separated from the first main surface electrode.

11. The semiconductor device according to claim 8, wherein the gate electrode faces the body region and the emitter region across the gate insulating layer in a gate trench formed in the first main surface.

12. The semiconductor device according to claim 8, wherein the floating region is divided from the FET structure by a region separation trench formed in the first main surface.

13. The semiconductor device according to claim 1, wherein the IGBT region includes a second-conductivity-type floating region formed such as to adjoin the FET structure in the surface layer portion of the first main surface.

14. The semiconductor device according to claim 13, wherein the IGBT region includes:

a plurality of the FET structures formed with intervals between the FET structures; and the floating region formed in a region between the plurality of FET structures in the surface layer portion of the first main surface.

15. The semiconductor device according to claim 13, wherein the floating region is electrically separated from the first main surface electrode.

16. The semiconductor device according to claim 13, wherein the gate electrode faces the body region and the emitter region across the gate insulating layer in a gate trench formed in the first main surface.

17. The semiconductor device according to claim 13, wherein the floating region is divided from the FET structure by a region separation trench formed in the first main surface.

18. The semiconductor device according to claim 1, wherein the IGBT region, the boundary region, the diode region, the boundary region, and the IGBT region are formed in this order along a one-way direction in plan view.

19. The semiconductor device according to claim 1, wherein the diode region, the boundary region, the IGBT region, the boundary region, and the diode region are formed in this order along a one-way direction in plan view.

* * * * *